US007535106B2

(12) United States Patent
Shiono et al.

(10) Patent No.: US 7,535,106 B2
(45) Date of Patent: May 19, 2009

(54) WIRING GLASS SUBSTRATE FOR CONNECTING A SEMICONDUCTOR CHIP TO A PRINTED WIRING SUBSTRATE AND A SEMICONDUCTOR MODULE HAVING THE WIRING GLASS SUBSTRATE

(75) Inventors: Osamu Shiono, Hitachi (JP); Takao Ishikawa, Hitachi (JP); Takashi Namekawa, Hitachi (JP); Yasutaka Suzuki, Hitachi (JP); Takashi Naito, Hitachi (JP); Hiroki Yamamoto, Hitachi (JP); Daigorou Kamoto, Hitachi (JP); Ken Takahashi, Hitachi (JP); Tadanori Segawa, Hitachi (JP); Toshiya Satoh, Hitachi (JP); Takao Miwa, Hitachi (JP); Shigehisa Motowaki, Hitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/657,280

(22) Filed: Jan. 24, 2007

(65) Prior Publication Data

US 2007/0114653 A1    May 24, 2007

Related U.S. Application Data

(63) Continuation of application No. 10/483,175, filed as application No. PCT/JP02/07096 on Jul. 12, 2002, now Pat. No. 7,183,650.

(30) Foreign Application Priority Data

Jul. 12, 2001    (JP)    ............................. 2001-211530
Jul. 12, 2001    (JP)    ............................. 2001-211931

(51) Int. Cl.
*H01L 23/48*    (2006.01)
*H01L 23/52*    (2006.01)
*H01L 29/40*    (2006.01)

(52) U.S. Cl. .................. 257/758; 257/698; 257/700; 257/E23.009

(58) Field of Classification Search ................. 257/690, 257/700, 758, 698, 738, 779–781, E23.009, 257/E23.011
See application file for complete search history.

(56) References Cited

U.S. PATENT DOCUMENTS 6,586,686 B1    7/2003    Enomoto et al.
7,183,650 B2 *    2/2007    Shiono et al. ............... 257/758

FOREIGN PATENT DOCUMENTS

| JP | 8-18181 | 1/1996 |
|----|---------|--------|
| JP | 90 17828 | 1/1997 |
| JP | 9147625 | 6/1997 |

(Continued)

*Primary Examiner*—Thanhha Pham
(74) *Attorney, Agent, or Firm*—Dickstein Shapiro LLP

(57) ABSTRACT

A wiring glass substrate includes a glass substrate formed of glass and having a plurality of holes formed at predetermined positions, bumps so formed as to be connected to a conductive material filling the holes and wirings formed on a surface opposite to a surface having the bumps formed thereon and electrically connecting a plurality of connection terminals arranged in intervals different from intervals of the holes to the conductive material. The shape of the conductive material is porous and porous electrodes are bonded to the inner wall surfaces of the holes by an anchor effect to increase the strength of the glass substrate.

2 Claims, 31 Drawing Sheets

FOREIGN PATENT DOCUMENTS

| | | |
|---|---|---|
| JP | 9-321184 | 12/1997 |
| JP | 10-284836 | 10/1998 |
| JP | 11-177234 | 7/1999 |
| JP | 11-186681 | 7/1999 |
| JP | 2001-189550 | 7/2001 |
| WO | WO-00/36886 | 6/2000 |

* cited by examiner (a)

(b)

(a)

(b)

30μm

5μm

5μm (a)

(b)

(c)

(a)

(b)

(a)

(b)

(a)

(b)

(c)

(a)

(b)

(a)

(b)

(a)

(b)

(c)

(d)

WIRING GLASS SUBSTRATE FOR CONNECTING A SEMICONDUCTOR CHIP TO A PRINTED WIRING SUBSTRATE AND A SEMICONDUCTOR MODULE HAVING THE WIRING GLASS SUBSTRATE

CROSS-REFERENCE TO RELATED APPLICATIONS

This application is continuation of U.S. patent application Ser. No. 10/483,175, filed Jan. 9, 2004, the entirety of which are incorporated herein by reference.

TECHNICAL FIELD

The invention relates to a mounting substrate for a module, for mounting a plurality of bare chips in a high density. More particularly, the invention relates to a wiring glass substrate in which a conductor is formed inside via-holes (through-holes), a manufacturing method of the wiring glass substrate, a conductive paste and a semiconductor module used for the wiring glass substrate and a method of forming a wiring substrate and a conductor.

BACKGROUND ART

In semiconductor chips (hereinafter abbreviated as "chips") such as memory LSI (Large Scale Integrated circuits) and logic LSI that are formed on a silicon substrate and diced, electrodes of the chip must be electrically connected to wirings of a printed wiring board. According to a prior art technology, the chip is connected to a lead frame as is then sealed, and a casing in which the chip is sealed (hereinafter called "chip package") is connected to the printed wiring board.

As performance of the chip has become higher in recent years, the number of pins of the bonding pad and the lead frame has become greater. Therefore, in case the wire is bonded one by one to a plurality of bonding pads, a bonding time gets elongated in proportion to the number of pads. As the number of pins of the chip has become greater, a pin pitch has become narrower, and it has become more difficult to connect the lead frame to the printed wiring board without short-circuiting the lead frame.

Therefore, a free chip connection system that forms bumps to the pads on the chip side and mounts the chip to a connection substrate through the bumps has been used remarkably. Because integration density and function of LSI have become higher recently, a tendency of stacking chips and wires on a substrate into a multi-layered construction has become stronger.

Ceramics are generally used as a packaging substrate material of the semiconductor chips the integration density and function of which have become higher but the ceramics are not free from the problems such as low planarity and high cost. Because it has become necessary to further reduce the thickness and the size, a packaging substrate material having wirings that are finer than ever has become necessary.

To solve the problems described above, glass that has higher planarity and lower cost than the ceramics has drawn an attention as the packaging substrate material. A glass substrate is excellent in high frequency characteristics and is expected to be mounted to mobile communication devices. To mount the glass substrate to mobile devices, smaller size and higher performance are required, too. A proposal had been made in which a plurality of through-holes is formed in a glass substrate having excellent planarity and smoothness and a conductor is formed in each through-hole so as to make wiring from both upper and lower surfaces of the glass substrate.

Methods of forming through-holes in a wiring glass substrate include the one that uses a photosensitive glass substrate capable of being chemically cut as described in JP-A-9-321184. According to this method, a mask for forming holes is disposed on a photosensitive glass substrate capable of being chemically cut and an exposure and development process is conducted to form through-holes for forming conductors. Via electrodes are formed in the glass substrate having the through-holes formed therein by using sputtering in combination with plating. This method accomplishes higher density wiring and smaller size than ever.

When electrodes are formed inside via-holes formed in a packaging substrate by a prior art method, the following problems may develop in the method that uses a conductive paste and in the method that uses sputtering in combination with plating.

When the conductive paste is used, the conductive paste is applied to the packaging substrate in accordance with a printing mask pattern by using a printing unit. In the case of the glass substrate, however, the temperature required for the production is lower by 200 to 300° C. than the ceramic substrate, and volume shrinkage is greater because the conductive paste is of a baking type. Therefore, it is difficult in some cases to form the electrode inside the via-hole when the conductive paste of the prior art is used.

When sputtering and plating are employed in combination, a foundation electrode is formed by sputtering on an inner wall surface of the via-hole and an electrode is deposited by plating to the foundation electrode as a base. When the foundation electrode is formed on the inner wall surface of the via-hole of the packaging substrate, however, sputtering must be carried out from both upper and lower surface sides of the substrate and the electrode formation is troublesome and time-consuming. The electrode formed by plating inside the via-hole does not always have high adhesion with the glass.

The prior art technology has not taken sufficiently the strength of the glass substrate into consideration. The strength of the substrate drops as a plurality of through-holes is formed. When the thickness of the substrate is increased to suppress such a drop, the package cannot be rendered compact and the time required for forming the through-holes becomes longer. A through-hole substrate having sufficient strength can reduce the thickness and the size and will eventually reduce the production cost.

It is an object of the invention to provide a wiring glass substrate, its manufacturing method, a conductive paste and a semiconductor module used for the wiring glass substrate, and a method of forming a wiring substrate and a conductor that have high mechanical strength, can reduce a production time and can accomplish low cost.

The above and other objects and novel features of the invention will become more apparent from the following description of the specification and from the accompanying drawings.

DISCLOSURE OF THE INVENTION

As a result of studies for solving the problems described above, the invention has found that the objects can be achieved by shape and property of a paste to be filled into a plurality of through-holes formed by machining, etc, and by surface treatment applied to inner wall surfaces of the through-holes.

The following will briefly explain typical inventions among those disclosed in this application.

First means for accomplishing the objects of the invention is a wiring glass substrate for connecting a semiconductor chip to a printed wiring substrate that comprises a substrate formed of glass and having a plurality of holes formed at predetermined positions; bumps so formed as to be connected to an electrically conductive material filling each of the holes; and wiring formed on a surface opposite to a surface on which the bumps are formed, for electrically connecting a plurality of connection terminals arranged with intervals different from intervals of the holes to the conductive material; wherein a shape of the conductive material is porous.

The conductor constituting the conductive material is preferably at least one kind of members of platinum, gold, silver, copper, aluminum and chromium. The porous electrode has pores (voids) and fine pores inside or on the surface thereof. The degree of porosity is not particularly limited and is preferably higher than that of the electrode used for wiring and bumps. The formation method of the pores is not particularly limited.

Second means for accomplishing the objects of the invention is disposition of second glass having a lower softening point than that of the glass substrate inside the pores of the porous conductive material or on the surface of the conductive material. This second glass preferably is low melting point glass based on PbO—$B_2O_3$—ZnO system or PbO—$B_2O_3$—$SiO_2$ system glass.

Third means for accomplishing the objects of the invention is disposition of a second conductive material having a smaller number of pores than the conductive material on the surface of the porous conductive material. The second conductive material may use the material having the same components so long as the porosity is different.

Forth means for accomplishing the objects of the invention is a wiring glass substrate for connecting a semiconductor chip to a printed wiring substrate, that comprises a substrate formed of glass and having a plurality of holes formed at predetermined positions; bumps so formed as to be connected to a conductive material filling each of the holes; and wiring formed on a surface opposite to a surface on which the bumps are formed, for electrically connecting a plurality of connection terminals arranged with intervals different from intervals of the holes to the conductive material; wherein a linear, rod-like or fibrous conductive material is disposed inside the hole, and a porous conductive material is disposed around the conductive material.

Fifth means for accomplishing the objects of the invention is a wiring glass substrate for connecting a semiconductor chip to a printed wiring substrate, that comprises a substrate formed of glass and having a plurality of holes formed at predetermined positions; bumps so formed as to be connected to a conductive material filling each of the holes; and wiring formed on a surface opposite to a surface on which the bumps are formed, for electrically connecting a plurality of connection terminals arranged with intervals different from intervals of the holes to the conductive material; wherein one or a plurality of conductive particles having a diameter smaller than a diameter of the hole is disposed, and a porous conductive material is disposed around the conductive particle. The conductive particle is preferably at least one kind of members of platinum, gold, silver, copper, aluminum and chromium.

Six means for accomplishing the objects of the invention resides in that a part of the conductive particles protrudes to form a bump.

Seventh means for accomplishing the objects of the invention is a wiring glass substrate for connecting a semiconductor chip to a printed wiring substrate, that comprises a substrate formed of glass and having a plurality of holes formed at predetermined positions; bumps so formed as to be connected to a conductive material filling each of the holes; and wiring formed on a surface opposite to a surface on which the bumps are formed, for electrically connecting a plurality of connection terminals arranged with intervals different from intervals of the holes to the conductive material; wherein a convex grid pin is disposed inside the hole and a porous conductive material is disposed around the grid pin.

Eighth means for accomplishing the objects of the invention resides in that the porous conductive particle, the conductive particle, the linear or rod-like or fibrous conductive material or the grid pin each described above forms a heat radiation route. The material is not particularly limited but preferably has a high heat transfer coefficient.

Ninth means for accomplishing the objects of the invention is a wiring glass substrate for connecting a semiconductor chip to a printed wiring substrate, wherein a section of the through-hole has a large number of substantially round or crater-like concave-convexities and a porous electrode and an oxide layer or a glass layer are arranged inside the hole. It is preferred in this case that the thickness of the glass substrate is 0.3 to 0.7 mm, a Young's modulus is at least 70 GPa and a coefficient of thermal expansion is $(30$ to $100) \times 10^{-7}/°$ C. within a temperature range of from room temperature to 350° C.

The glass substrates satisfying these conditions are borosilicate glass, aluminosilicate glass and lithium silicate glass. Preferably, rare earth elements are further contained.

The oxide preferably contains at least either one of Fe and Zr. Fine cracks and defects of the inner wall of the through-holes formed in the glass substrate can be removed by chemical etching using an aqueous hydrofluoric acid solution and a glass substrate having a higher strength can be acquired. In this instance, it is one of the features of the invention that the surface shape of the etched inner wall of the through-holes changes to a large number of substantially round or crate-like concavo-convexities.

Tenth means for accomplishing the objects of the invention is a wiring glass substrate for connecting a semiconductor chip to a printed substrate, wherein an oxide film is formed on an entire surface of a substrate, a wiring is formed on the oxide film and the oxide film, a glass layer and a porous electrode are disposed on the section of through-holes connecting two opposing wiring surfaces.

The wiring glass substrate according to the invention has its feature in that a conductor is formed on at least the inner wall of the through-hole and that a conductor is filled into the through hole. The conductor is preferably at least one kind of members of platinum, gold, silver, copper, aluminum and chromium.

Eleventh means for accomplishing the objects of the invention is that the conductive material contains at least a conductor, crystallized glass, low melting point glass, a nucleus formation material or filler inhibiting grain growth of the conductor. The composition ratio is not particularly limited and a suitable composition may well be selected. To reduce an electric resistance of via-hole portions, however, 20 to 82.5% by volume of crystallized glass is preferably contained on the basis of the sum of the conductor and the crystallized glass.

Preferably, not greater than 85% by volume of low melting point glass is preferably contained on the basis of the sum of the conductor, the crystallized glass and the low melting point glass. The nucleus formation material reacts with the low melting point glass and forms the crystallized glass and its material is not particularly limited. The material of the filler is not particularly limited so long as it impedes the grain growth of the conductor.

Twelfth means for accomplishing the objects of the invention resides in that the softening point of the low melting point glass is set to be equal to, or lower than, the softening point of the glass material as the substrate.

Thirteenth means for accomplishing the objects of the invention resides in that a coefficient of thermal expansion of the crystallized glass or the low melting point glass falls within the range of a coefficient of thermal expansion of the glass material as the substrate.

In this case, when the difference of coefficients of thermal expansion is great between the conductive material and the glass substrate material, peel is likely to occur at the tame of baking. Therefore, the coefficient of thermal expansion of the crystallized glass or low melting point glass contained is preferably within the range of both of them.

Fourteenth means for accomplishing the objects of the invention resides in that the low melting point glass does not substantially contain a lead element as a component. It is preferred to use glass not substantially containing the lead element and consisting of vanadium oxide as a main component, glass consisting of bismuth oxide as a main component or glass consisting of tin oxide as a main component as the glass.

Fifteen means for accomplishing the objects of the invention resides in that the conductive paste described above is a sol-mixed conductor paste containing a sol as an oxide coating solution.

Sixteenth means for accomplishing the objects of the invention resides in that second glass having a softening point lower than that of the glass pane is disposed on the inner wall surfaces of the holes. The sol may be of such a type in which a transition metal in the sol reacts with the low melting point glass and forms the crystallized glass.

Seventeenth means for accomplishing the objects of the invention is a glass substrate having a plurality of through-holes formed at predetermined positions and an oxide formed on a surface of the through-holes. The oxide preferably contains any element of Ti, Al, Zr, Fe, Sm and Pr. The oxide is preferably a film having a thickness of 0.2 to 1.5 μm. When $SiO_2$ contained in the glass substrate is allowed to react with the oxide, cracks occurring due to machining can be repaired.

Such an oxide preferably has high reactivity with $SiO_2$. In the case of formation at 450° C., for example, NiO, CoO, $ZrO_2$, CaO, SrO, BaO and MgO in which free energy (ΔG) of the product becomes negative are preferred. Therefore, the oxide preferably contains any of the elements Ni, Co, Fe, Ca, Sr and Ba. The coefficient of thermal expansion of the oxide is preferably 8 ppm/° C. or more.

Eighteenth means for accomplishing the objects of the invention resides in that an oxide is disposed on the inner wall surfaces of the holes and second glass having a softening point lower than that of the glass pane is disposed on the surface of the oxide.

Nineteenth means for accomplishing the objects of the invention resides in a glass substrate having a plurality of through-holes at predetermined positions, wherein an oxide and an Na compound are formed on the surface of the through-holes. Since the Na compound (particularly $Na_2O$ and NaOH) is active, the reaction rate between the oxide and $SiO_2$ can be increased when the Na compound is added. In the case of formation at 450° C., for example, $ZrO_2$ and $Fe_2O_3$ are preferred because free energy of the whole system becomes small after the reaction. Therefore, an oxide containing either one of the Fe and Zr elements is preferred. The oxide is preferably a film having a thickness of 0.2 to 1.5 μm. Furthermore, the coefficient of thermal expansion of the oxide is preferably at least 8 ppm/° C.

Twentieth means for accomplishing the objects of the invention resides in a glass substrate having a plurality of through-holes at predetermined positions, wherein the glass substrate contains Na and an oxide is disposed on the surface of the through-holes or cracks. The Na amount in the glass substrate is preferably 5 to 20 wt % calculated as NaO. The oxide is preferably the one that contains either one of Fe and Zr in the same way as described above.

Twenty-first means for accomplishing the objects of the invention resides in that sizes of two open portions of the through-holes are different and a taper angle is created on the inner wall surface of the through-hole. The taper angle is created on the inner wall surface of the through-hole. The taper angle varies with the material of the glass and with a sand blast condition. From the result of a strength test, the range of the taper angle is found preferably from 68 to 85°. The transmission factor of the glass substrate is preferably 60% or more in the visible light range for ease of inspection with eye after the formation of the through-holes.

Twenty-second means for accomplishing the objects of the invention is a production method using a sand blast process to form the through-holes in a wiring glass pane.

Twenty-third means for accomplishing the objects of the invention is a method of manufacturing a wiring glass substrate for mounting a semiconductor chip, comprising the steps of forming a plurality of through-holes in the glass substrate by a sand blast process; and chemically etching an inner wall of the through-holes. The glass substrate preferably has a transmission factor of at least 60% in the visible light range in the same way as described above.

Twenty-fourth means for accomplishing the objects of the invention resides in that formation of a conductor in the through-holes is conducted after the chemical etching step described above. The thickness of the glass substrate is preferably 0.3 to 0.7 mm. Preferably, an aqueous hydrofluoric acid solution is used for chemical etching of the through-holes to an etching depth of 5 to 20 μm.

Twenty-fifth means for accomplishing the objects of the invention is a method of manufacturing a wiring glass substrate, comprising the steps of boring holes penetrating through a glass substrate at predetermined positions of the glass substrate by machining; coating wiring surfaces of two opposing surfaces of the glass substrate and a surface of the penetrating holes with an oxide; forming a power feeding layer on the wiring surfaces of the glass substrate and on inner wall surfaces of the holes by electroless plating; growing the power feeding layer by electroless plating or electrolytic plating to precipitate a conductor film; and patterning the conductor film to electrically connect wirings formed on the two opposing surfaces of the glass substrate through the conductor formed in the through-holes. The thickness of the oxide film is preferably 0.2 to 1.5 μm.

Twenty-sixth means for accomplishing the objects of the invention is a method of manufacturing a wiring glass substrate, comprising the steps of boring holes penetrating through a glass substrate at predetermined positions of the glass substrate by machining; coating wiring surfaces of two opposing surfaces of the glass substrate and a surface of the penetrating holes with an oxide; filling a conductive paste into the through-holes; baking the conductor at a temperature within a range of 500 to 600° C. that is less than a deformation temperature of the glass substrate to form electrodes; forming a power feeding layer on the wiring surfaces of the glass substrate by electroless plating; growing the power feeding layer by electroless plating or electrolytic plating to precipitate a conductor film; and patterning the conductor film to electrically connect wirings formed on the two opposing surfaces of the glass substrate through the conductor formed in the through-holes. The film thickness of the oxide is preferably 0.2 to 1.5 μm in the same way as described above.

Twenty-seventh means for accomplishing the objects of the invention uses a glass substrate etched chemically.

Twenty-eighth means for accomplishing the objects of the invention is a method of manufacturing a wiring glass substrate that conducts coating by use of a sol-gel method.

Twenty-ninth means for accomplishing the objects of the invention is a semiconductor module, wherein the wiring glass substrate described above and having mounted a semiconductor chip is connected to a printed wiring substrate.

BEST MODE FOR CARRYING OUT THE INVENTION

Figure 1:
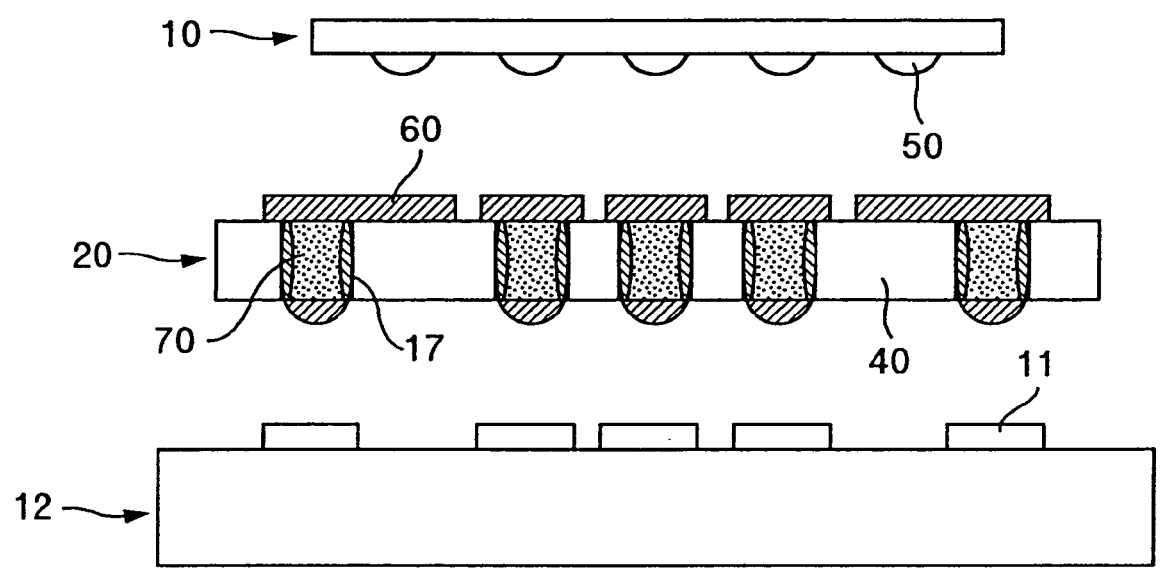
FIG. 1 is a schematic sectional view showing an example of a wiring connection glass substrate according to an embodiment of the invention.

Hereinafter, embodiments of the invention will be explained in detail with reference to the drawings. Incidentally, the invention is in no way limited by these embodiments.

In the following embodiments, explanation will be made dividedly about a plurality of sections or forms of embodiments, whenever necessary. Therefore, these sections or forms are not irrelevant to one another unless clearly specified otherwise and one has a relation of a modified example and detailed or fine explanation of a part, or the whole, of the other.

When the number of elements (inclusive of numbers, numerical values, amounts, ranges, and so forth) is mentioned in the following embodiments, it is not limited to the specific numbers and may be smaller or greater than the specific numbers unless they are clearly specified or obviously limited to the specific numbers from the principle.

The embodiments of the invention will be hereinafter explained in detail with reference to the drawings. Incidentally the same reference numeral will be allocated to a member having the same function throughout the entire drawings for explaining the embodiments and repetition of the explanation will be omitted.

First, the embodiment 1 of the invention will be explained.

FIG. 1 shows a wiring connection glass substrate of the invention. This wiring connection glass substrate (wiring glass substrate) 20 is for connecting a bare chip 10 to the upper side in the drawing and a printed wiring substrate 12 to the lower side in the drawing. The kind of glass of a glass substrate 40 as a base of the wiring connection glass substrate 20 is not particularly limited. However, because alkali components contained in glass are likely to precipitate to the surface, those types of glass which contain small alkali components such as alkali-free glass, borosilicate glass, alumino-silicate glass, lithium silicate glass, etc are preferred.

It is also possible to use quartz glass, though the cost somehow increases, and soda glass that is advantageous in the cost so long as it can suppress precipitation of the alkali components. Holes 17 are bored in the wiring connection glass substrate 20 and penetrate through the glass substrate 40. A via-hole electrode 70 is put into each of the holes 17.

Figure 2:
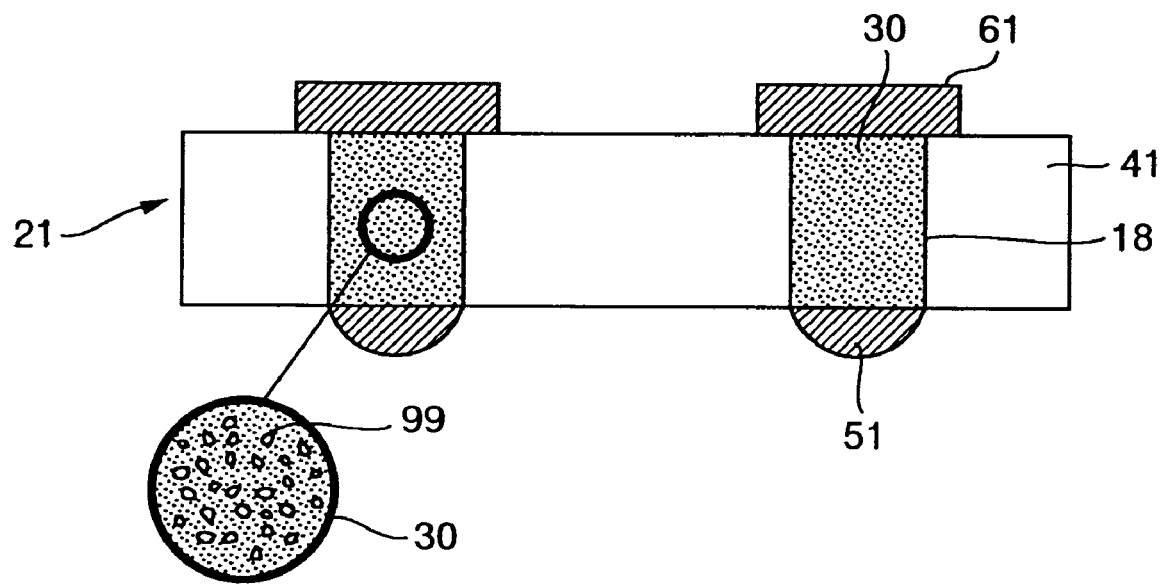
FIG. 2 shows the wiring connection glass substrate shown in FIG. 1, wherein (a) shows a sectional view and a partial enlarged sectional view and (b) shows a sectional composition view of a via-hole electrode of the wiring connection glass substrate shown in (a).
Figure 2:
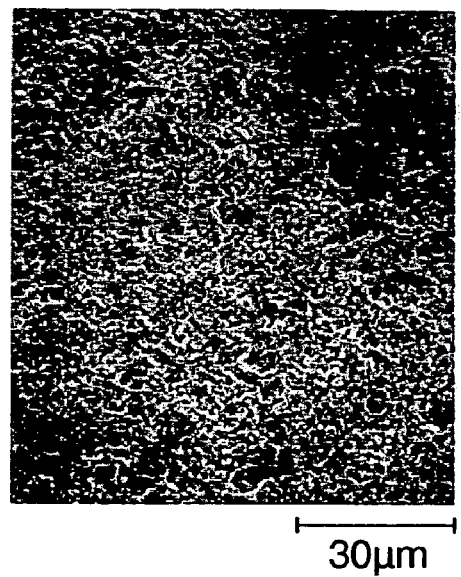

The via-hole electrode 70 will be explained with reference to FIG. 2. The positions of the holes 17 correspond to the positions of electrodes 11 of the printed wiring substrate 12 to be connected.

Incidentally, the formation positions of the holes 17 are not particularly limited and suitable positions may be decided in accordance with a specification. Wirings 60 are formed on the upper surface of the glass substrate 40 in accordance with a wiring pattern. The wirings 60 correspond to the positions of bumps (connection terminals) 50 of the bare chip 10, respectively. The wirings 60 electrically connect the positions at which the bumps 50 are to be connected and the holes 17 when the bare chip 10 is connected.

Each via-hole electrode 70 is electrically connected to the wiring 60. The via-hole electrode 70 on the opposite surface side is electrically connected to the printed wiring substrate 12 through the electrode 11. Incidentally, the positional relationship of the bump 50, the via-hole electrode 70, the wiring 60 and the electrode 11 is not particularly limited and suitable positions may be decided by extending the wiring.

FIG. 2(a) is an enlarged view of a via-hole portion of the wiring connection glass substrate (wiring glass substrate) 21 representing the invention. Each hole is formed by laser machining, machining, chemical cutting or other means. The hole shown in the drawing has a straight shape but the shape of the hole is not particularly limited. Holes having different diameters and different sizes may exist in mixture. When a sand blast process that blasts at a high pressure a polishing agent such as alumina and zirconia to the glass substrate 41 is employed, a hole having a shape of a circular truncated cone can be formed. The sand blast method is an effective method capable of reducing the production cost because the time required for shaping the holes is short.

Referring to FIG. 2(a), a porous conductive material 30 exists inside each hole 18. Filling into the hole 18 uses a printing unit. The conductive material 30 is a metal and an alloy of Pt, Au, Ag, Cu, Al, Cr and a solder material. Incidentally, a plurality of pores 99 is scattered inside the conductive material 30.

FIG. 2(b) shows a surface photograph of the via-hole electrode 70. The electrode is found porous as shown in FIG. 2(b). The porous electrode has the pores (void) 99 and fine holes. The porosity of the pores 99 is not particularly limited but is preferably greater than the porosity of pores of the electrode used for the wiring 61 and the bump 51. Incidentally, the method of forming the porous electrode will be explained in later-appearing embodiment 11.

The formation of the bump 51 to be electrically connected to the printed wiring substrate 12 may either use as such the conductive material 30 for forming the via-hole electrode 70 or may use plating. The formation of the wiring 61 to be electrically connected to the bare chip 10 may either use as such the conductive material 30 for forming the via-hole electrode 70 or may use plating in the same way as described above. Plating may be either electrolytic plating or electroless plating.

Figure 3:
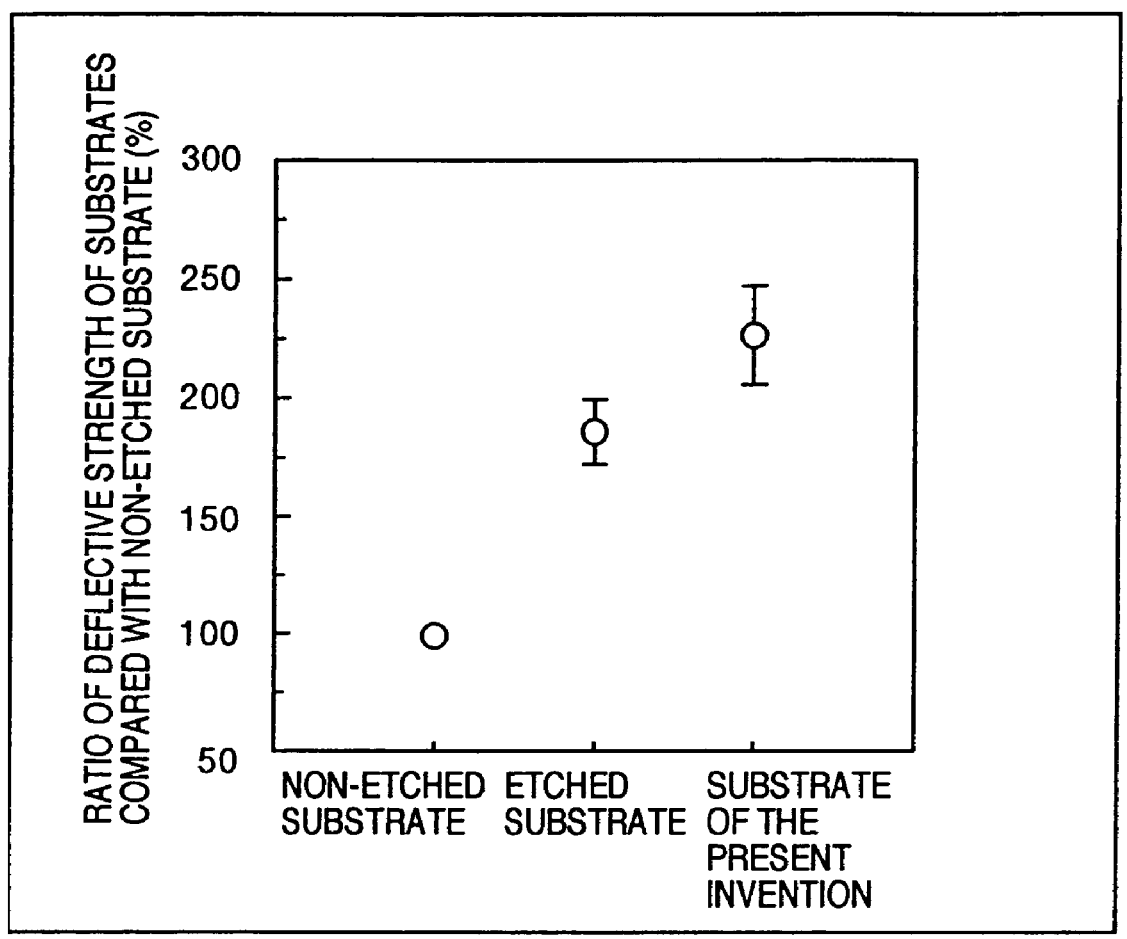
FIG. 3 is a diagram showing an example of relations of deflective strength of various substrates fabricated in embodiments of the invention.

FIG. 3 shows deflective strength of a non-etched glass pane, an etched glass pane and a glass pane according to the invention. Borosilicate glass having a hole diameter of 0.3 mm, a hole pitch of 0.5 mm and a glass pane size of 36 mm×10 mm×0.5 mm is used for the evaluation of the deflective strength. A strength test is carried out for 20 samples selected arbitrarily at a span of an upper portion of 10 mm and a span of a lower portion of 30 mm. Incidentally, the etched glass pane is etched to about 20 μm. The deflective strength is standardized with the value of the non-etched glass pane as 100%.

As a result, the strength of the etched glass pane is improved by about 1.85 to 2 times in comparison with the non-etched glass pane. In contrast, it is found that in the glass pane according to the invention, the strength can be further improved by 2 to 2.5 times in comparison with the non-etched glass pane. This may be presumably because the porous electrode is bonded to the inner wall surface of the via-hole through the anchor effect and reinforces the pores of the glass pane.

When this construction is employed, therefore, the production process can be simplified in a prior art method that uses etching, sputtering and plating in combination, and can reduce the production time and hence, the production cost. Because the via-hole electrodes 70 are rendered porous, volume shrinkage at the time of baking of the electrodes can be reduced. Furthermore, a wiring connection glass substrate 21 having higher strength than the prior art substrates can be provided.

Next, an embodiment 2 of the invention will be explained.

Figure 4:
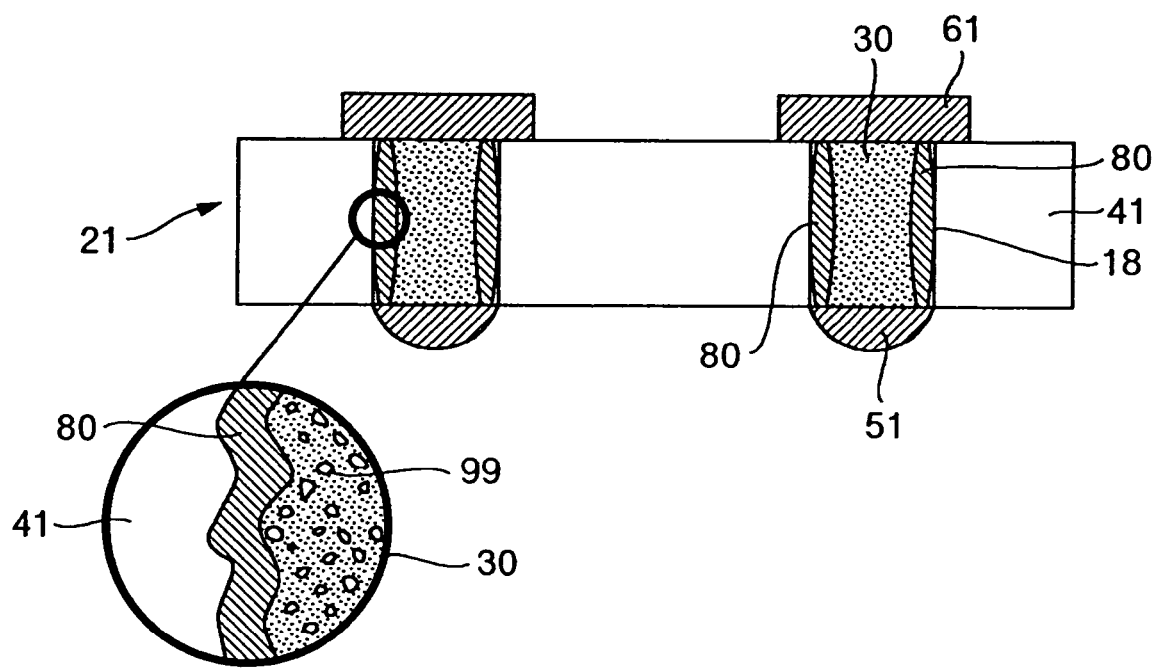
FIG. 4 shows another wiring connection glass substrate, wherein (a) shows a sectional view and a partial enlarged sectional view and (b) shows a sectional composition view of a via-hole electrode of the wiring connection glass substrate shown in (a).
Figure 4:

FIG. 4(a) is an enlarged view of a via-hole portion of a wiring connection glass substrate (wiring glass substrate) 21 according to the invention. Each of the holes 18 is formed by laser machining, machining, chemical cutting, etc in the same way as described above and the shape of the holes is not particularly limited.

Referring to FIG. 4(a), a porous conductive material 30 exists at a center inside each of the holes 18 and a layer of low melting point glass 80 exists inside or on a surface of pores 99. A plurality of pores 99 is scattered inside the conductive material 30. The conductive material 30 is a metal and an alloy of Pt, Au, Ag, Cu, Al, Cr and a solder material in the same way as described above. The low melting point glass 80 is for bonding the inner wall surfaces of the holes 18 formed in the glass substrate 41 and the conductive material 30 or for reinforcing the inside of the conductive material.

The low melting point glass 80 may well have a composition having high wettability with the wiring connection glass substrate 21 and high diffusion property, and a type that is softened at a low temperature is further preferred from the aspect of the production cost. In this instance, the temperature may be the one at which the conductive material 30 is fused or baked without particular limitation but the glass softening temperature is preferably lower. To fill the conductive material 30 and the low melting glass 80 into the via-holes (holes 18), the conductive material 30 and the low melting point glass 80 may be individually filled into and baked inside the holes, or they are first mixed into a paste and be then filled into the holes.

Because the glass substrate 41 and the conductive material 30 have mutually different coefficients of thermal expansion, the coefficient of thermal expansion of the low melting point glass 80 is within the range of the coefficients of thermal expansion of the conductive material and the glass substrate 41 in order to mitigate thermal impact during the production of the substrate. To mitigate the difference of their coefficients of thermal expansion, it is also possible to use a plurality of kinds of low melting point glass 80 and to gradually change components or a component ratio of the low melting point glass to form a step-like or gradient distribution.

FIG. 4(b) shows a surface photograph of the via-hole electrodes 70 (see FIG. 1). It has been confirmed that a glass layer is formed on the surface of the porous electrodes as shown in the drawing.

The rest of the constructions are the same as in FIG. 1. The bumps 51 to be electrically connected to the printed wiring substrate 12 may be formed by using as such the conductive material 30 for forming the via-hole electrode 70 or plating.

The wiring 61 to be electrically connected to the bare chip 10 may be formed by using as such the conductive material 30 for forming the via-hole electrode 70 or plating in the same way as described above. Incidentally, plating may be either electrolytic plating or electroless plating.

When the deflective strength of the wiring connection glass substrate 21 of the invention employing this construction is measured, an improvement of about 2.5 times can be observed in comparison with the strength of the non-etched substrate in the same way as the result shown in the embodiment 1 described above. This may be presumably because the low melting point glass 80 is bonded to the inner wall surfaces of the via-holes and reinforces micro-cracks occurring in the glass substrate 41.

When this construction is employed, therefore, the production process can be simplified in a prior art method that uses etching, sputtering and plating in combination and can reduce the production time and hence, the production cost. Because the volume shrinkage ratio is small, this embodiment can provide a wiring connection glass substrate 21 having higher strength than the prior art substrates.

Next, an embodiment 3 of the invention will be explained.

Figure 5:
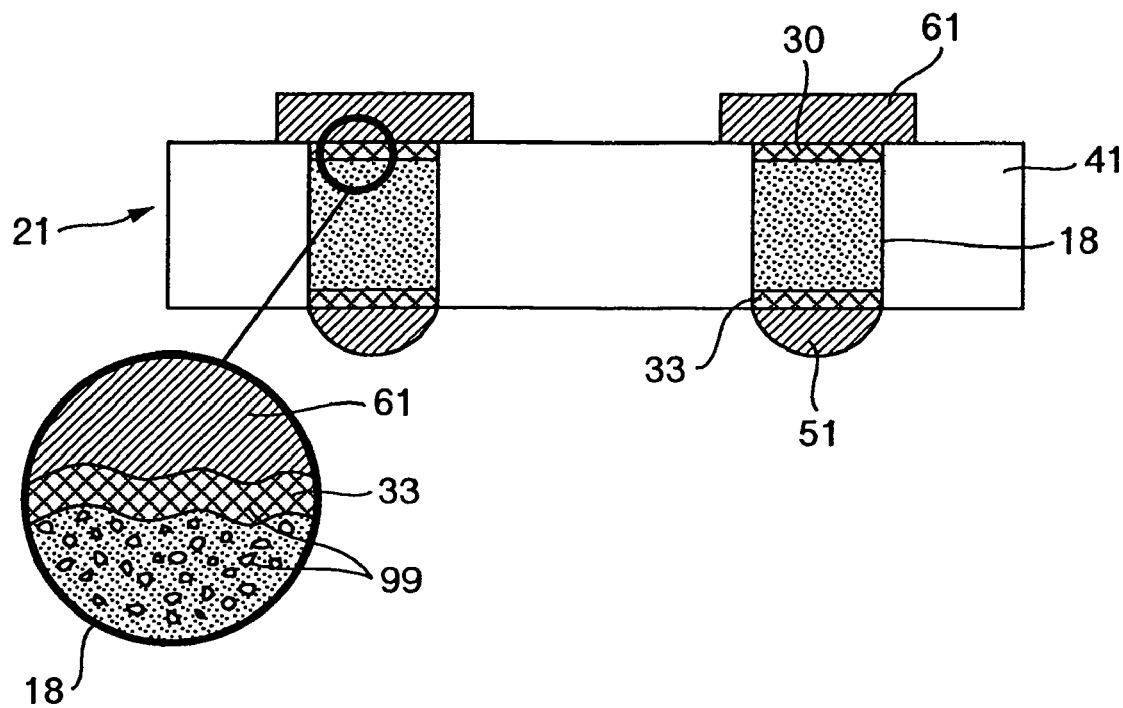
FIG. 5 is a sectional view and a partial enlarged sectional view showing a structure of a via-hole formed in another wiring connection glass substrate according to an embodiment of the invention.

FIG. 5 is an enlarged view of a via-hole portion of a wiring connection glass substrate (wiring glass substrate) 21 according to the invention. Each of the holes 18 is formed by laser machining, machining, chemical cutting, etc and the shape of the holes is not particularly limited in the same way as described above.

Referring to FIG. 5, a porous conductive material 30 exists at a center inside each of the holes 18. A plurality of pores 99 is scattered inside the conductive material 30. The layer of the low melting point glass 80 may exist inside or on the surface of the pores 95 of the conductive material 30 in the same way as in the second invention. The conductive material 30 is a metal and an alloy of Pt, Au, Ag, Cu, Al, Cr and a solder material in the same way as described above.

The low melting point glass 80 is for bonding the inner wall surfaces of the holes 18 formed in the glass substrate 41 and the conductive material 30 or for reinforcing the inside of the conductive material. The low melting point glass 80 may well have a composition having high wettability with the wiring connection glass substrate 21 and high diffusion property, and a type that is softened at a low temperature is further preferred from the aspect of the production cost. In this instance, the temperature may be the one at which the conductive material 30 is fused or baked without particular limitation but the glass softening temperature is preferably lower.

To fill the conductive material 30 and the low melting glass 80 into the via-holes (holes 18), the conductive material 30 and the low melting point glass 80 may be individually filled into and baked inside the holes, or they are first mixed into a paste and be then filled into the holes. Because the glass substrate 41 and the conductive material 30 have mutually different coefficients of thermal expansion, the low melting point glass 80 the coefficient of thermal expansion of which is within the range of the coefficients of thermal expansion of the conductive material and the glass substrate 41 is used in order to mitigate thermal impact during the production of the substrate. To mitigate the difference of their coefficients of thermal expansion, it is also possible to use a plurality of kinds of low melting point glass 80 and to gradually change the composition or a component ratio of the low melting point glass 80 to form a step-like or gradient distribution.

Next, a second conductive material 33 having a smaller content of pores 99 than the conductive material 30 is formed on the surface of the conductive material 30. FIG. 5 shows an example in which the second conductive material 33 is formed on only the side of the wiring 61 and the bump 51. The second conductive material 33 is a metal and an alloy such as Pt, Au, Ag, Cu, Al, Cr and a solder material. When this construction is employed, it becomes possible to prevent a plating solution from permeating into the conductive material 30 having a greater number of pores 99 when the wiring 61 and the bump 51 are formed by plating.

The rest of the constructions are the same as in FIG. 1. The bump 51 to be electrically connected to the printed wiring substrate 12 may be formed by using as such the conductive material 30 for forming the via-hole electrodes 70 or plating. The wiring 61 to be electrically connected to the bare chip 10 may be formed by using as such the conductive material 30 for forming the via-hole electrodes 70 or plating in the same way as described above. Incidentally, plating may be either electrolytic plating or electroless plating.

When the deflective strength of the wiring connection glass substrate 21 of the invention employing this construction is measured, an improvement of about 2.5 times can be observed in comparison with the strength of the non-etched substrate in the same way as the result shown in the embodiment 1 described above.

When this construction is employed, therefore, the production process can be simplified in the prior art method that uses etching, sputtering and plating in combination, and can reduce the production time and hence, the production cost. Because the volume shrinkage ratio is small, this embodiment can provide a wiring connection glass substrate 21 having higher strength than the prior art substrates.

Next, an embodiment 4 of the invention will be explained.

Figure 6:
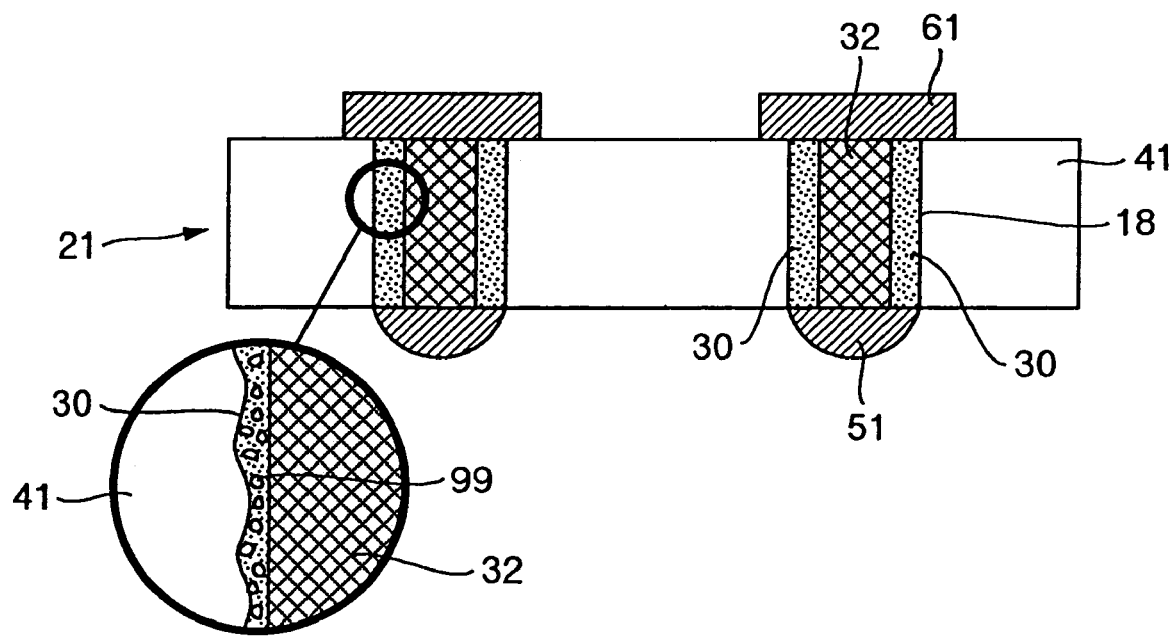
FIG. 6 is a sectional view and a partial enlarged sectional view showing a structure of a via-hole formed in another wiring connection glass substrate according to an embodiment of the invention.

FIG. 6 is an enlarged view of a via-hole portion of a wiring connection glass substrate (wiring glass substrate) 21 according to the invention. Via-holes (holes 18) are formed in the glass substrate 41 and a linear or rod-like conductive material 32 is fitted into each of the holes 18. The conductive material 32 is a wire or rod of a metal or an alloy. Though FIG. 6 shows the conductive material 32 having a linear or rod shape, the conductive material 32 may have a fibrous shape or a wire knitted shape.

The porous conductive material 30 is then filled around this conductive material 32. A plurality of pores 99 is scattered inside the conductive material 30. A layer of the low melting point glass 80 may exist inside or on the surface of the pores 95 of the conductive material 30 in the same way as in the embodiment 2. In this instance, the low melting point glass 80 may be filled in the form in which glass frits are filled (into each of the holes 18) and then heated, or a glass paste of the low melting point glass 80 is filled.

Filling may also be made in the form of a conductive paste containing the low melting point glass 80. Incidentally, the coefficient of thermal expansion of the low melting point glass 80 preferably falls within the range of the coefficients of thermal expansion of the conductive material 30 and the glass substrate 41. To mitigate the difference of their coefficients of thermal expansion, it is also possible to use a plurality of kinds of low melting point glass 80 and to gradually change the composition or a component ratio of the low melting point glass 80 to form a step-like or gradient distribution.

The rest of the constructions are the same as in FIG. 1. The bumps 51 to be electrically connected to the printed wiring substrate 12 may be formed by using as such the conductive material 30 for forming the via-hole electrode 70 or plating. The wiring 61 to be electrically connected to the bare chip 10 may be formed by using as such the conductive material 30 for forming the via-hole electrodes 70 or plating in the same way as described above. Incidentally, a rod-like conductive material of the invention may be used as a grid pin as will be later explained in the invention.

When the deflective strength of the wiring connection glass substrate 21 of the invention employing this construction is measured, an improvement of about 2.3 times can be observed in comparison with the strength of the non-etched substrate in the same way as the result shown in the embodiment 1 described above.

When this construction is employed, therefore, the production process can be simplified in a prior art method that uses etching, sputtering and plating in combination and can reduce the production time and hence, the production cost. Further, this embodiment can provide a wiring connection glass substrate 21 having higher strength than the prior art substrates.

Next, an embodiment 5 of the invention will be explained.

Figure 7:
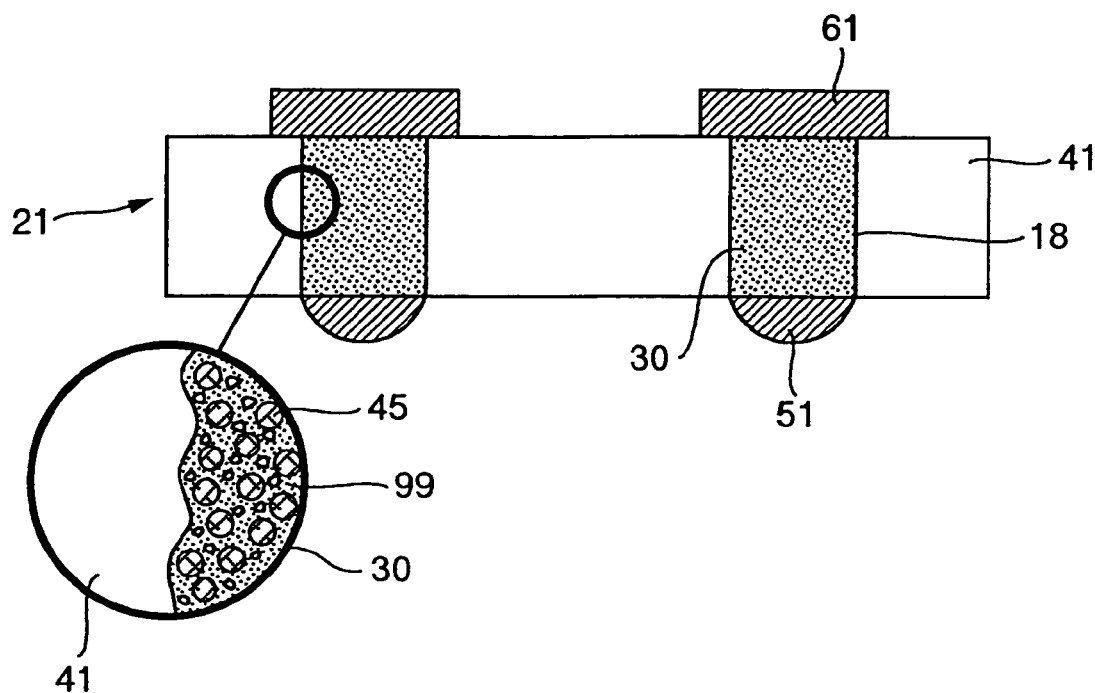
FIG. 7 is a sectional view and a partial enlarged sectional view showing a structure of a via-hole formed in another wiring connection glass substrate according to an embodiment of the invention.

FIG. 7 is an enlarged view of a via-hole portion of a wiring connection glass substrate 21 according to the invention. In FIG. 7, one or a plurality of conductive particles 45 exists inside each of the holes 18 and a conductive material 30 exists around the conductive particle 45. A plurality of pores 99 is scattered inside the conductive material 30. Though the shape of the conductive particle 45 is spherical in the drawing, the shape is not particularly limited in the invention.

A low melting point glass 80 may exist inside or on the surface of the pores 99 of the conductive material 30 in the same way as in the embodiment 2. The conductive material 30 is a metal or an alloy such as Pt, Au, Ag, Cu, Al, Cr and a solder material. The low melting point glass 80 may have a composition having high wettability with the wiring connection substrate 21 and high diffusion property, and is further preferably softened at a low temperature from the aspect of the production cost.

In this case, the temperature is the one at which the shape of the conductive material 30 does not change due to fusion and baking. Incidentally, to fill the conductive material 30 and the low melting point glass 80 into the via-holes (holes 18), a method that independently fills the conductive material 30 and the low melting point glass 80 into the holes 18 and heats them or a method that mixes both to form a paste and fills the paste may be employed. The conductive paste will be explained in the later-appearing invention. A wiring 61 is formed on the conductive material 30 on the upper surface side of each of the holes 18. The wiring 61 is electrically connected to the electrodes on the side of the bare chip 10. A protruding portion of a part of the conductive material 30 may be used as a bump electrode and may be electrically connected to the electrodes on the side of the bare chip 10.

The rest of the constructions are the same as in FIG. 1. The bumps 51 to be electrically connected to the printed wiring substrate 12 may be formed by using as such the conductive material 30 for forming the via-hole electrodes 70 or by plating. The wiring 61 to be electrically connected to the bare chip 10 may be formed by using as such the conductive material 30 for forming the via-hole electrode 70 or by plating in the same way as described above.

When the deflective strength of the wiring connection glass substrate 21 of the invention employing this construction is measured, an improvement of about 2.3 times can be observed in comparison with the strength of the non-etched substrate in the same way as the result shown in the embodiment 1 described above.

When this construction is employed, therefore, the production process can be simplified in the prior art method that uses etching, sputtering and plating in combination, and can reduce the production time and hence, the production cost.

Further, this embodiment can provide a wiring connection glass substrate 21 having higher strength than the prior art substrates.

Next, an embodiment 6 of the invention will be explained.

Figure 8:
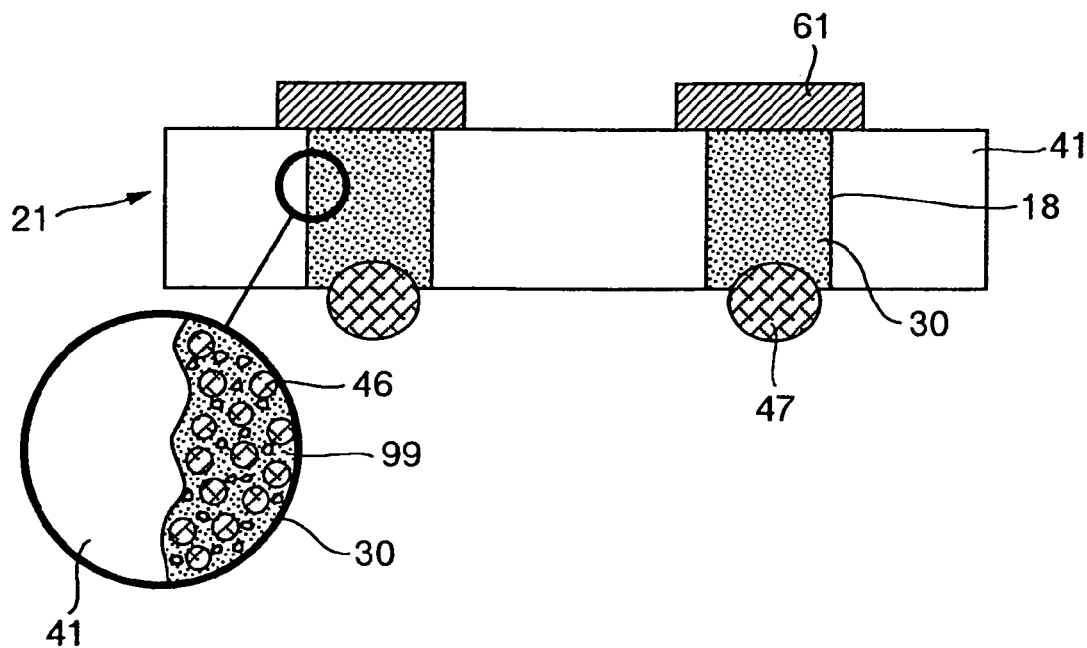
FIG. 8 is a sectional view and a partial enlarged sectional view showing a structure of a via-hole formed in another wiring connection glass substrate according to an embodiment of the invention.

FIG. 8 is an enlarged view of a via-hole portion of a wiring connection glass substrate 21 according to the invention. The drawing shows an example in which a part of the conductive particle 47 protrudes towards the lower surface side of the via-holes (holes 18) to form each bump electrode. The via-holes (holes 18) are formed in the glass substrate 41 and conductive particles 46 and 47 greater than the inner diameter on the lower surface side and a porous conductive material 30 are filled into the holes 18. A plurality of pores 99 is scattered inside the conductive material 30.

Figure 9:
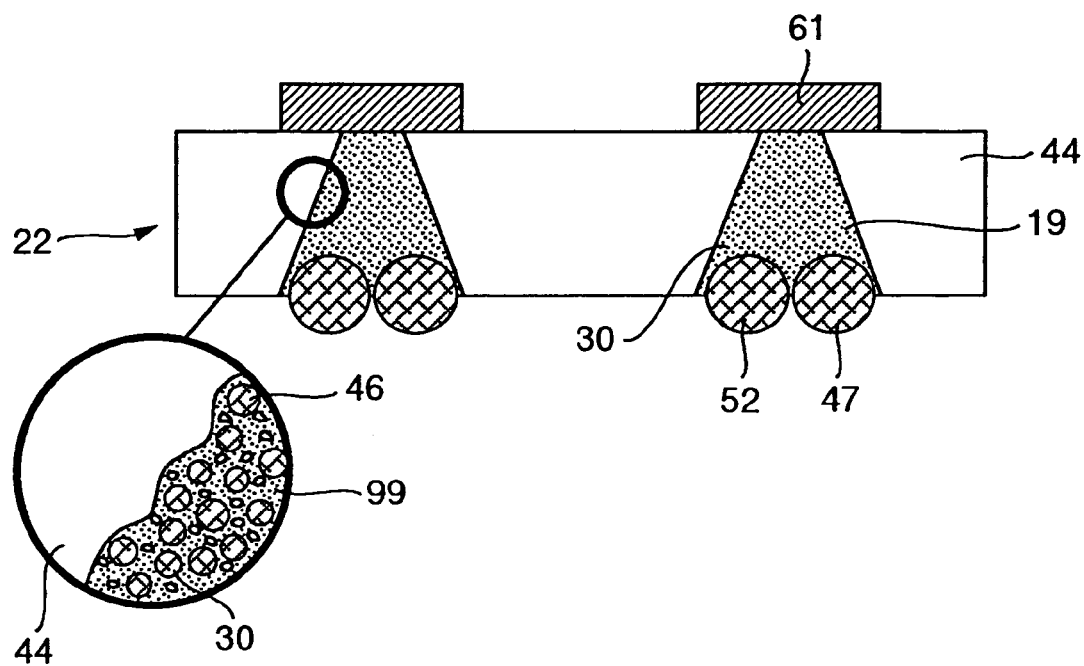
FIG. 9 is a sectional view and a partial enlarged sectional view showing a structure of a via-hole formed in another wiring connection glass substrate according to an embodiment of the invention.

A layer of low melting point glass 80 may exist inside or on the surface of the pores 99 of the conductive material 30 in the same way as in the embodiment 2. In this case, it is not always necessary to fill the conductive materials all having the same particle diameter, and the conductive material 30 having different diameters may be used as shown in FIG. 8. The conductive material 30 may be filled into the holes 19 formed by the sand blast process as shown in FIG. 9. The rest of the constructions are the same as in FIG. 1. The opposite surface for forming the bumps 52 forms the wirings 61. Protruding conductive particles 47 may be used as the bump electrodes without forming the wirings 61. The method of forming the via-hole electrodes 70 may be the one that independently fills the conductive material 30 and the low melting point glass 80 and then heats them or fills their paste into the holes 19.

When this construction is employed, the bump electrodes need not be formed. Therefore, the production time can be shortened and the production cost can be reduced.

Next, an embodiment 7 of the invention will be explained.

Figure 10:
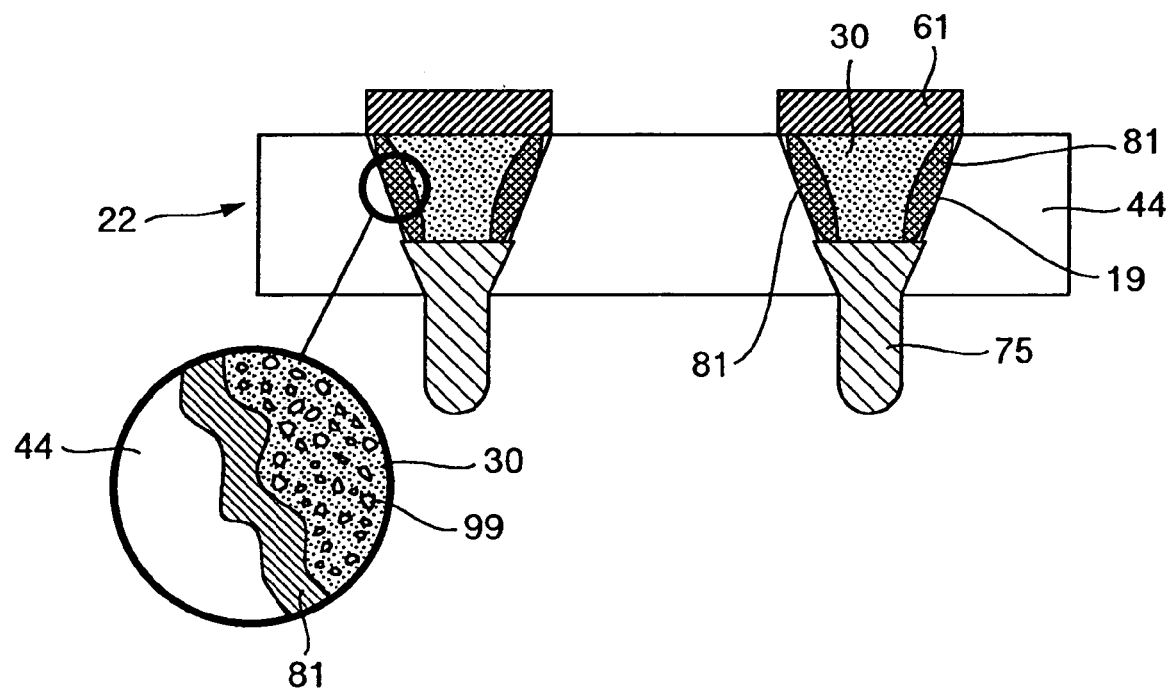
FIG. 10 is a sectional view and a partial enlarged sectional view showing a structure of a via-hole formed in another wiring connection glass substrate according to an embodiment of the invention.

FIG. 10 is an enlarged view of a via-hole portion of a wiring connection glass substrate (wiring glass substrate) 22 according to the invention. In the inventions described so far, the bump electrodes are formed on the side of the wiring connection glass substrate 22 for the connection with the electrodes of the printed wiring substrate. However, direct connection may be made with the printed wiring connection substrate by use of grid pins 75 used in a CPU, or the like.

Here, an example of the wiring connection glass substrate 22 having the grid pins 75 will be described. The sand blast process is used for forming the via-holes but the via-hole formation method is not particularly limited. The via-holes (holes 19) are formed in the glass substrate 44 as shown in FIG. 10. The projection portion of the grid pin 75 is greater than the inner diameter of the hole on the lower surface side and the grid pin 75 is caught inside each of the holes 19.

Next, the porous conductive material 30 and the low melting point glass 81 are filled. A plurality of pores 99 is scattered in the conductive material 30. The method of forming the via-hole electrodes may be the one that independently fills the conductive material 30 and the low melting point glass 81 into the holes 19 and then heats them or fills their paste into the holes 19. The rest of the constructions are the same as in FIG. 1. The wiring 61 to be electrically connected to the bare chip 10 may be formed by using as such the conductive material 30 for forming the via-hole electrode or by plating in the same way as described above.

When this construction is employed, the printed wiring substrate 12 and the wiring connection glass substrate 22 can be connected to each other through a fit-in system and do no require electric connection using a solder or an alloy. Therefore, the production time can be shortened and the production cost can be reduced.

The grid pin itself can be used as a heat radiation route (thermal via). The construction is the same as the one shown in FIG. 9.

When this construction is employed, heat can be radiated from the printed wiring substrate 12 without adding a particular member and the cost can therefore be reduced.

Next, an embodiment 8 of the invention will be explained.

Figure 11:
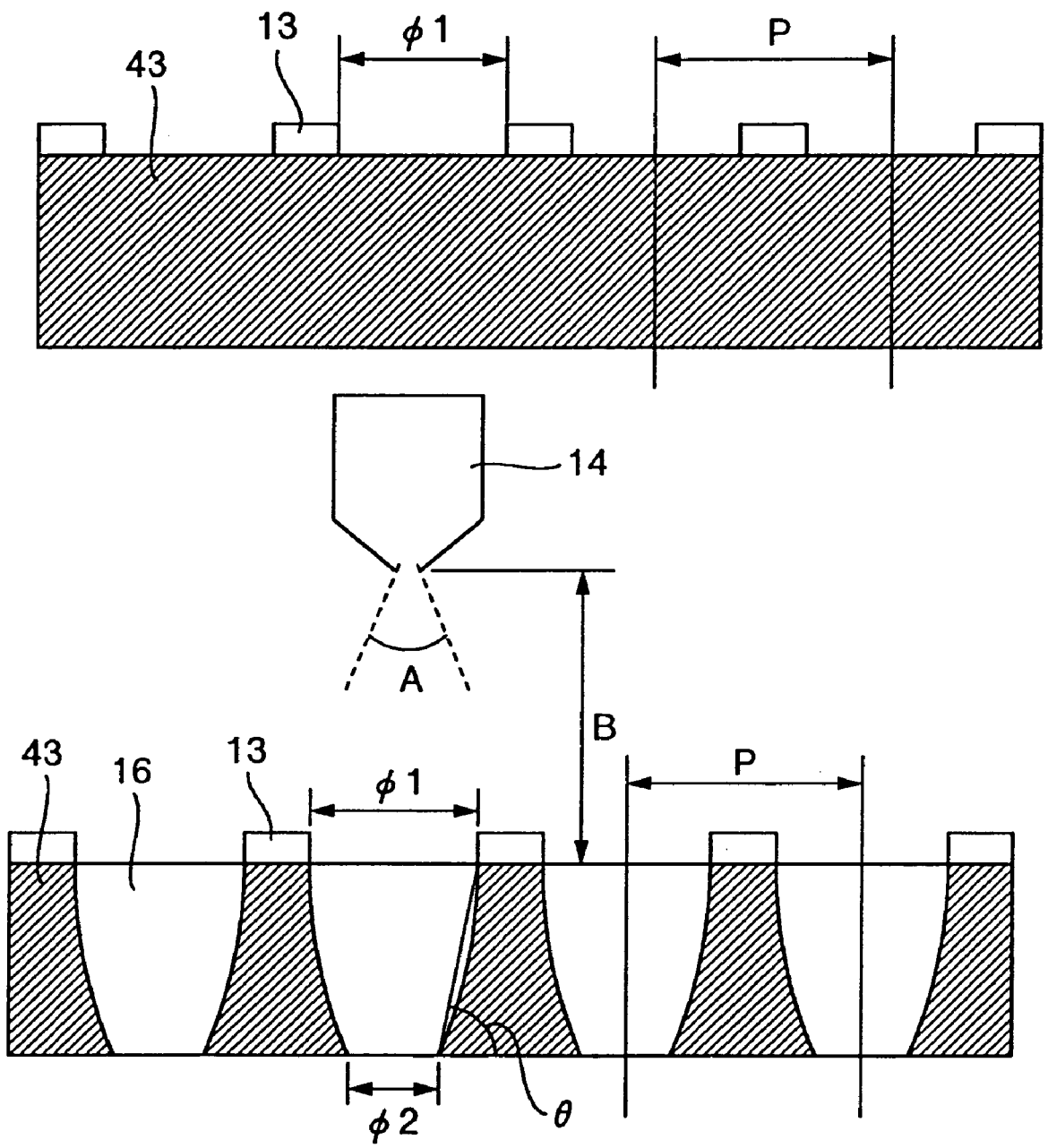
FIG. 11 is a process diagram showing an example of a method of manufacturing a wiring connection glass substrate according to an embodiment of the invention.

FIG. 11 shows a method of manufacturing a wiring connection substrate. This embodiment uses a low-alkali borosilicate glass substrate having a size of 300 mm×200 m and a thickness of 0.5 mm and the sand blast process is applied to the formation of the holes 16. A hole formation mask 13 is first arranged on the glass substrate 43 having high planarity and smoothness so that the pore diameter $\Phi 1$ is 0.3 mm and a pitch P is 0.5 mm. The holes 16 are then formed by applying sand blast from above the mask 13.

In this case, a jet angle A from a sand blast nozzle 14 and a distance B between the sand blast nozzle 14 and the glass substrate 43 are adjusted to control a taper angle $\theta$ of the holes 16. Eight kinds of wiring glass having taper angles $\theta$ of 65°, 68°, 70°, 74°, 79°, 82°, 85° and 88° are produced. The taper angle $\theta$ is determined by an angle of a straight line that connects the hole diameter $\Phi 1$ on the large diameter side to the hole diameter $\Phi 2$ on the small diameter side.

Figure 12:
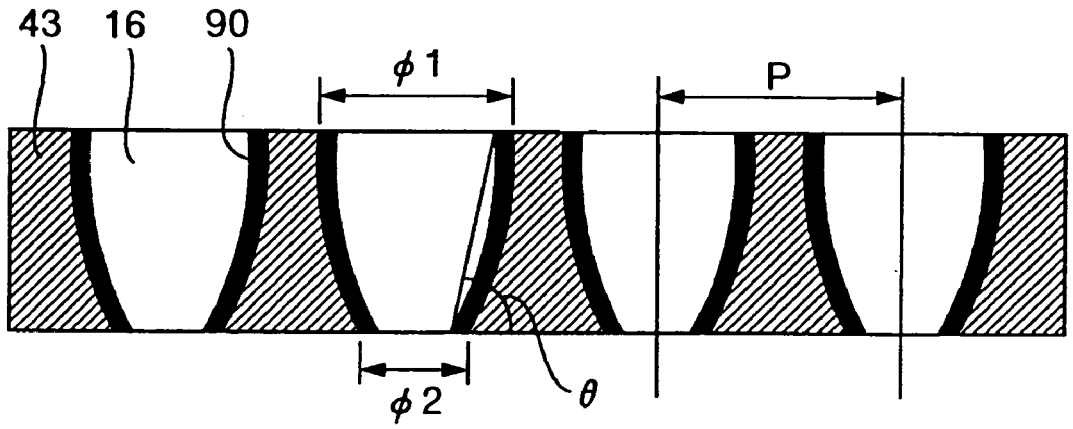
FIG. 12 is a partial sectional view showing an example of a structure in which a conductive film is formed on an inner wall of a through-hole of a wiring glass pane in an embodiment of the invention.

As shown in FIG. 12, a conductive film 90 is formed on the inner wall of the holes 16 of each glass substrate 43 so fabricated and a large number of wiring connection glass substrates 21 (see FIG. 1) having a size of 36 mm×10 mm are fabricated by dicing the glass substrate. To form the conductive film 90, a chromium film is first formed by sputtering on the large diameter side of the holes 16 and a copper film is then plated from above the chromium film.

A dicer is used for dicing. The wiring connection glass substrate 21 having the taper angle $\theta$ of 65° exhibits large warp at the time of the formation of the conductor and undergoes breakage during dicing. The surface and the inside of the other wiring connection glass substrates 21 that can be diced are inspected optically and those in which large defects are observed are rejected as the defective substrates. Almost all defects result from cracks that occur due to dicing when the holes 16 are formed.

The borosilicate glass substrates used in this embodiment are transparent (transmission factor: 80% in the visible light range) and not only the upper surface but also the inside and the lower surface can be inspected simultaneously and the defective substrates can be easily removed in advance. Therefore, unlike the opaque ceramic substrates and glass epoxy substrates of the prior art, the borosilicate glass substrates are effective. Such optical inspection can be easily made when the glass substrates 43 have a transmission factor of 60% or more in the visible light range, and is effective means for classifying wiring glass panes (wiring glass substrates) having high reliability.

The wiring glass panes classified by the optical inspection as the approved panes are evaluated by conductivity of the through-holes on the upper and lower surfaces and 4-point bending strength. To evaluate conductivity, 50 wiring glass panes are selected arbitrarily and 10 through-holes of each pane are selected at random. Conductivity of the conductive film formed in each through-hole is checked and a defect ratio of the wiring glass panes is determined. To evaluate the 4-point bending strength, 20 wiring glass panes are selected arbitrarily and a strength test is carried out at an upper span of 10 mm and a lower span of 30 mm.

Table 1 tabulates the wiring glass panes fabricated and their evaluation result. In (a1), the taper angle $\theta$ is as small as 65° and warp is great at the time of formation of the conductor as described above. Therefore, the sample is broken during dicing and cannot be evaluated. In (a2) having θ of 68°, warp occurs to a certain extent but the sample can be diced satisfactorily and proper evaluation can be made. The 4-point bending strength of (a2) is lower in comparison with the other samples exclusive of (a1) but the conductivity defect ratio is as good as 0%. In (a3 to a7) in which θ is within the range of up to 85°, the conductivity defect ratio is 0% in the same way as in (a2).

In (a8) in which θ is further greater and 88°, the conductivity defect is observed. This is presumably because the inner wall of the through-holes by the sand blast process is coarse as shown in FIG. 13 and the conductor film 90 cannot be formed easily and uniformly on the inner wall of the through-holes when the taper angle θ is great.

Figure 13:
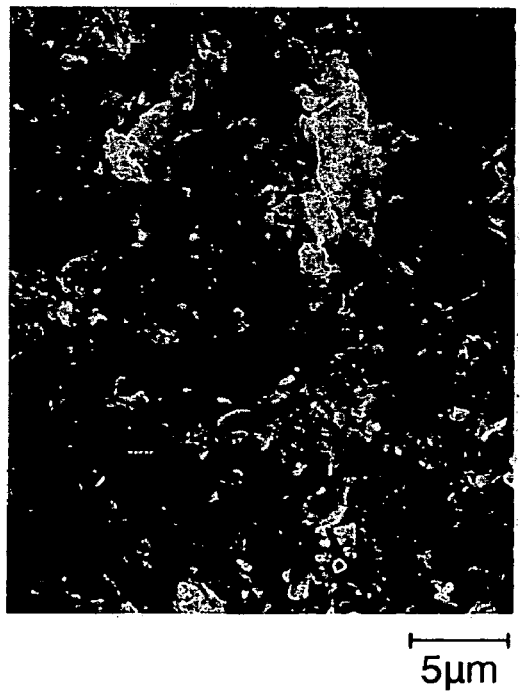
FIG. 13 is a sectional composition view showing in enlargement a composition of an inner wall of a through-hole of a glass substrate after formation in an embodiment of the invention.

In (a2 to a7) in which the taper angle θ is on the smaller side, on the contrary, the uniform conductor can be formed uniformly on the inner wall of the through-holes even when the inner wall of the through-holes is coarse as shown in FIG. 13 because the sputter film sufficiently covers the coarse film. In this embodiment, those glass substrates 43 in which large defects are observed in the optical inspection are rejected, but the 4-point bending strength is carried out also for the substrates so rejected.

Because of the glass substrates 43 having already cracks, the 4-point bending strength is extremely small and is 40 MPa or below irrespective of the value θ. As described above, classification of the approved substrates and the rejected substrates is easy for the transparent glass substrates 43 and transparency of the glass substrates is effective for production inspection. When the transmission factor is at least 60% in the visible light range, through-hole glass substrates having high reliability can be classified.

devices such as cellular telephone units and digital cameras. This embodiment selects a glass substrate that is easily available and is economical per unit area as a display glass substrate and fabricates a wiring glass pane in the same way as in the embodiment 8. Two kinds of glass substrates have a size of 420 mm×360 mm and thickness of 0.5 mm and 0.7 mm. Low-alkali borosilicate glass substrates are used for the 0.5 mm-thick substrates and alkali-free borosilicate glass substrates, for the 0.7 mm-thick substrates. These glass substrates have excellent planarity, smoothness and transparency.

To manufacture each wiring glass substrate, a mask 13 for forming the holes is disposed on the glass substrate 43 so that a hole diameter Φ1 is 0.3 mm and a pitch P is 0.5 mm as shown in FIG. 11. The holes 16 are then formed by applying sand blast from above the mask 13 so that the taper angle is 80°.

Next, the glass substrate 43 after the formation of the holes 16 is dipped into an aqueous hydrofluoric acid solution to chemically etch the inner walls of the through-holes. In this case, ultrasonic wave is applied so that the inner walls of the through-holes can be uniformly etched. The etching dose is 5 μm, 10 μm, 15 μm, 20 μm and 30 μm.

Figure 14:
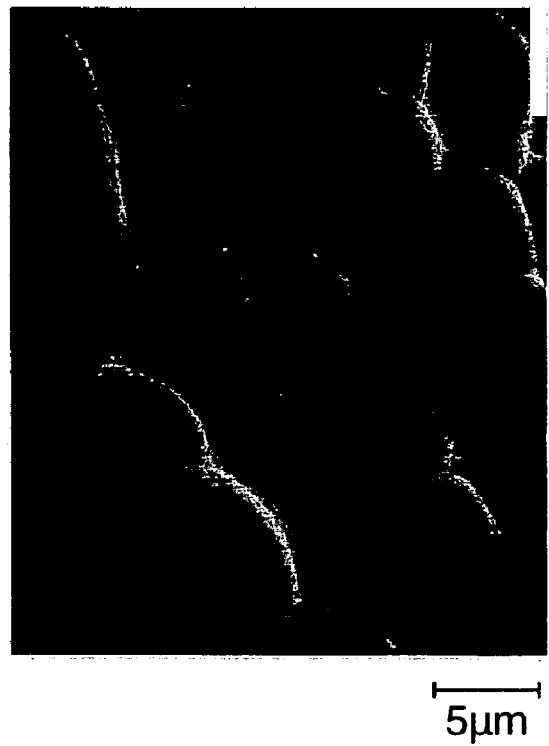
FIG. 14 is a sectional composition view showing in enlargement a composition of an inner wall of a through-hole of a glass substrate after etching in an embodiment of the invention.

A large number of concavo-convexities substantially having round or crater-like shapes form the inner walls of the through-holes after etching as shown in FIG. 14. When compared with FIG. 13 showing the state before etching, fine cracks are removed and the surface is smoothly etched to an extent such that the crystal grain boundary of the glass substrate 43 can be identified.

Next, a conductor film 90 is formed on the inner walls of the holes 16 etched in the same way as in FIG. 12, and the glass substrate is diced to provide a large number of wiring connection glass substrates having a size of 36 mm×10 mm.

TABLE 1

| No. | θ (°) | Φ1 (nm) | Φ2 (nm) | conductivity defect ratio (%) | 4-point bending strength, (Mpa) | | | remarks |
|---|---|---|---|---|---|---|---|---|
| | | | | | mean value | minimum value | maximum value | |
| a1 | 65 | 0.3 | 0.02 | — | — | — | — | great warp, broken in dicing |
| a2 | 68 | 0.3 | 0.06 | 0 | 55 | 45 | 67 | |
| a3 | 70 | 0.3 | 0.08 | 0 | 61 | 50 | 69 | |
| a4 | 74 | 0.3 | 0.13 | 0 | 66 | 53 | 75 | |
| a5 | 79 | 0.3 | 0.18 | 0 | 64 | 54 | 73 | |
| a6 | 82 | 0.3 | 0.22 | 0 | 68 | 57 | 81 | |
| a7 | 85 | 0.3 | 0.25 | 0 | 66 | 51 | 77 | |
| a8 | 88 | 0.3 | 0.28 | 22 | 58 | 49 | 68 | conductivity defect occurs |

It has thus been found that the taper angle on the inner surface of the through-holes formed in the wiring glass panes (wiring glass substrates) is preferably within the range of 68 to 85°. It has also been found that the transmission factor of the wiring glass panes is preferably at least 60% in the visible light range. The wiring glass pane according to the invention is preferably fabricated into a passive element, or the like, in which insulating layers and wirings are formed in multiple layers on the surface of the through-holes on the small diameter side and which has built-in capacitors and inductors. On the other hand, the surface of the wiring glass pane on the large diameter side is preferably connected to a mother board.

Next, an embodiment 9 of the invention will be explained.

Higher reliability, lower cost and smaller size have been required for wiring substrates mounted to small mobile To form the conductor film 90, a chromium film is first formed by sputtering from the large diameter side of each of the holes 16 and then a copper film and an aluminum film are serially formed on the chromium film by a plating method. A cutter using laser is employed for cutting. The surface and the inside of the wiring connection glass substrates so cut are optically inspected and those substrates in which large defects are observed are rejected as defective substrates.

The number of defective substrates is remarkably decreased in comparison with the embodiment 8. This is presumably because chemical etching removes fine cracks. When such cracks exist, though they may be fine, these cracks are stretched during cutting and may invite the occurrence of a relatively large number of defective substrates. From this point, too, chemical etching of the inner walls of the through-holes by the sand blast process is extremely effective.

The wiring glass panes (wiring glass substrates) classified as the approved substrates by the optical inspection described above are evaluated in terms of conductivity of the through-holes on the upper and lower surfaces and the 4-point bending strength in the same way as in the embodiment 8. Table 2 tabulates the evaluation result of low-alkali borosilicate glass substrates having a thickness of 0.5 mm and Table 3 does the evaluation result of alkali-free borosilicate glass substrates having a thickness of 0.7 mm.

In (b1 to b6) shown in Table 2 and (c1 to c6) shown in Table 3, conductivity defect of the conductor film formed in the through-holes is not observed. Substrates (b1 to b6) shown in Table 2 and (c1 to c6) in Table 3 exhibit a similar tendency of the 4-point bending strength. When (b2 to b6) and (c2 to c6) that are etched are compared with (b1) and (c1) not etched, respectively, the strength can be remarkably improved and variance of the strength can be reduced. It has thus been clarified that chemical etching of the inner walls of the through-holes is extremely effective for improving reliability of the wiring glass panes.

TABLE 2

| No. | etching dose (μm) | conductivity defect ratio (%) | 4-point bending strength (MPa) mean value |
|---|---|---|---|
| b1 | 0 | 0 | 65 |
| b2 | 5 | 0 | 107 |
| b3 | 10 | 0 | 122 |
| b4 | 15 | 0 | 143 |
| b5 | 20 | 0 | 146 |
| b6 | 30 | 0 | 118 |

TABLE 3

| No. | etching dose (82 m) | conductivity defect ratio (%) | 4-point bending strength (MPa) mean value |
|---|---|---|---|
| c1 | 0 | 0 | 77 |
| c2 | 5 | 0 | 124 |
| c3 | 10 | 0 | 159 |
| c4 | 15 | 0 | 185 |
| c5 | 20 | 0 | 190 |
| c6 | 30 | 0 | 139 |

As to the etching dose, the strength drops with the increase of the etching dose and it drops, on the contrary, at an etching does of 30 μm. The strength drops presumably because the thickness of the wiring glass panes becomes small in (b6) and (c6) having the etching dose of 30 μm and the hole diameter of the through-holes becomes excessively great. In the substrates (b6) and (c6), the surface portion of the substrates is coarse due to etching. In other words, it has been found that the etching dose of 30 μm is excessively great and the etching dose of 5 to 20 μm is preferred.

In this embodiment and in the embodiment 8, the thickness of the wiring glass panes is examined within the range of 0.3 to 0.7 mm. Warp during the formation of the conductor is smaller and the strength is higher when the thickness is greater, so that the wiring glass panes having higher reliability can be obtained. However, the cost for forming the through-hole becomes higher and this is not advantageous for reducing the size. For these reasons, the thickness is believed to be at most 0.7 mm.

When the thickness is small, the cost for forming the through-holes can be reduced but from the aspect of the strength, the thickness is believed to be at least 0.3 mm. In other words, the thickness of the wiring glass panes is preferably within the range of 0.3 to 0.7 mm. Warp of the wiring glass panes at the time of formation of the conductor is also associated with the Young's modulus of the glass substrate besides the thickness. The greater the Young's modulus, the smaller becomes warp.

This embodiment and the embodiment 8 use glass substrates having a relatively high Young's modulus of 70 GPa or more among various glass. When the Young's modulus is less than 70 GPa, warp is likely to occur at a thickness of 0.3 mm. It is therefore believed preferable that the wiring glass panes have a Young's modulus of at least 70 GPa.

Figure 15:
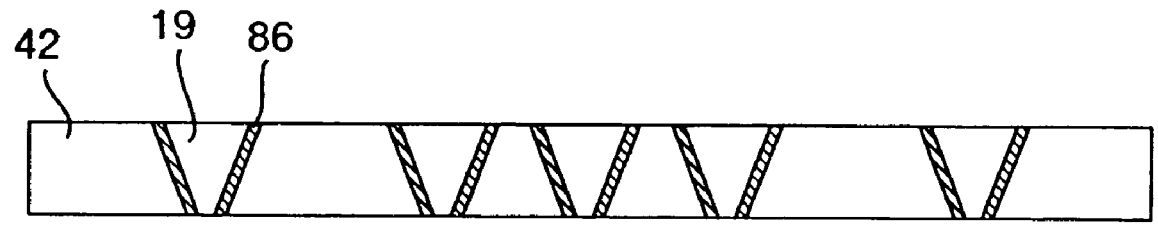
FIG. 15 is a sectional view showing an example of a structure of a glass pane used for a wiring connection glass substrate in an embodiment of the invention.

To improve the strength, a low melting point glass 86 may be formed on the inner wall of the holes 19 formed in the glass substrate 42 by the sand blast process as shown in FIG. 15. In this case, the low melting point glass 86 may have a thin film form, and sputtering or blasting of slurry containing the low melting point glass may be used.

Figure 16:
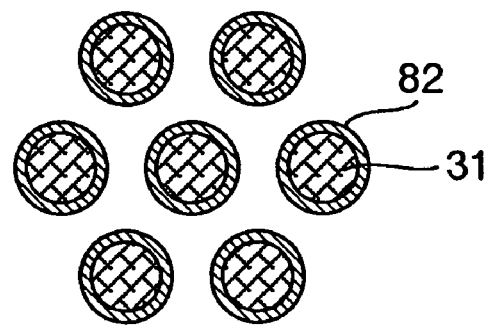
FIG. 16 is a sectional view showing an example of a structure of a conductive material used for a wiring connection glass substrate in an embodiment of the invention.

Incidentally, the particles formed by coating the surface of the porous conductive material 31 with the low melting point glass 82 as shown in FIG. 16 or the particles formed by sputtering or by blasting the slurry containing the low melting point glass may be filled and baked in the same way as described above. When such a construction is employed, both of the conductive material and the low melting point glass can be filled at one time and the production time of the via-hole electrodes can be shortened.

Figure 17:
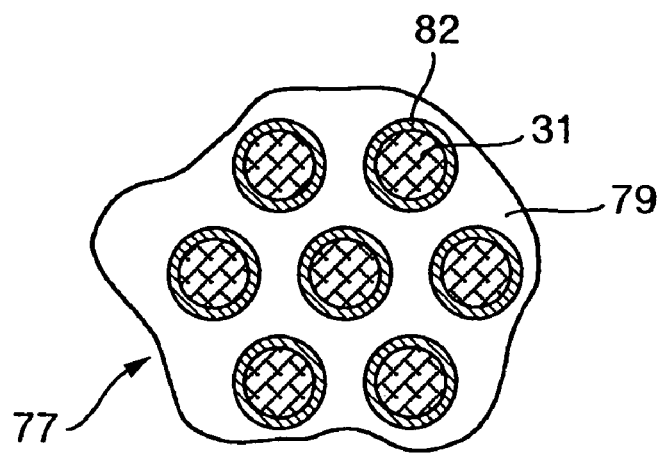
FIG. 17 is a sectional view showing an example of a structure of a conductive paste used for a wiring connection glass substrate in an embodiment of the invention.

Conductive paste 77 prepared by mixing the conductive material 38 shown in FIG. 16 with a solvent and a vehicle 79 may be used, or the low melting point glass may be processed in the form of glass frit into the paste without coating the surface of the conductive material 38 with the low melting point glass 82 as shown as shown in FIG. 17. When the form of the conductive paste is employed, it can be applied to a wiring connection substrate using a ceramic without the limitation to the wiring connection glass substrate of the invention.

Because an existing printing machine can be used, a production apparatus need not be introduced afresh. Because the wiring connection glass substrate using this conductive paste can shorten the production time of the via-hole electrodes in the same way as described above, the production cost can be reduced.

In this embodiment, the conductor is formed in the through-holes of the wiring glass pane, the wiring layer is formed on one of the surfaces and the bare chip is mounted. The bumps are formed on the other surface and are connected to the printed wiring substrate. In this manner is manufactured a semiconductor module.

Next, an embodiment 10 of the invention will be explained.

Wiring glass panes are fabricated in the same way as the embodiments 8 and 9 by using aluminosilicate glass substrates and lithium silicate glass substrates each having a size of 300 mm×200 mm and a thickness of 0.5 mm. These glass substrates have high planarity and high smoothness and their transmission factors in the visible light range are 50% or more. The coefficients of thermal expansion are remarkably greater than those of the glass substrates used in the embodiments 8 and 9. The coefficients of thermal expansion of the glass substrates used in the embodiments 8 and 9 are (30 to 55)×$10^{-7}$/° C. within the range of temperature of room temperature to 350° C. In contrast, the coefficients of thermal expansion of the glass substrates used in this embodiment are (75 to 100)×$10^{-7}$/° C.

To produce the wiring glass panes, a mask 13 for forming the holes is disposed on the glass substrate 43 so that a hole diameter Φ1 is 0.2 mm and a pitch P is 0.4 mm as shown in FIG. 11. The holes 16 are then formed by applying sand blast from above the mask 13 so that the taper angle attains 80°.

Next, the glass substrate 43 after the formation of the holes 16 is dipped into an aqueous hydrofluoric acid solution and the inner wall of the through-holes is etched by 10 μm in the same way as in the embodiment 9. FIG. 14 shows the state of the inner wall of the through-holes after etching.

The invention uses the paste method for forming the conductor in the holes 16. Five kinds of conductive pastes are prepared by mixing conductive fine particles of platinum, gold, silver and copper and various kinds of low melting point glass powder and are examined as tabulated in Table 4. The conductive paste is filled into the through-holes by use of the conductive paste. After filling, the conductor is baked at 450 to 600° C. that is less than the deformation temperature of the glass substrate.

Incidentally, only the conductor paste (d3) is treated in a reducing atmosphere to prevent oxidation of copper. The conductor paste is filled into the holes and the baked glass substrates are diced by a dicer to provide a large number of wiring glass panes having a size of 36 mm×10 mm. The surface and the inside of the wiring glass substrates so diced are inspected optically and those substrates in which large defects are observed are rejected as defective substrates. The number of defective substrates can be decreased in comparison with the embodiment 9. This is presumably because the fine cracks that cannot be removed by chemical etching are sealed by filling and baking of the conductive paste.

TABLE 4

| No. | conductor | low melting point glass |
|---|---|---|
| d1 | platinum | $V_2O_5$—$P_2O_5$—$Sb_2O_3$ system |
| d2 | gold | $Bi_2O_3$—$B_2O_3$—$SiO_2$ system |
| d3 | copper | $SnO$—$P_2O_5$—$ZnO$ system |
| d4 | silver | $PbO$—$B_2O_3$—$SiO_2$ system |
| d5 | silver | $PbO$—$B_2O_3$—$ZnO$ system |

The wiring glass panes classified as the approved substrates by the optical inspection described above are evaluated in terms of conductivity of the through-holes on the upper and lower surfaces and the 4-point bending strength in the same way as the embodiments 8 and 9. The occurrence of the conductivity defect is not observed in all the wiring glass panes and the conductive pastes. The 4-point bending strength is improved by 20 to 50% in comparison with the case before the conductive paste is filled and baked. It has thus been found that the paste method is effective for forming the conductor in the through-holes. When packaging substrates assembling therein a passive device are tentatively fabricated by using the wiring glass panes, it is expected that small size, high performance, low cost and high reliability can be achieved.

As to the conductive pastes of the invention, there are the cases where glass containing lead oxide as a main component is used as the low melting point glass as represented by (d4) and (d5) in Table 4. From the aspect of the environment, however, it is preferred to use glass not containing substantially lead but containing vanadium oxide as the main component, glass containing bismuth oxide as the main component and low melting point glass containing tin oxide as the main component as represented by (d1 to d3).

This embodiment uses the glass substrates having high coefficients of thermal expansion. It has been confirmed that so long as the coefficients of thermal expansion fall within the range of (30 to 100)×$10^{-7}$/° C. at a temperature within the range of room temperature to 350° C., the glass panes can be used as the wiring glass panes. Borosilicate glass substrates, alumina silicate glass substrates and lithium silicate glass substrates each containing a small amount of at least one kind of rare earth elements such as La, Y, Gd, Er, Pr, Nd, Sm, Ho, Yb, Eu, Tb, etc are similarly examined, and they are found effective as the wiring glass panes which can further satisfy both easy processability and high strength and in which the through-holes are formed by the sand blast process.

Next, an embodiment 11 of the invention will be explained.

A method of forming a porous electrode will be explained. Table 5 illustrates compositions of pastes prepared and the result. The paste components use (d4 and d5) in Table 4 as the base and Ag as the conductor. Crystallized glass uses PbO—$B_2O_3$—ZnO system glass and PbO—$B_2O_3$—$SiO_2$ system having a softening point of 520° C. To adjust the coefficients of thermal expansion, $SiO_2$ and $PbTiO_3$ are used as fillers. Ethyl cellulose is used as a binder and α-terepineol is used as a solvent.

TABLE 5

| No. | conductor (Vol %) | crystallized glass (Vol %) | electric resistivity (Ω · m) | volume shrinkage ratio (%) | remarks |
|---|---|---|---|---|---|
| e1 | 90 | 10 | 5.2~6.0 × $10^{-8}$ | 15~21 | baked body |
| e2 | 80 | 20 | 1.9~2.2 × $10^{-7}$ | 9.7~12.4 | |
| e3 | 70 | 30 | 7.6~8.9 × $10^{-7}$ | 8.9~11.3 | |
| e4 | 60 | 40 | 2.0~3.1 × $10^{-6}$ | 7.2~10.3 | |
| e5 | 40 | 60 | 4.4~5.1 × $10^{-6}$ | 8.2~11.0 | |
| e6 | 30 | 70 | 7.8~9.0 × $10^{-6}$ | 7.6~9.4 | |
| e7 | 20 | 80 | 1.9~2.4 × $10^{-5}$ | 7.2~9.2 | |
| e8 | 17.5 | 82.5 | 2.7~3.4 × $10^{-5}$ | 5.7~8.6 | |
| e9 | 15 | 85 | 5.8~7.2 × $10^{-5}$ | — | large resistivity |

Each sample is fabricated by applying the paste into a size of 15Φ×100 to 150 μm on the surface of the borosilicate glass by use of a printer and baking the substrate at 460 to 520° C. for 40 minutes. Electric resistivity is measured by a 4-probe method and the volume shrinkage ratio is measured by a volume change after baking with a sample baked at 120° C. as a reference. When the content of crystallized glass is 10 wt % as in (e1), the grain growth of the Ag particles is remarkable and the volume shrinkage ratio is 15 to 21%.

In the case of the paste consisting solely of the Ag particles according to the prior art, volume shrinkage of at least 23% occurs. In the samples (e2) to (e9), the volume shrinkage ratio is smaller than that of (e1). It has been confirmed that the conductor is the porous conductor material shown in FIG. 2(b).

This is presumably because crystallized glass inhibits the formation of necks of the Ag particles. Therefore, the porous electrodes can be formed similarly by adding a nucleus formation material that reacts with the low melting point glass and forms the crystallized glass. This also holds true of addition of fillers that inhibit the grain growth of the conductor. Incidentally, these nucleus formation material and filler are not particularly limited.

When the thickness of glass is 0.3 mm, the inner diameter of the hole is Φ0.2 mm and the resistance of the via-hole electrode is 0.3 Ω/electrode by way of example, the electric resistivity of the conductive material must be 3.2×$10^{-5}$ Ω·m or below. Therefore, the electric resistivity is as great as 5.8 to 7.2×$10^{-5}$ in (e9). The composition ratio is not particularly limited and a suitable composition may be selected. To reduce the electric resistance of the via-hole portion as described above, however, the composition preferably contains 20 to 82.5% of crystallized glass in a volume ratio on the basis of the sum of the conductor and the crystallized glass.

It has been confirmed that when crystallized glass having a softening point lower than or equal to the softening point of the glass pane and the baking temperature of the conductor is used, this tendency occurs in (d1) to (d3) in Table 4, too.

Filling of the conductive paste into the through-holes is made by using a printer. After filling, the conductor is baked at a temperature within the range of 450 to 600° C. that is less than the deformation temperature of the glass substrate. Incidentally, only the conductive paste of (d3) in Table 4 is treated in a reducing atmosphere to prevent oxidation of copper. After the conductive paste is filled into the holes, the glass substrate so baked is diced with a dicer to provide a large number of wiring glass panes having a size of 36 mm×10 mm.

Those wiring glass panes classified as the approved products by the optical inspection are evaluated in terms of the 4-point bending strength of the holes on the upper and lower surfaces in the same way as described above. The deflective strength is improved by 20 to 50% than before the conductive paste is filled into the through-holes and is baked. It has thus been found that the paste method is effective for forming the conductor into the through-holes. It is believed that in the glass pane according to the invention, fine cracks that have not been removed by chemical etching are sealed by filling and baking of the conductive paste to thereby improve the strength.

As described above, it has been found that the paste used for forming the wiring glass panes preferably contains 20 to 82.5% of crystallized glass in the volume ratio on the basis of the sum of the conductor and the crystallized glass to form the porous conductive material.

Next, an embodiment 12 of the invention will be explained.

To reinforce the strength of pores inside the conductive material, pastes are prepared by adding low melting point softened glass. Table 6 illustrates the compositions and the results of the pastes so produced. Incidentally, Ag is used for the conductor and $PbO$—$B_2O_3$—$ZnO$ system glass and $PbO$—$B_2O_3$—$SiO_2$ system glass each having a softening point of 460 to 520° C. are used for the crystallized glass. Ethyl cellulose is used for the binder and α-terepineol is used for the solvent.

Both electric resistivity and volume shrinkage ratio are found excellent. As to (f8), the aggregated body of glass is confirmed as existing through an SEM image. When the aggregated body of glass exists, macro-pores develop and the drop of the strength is likely to occur. As the amount of the crystallized glass increases from (e2) to (e8), the compositions that can limit the resistance of the via-hole electrodes to 0.3Ω or below shift to (f7) to (f1) in which the addition amounts of the low melting point softened glass are small.

This shift presumably occurs because the total volume of the crystallized glass and the low meting point softened glass, the electric contact of the Ag particles is hindered and the current paths are cut off. The composition ratio is not particularly limited and a suitable composition may be selected. It has been found that in order to reduce the electric resistance of the via-hole portions as described above, maximum 85% (not greater than 85%) of the low melting point softened glass can be added in the volume ratio to the sum of the conductor, the crystallized glass and the low melting point glass. It has also been confirmed that this tendency occurs in (d1) to (d3) in Table 4 when the low melting point softened glass having a softening point equal to or lower than the softening point of the glass panes and the baking temperature of the conductor.

As described above, it has been found that a paste containing up to 85% of the low melting point softened glass in the volume ratio to the sum of the conductor, the crystallized glass and the low melting point softened glass is suitable for the paste to be used for the wiring glass panes to supplement the pores of the porous conductive material.

Those wiring glass panes classified as the approved products by the optical inspection are evaluated in terms of the 4-point bending strength on the upper and lower surfaces in the same way as described above. The deflective strength is improved by 20 to 50% than before the conductive paste is filled into the through-holes and is baked. It has thus been found that the paste method is effective for forming the conductor into the through-holes. When a packaging substrate with a built-in passive element is fabricated tentatively by use of this wiring glass pane, it is expected that higher performance, lower cost and higher reliability can be achieved.

In the conductive pastes according to the invention, there are the cases where glass containing lead oxide as the main

TABLE 6

| No. | (b2) (Vol %) | low melting point softened glass (Vol %) | electric resistivity (Ω·m) | volume shrinkage ratio (%) | remarks |
|---|---|---|---|---|---|
| f1 | 90 | 10 | $3.8$~$4.2 \times 10^{-7}$ | 6.1~7.9 | |
| f2 | 80 | 20 | $6.9$~$7.3 \times 10^{-7}$ | 5.2~7.6 | |
| f3 | 60 | 40 | $9.1$~$9.8 \times 10^{-7}$ | 7.4~8.8 | |
| f4 | 35 | 65 | $1.3$~$2.1 \times 10^{-6}$ | 10.3~12.7 | |
| f5 | 25 | 75 | $1.9$~$2.5 \times 10^{-6}$ | 7.7~9.5 | |
| f6 | 20 | 80 | $2.1$~$2.6 \times 10^{-6}$ | 7.2~10.4 | |
| f7 | 15 | 85 | $2.4$~$3.0 \times 10^{-6}$ | 8.6~9.4 | |
| f8 | 10 | 90 | $2.7$~$3.9 \times 10^{-6}$ | — | aggregated body |

The production condition of the samples and the testing method are the same as those described above. Incidentally, (e2) in Table 2 is used as the composition for forming the porous conductive material. It has been confirmed that the glass layer exists inside and on the surface of the pores of the porous conductive materials of (f1) to (f7) in the same way as in FIG. 4(b).

component is used as the low melting point glass as represented by (d4) and (d5) in Table 4. From the aspect of the environment, however, it is preferred to use glass not containing substantially lead but containing vanadium oxide as the main component, glass containing bismuth oxide as the main component and low melting point glass containing tin oxide as the main component as represented by (d1 to d3) in Table 4.

As described above, when this construction is employed, the production process can be simplified in the prior art method that uses etching, sputtering and plating in combination, and can reduce the production time and hence, the production cost. Further, this embodiment can provide a wiring connection glass substrate 21 having a smaller volume shrinkage ratio and a higher strength than the prior art substrates.

Next, an embodiment 13 of the invention will be explained.

Figure 18:
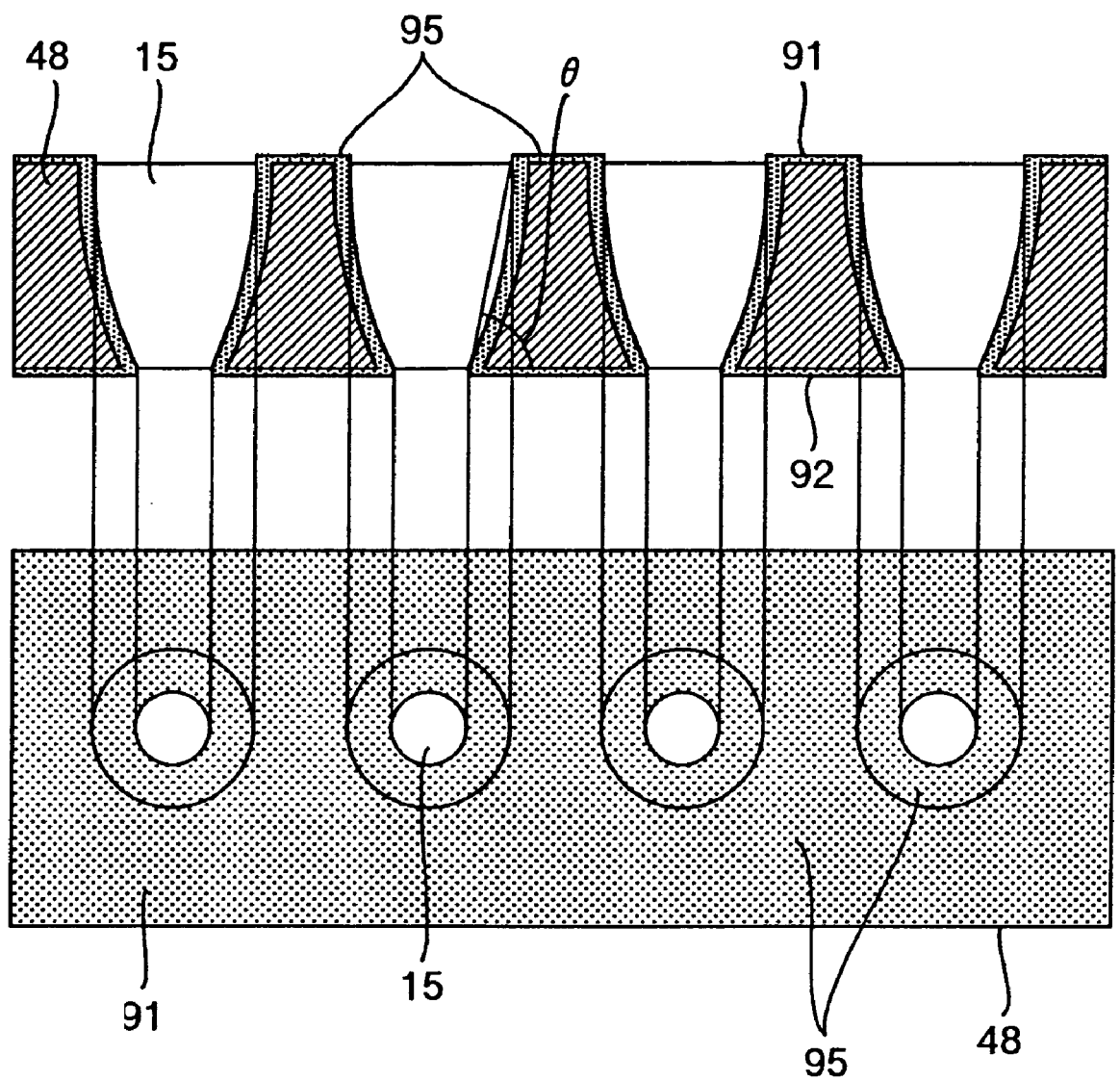
FIG. 18 is a schematic sectional and plan view of a wiring connection glass substrate in an embodiment of the invention.

FIG. 18 is a sectional view of a bored substrate surface treated with an oxide film and a structural view of its upper surface. Holes 15 are bored in a glass substrate 48. An oxide film 95 is formed on the opposing two wiring surfaces 91 and 92 and on the surface of the holes 15. The procedure will be explained next.

A film resist, a product of Tokyo Oka Kogyo K. K., is laminated on a glass substrate (150 mm×150 mm×0.3 mm), a product of Asahi Glass Co., at 80° C. and 4 kg/cm². After a mask is fitted, the substrate is exposed at 30 mJ/cm² by using a ultra-high pressure mercury lamp and is developed by spraying a 2% aqueous $Na_2CO_3$ solution.

Next, boring is conducted by sand blast and through-holes having a diameter of 200 µm and a pitch diameter of 200 µm are formed in the entire surface of the substrate. In the sectional structure of each through-hole so formed, the sizes of upper and two openings are different. A taper angle of both openings is 80°. When a 3-point bending strength test is carried out, the strength of the bored glass substrate is found to be 65 MPa. The 3-point bending strength before boring is 210 MPa and the strength drops about ⅓ due to machining.

Next, coating solutions of oxides of Fe, Sn, Ti, Al, Sm and Pr each having a different coefficient of thermal expansion are prepared. The preparation condition is as follows.

[Fe] The coating solution is prepared by dissolving 20 g of iron nitrate, a product of Wako Pure Chemical Industries, Ltd., in 80 g of ethylene glycol. After 2 g of $HNO_3$ is added, the mixture is stirred at 85° C. for 2 hours to give the coating solution.

[Sm] The coating solution is prepared in the same way as Fe by using samarium, a product of Wako Pure Chemical Industries, Ltd.

[Pr] The coating solution is prepared in the same way as Fe by using praseodymium nitrate.

[Sn] The coating solution is prepared by adding 70 g of isopropanol to 20 g of tin chloride, a product of Kojundo Chemical Lab. Co., Ltd. After 10 g of ethanolamine is added, the mixture is stirred. Thereafter, 5 g of water is added and the mixture is stirred at 85° C. for 2 hours.

[Ti] The coating solution is prepared by dissolving 20 g of titanium isoproxide, a product of Kojundo Chemical Lab. Co., Ltd. in 70 g of isopropanol and after 10 g of ethanolamine is added, the mixture is stirred at 85° C. for 2 hours.

[Al] The coating solution is prepared by adding 70 g of water to 20 g of aluminum isoproxide, a product of Kojundo Chemical Lab. Co., Ltd., and the mixture is stirred at 85° C. for 30 minutes. Next, 3 g of nitric acid is added and the mixture is stirred at 85° C. to obtain a clear sol and then 10 g of ethylene glycol is added to obtain the coating solution.

The surface treatment of the glass substrate is carried out in the following way. While each coating solution prepared is kept at 80° C., the bored glass substrate is dipped into the coating solution for 5 minutes and is then taken out. The excessive coating solution is wiped away and the glass substrate is dried at 150° C. for 5 minutes and is then baked at 450° C. for 1 hour to form the oxide film on the two wiring surfaces opposing each other and on the surface of the through-holes.

Table 7 illustrates the evaluation result of the samples formed.

TABLE 7

| sample | 3-point bending strength (MPa) | thermal expansion coefficient (ppm/° C.) |
| --- | --- | --- |
| before boring | 210 | 4 |
| after boring | 36 | 4 |
| Sn oxide coating | 35 | 4 |
| Al oxide coating | 84 | 8 |
| Ti oxide coating | 110 | 8.2 |
| Sm oxide coating | 105 | 10.8 |
| Pr oxide coating | 102 | 11. |
| Fe oxide coating | 115 | 12.3 |

It can be understood from the result shown in Table 7 that the strength of the substrates can be improved when the coefficient of thermal expansion is higher than 8 ppm/° C.

Next, an embodiment 14 of the invention will be explained.

When an oxide having a large coefficient of thermal expansion is coated to the surface to allow the compressive stress to occur and to suppress the growth of cracks, the compressive stress may presumably be affected by the thickness of the coating film. Therefore, to examine the relation between the film thickness and the strength, samples are prepared by varying the film thickness by use of Fe coating solutions and are evaluated.

The coating solutions of the Fe oxide having different viscosities are prepared and the film thickness is varied. Each coating solution is prepared by dissolving 20 g of iron nitrate, a product of Wako Pure Chemical Industries, Ltd., in 80 g of ethylene glycol, adding 2 g of $HNO_3$ and stirring the mixture at 80° C. The viscosity of each coating solution is controlled through the stirring time.

The surface treatment of the glass substrate is as follows. The bored glass substrates produced in the embodiment 13 kept at 80° C. are dipped for 5 minutes. After the excessive coating solution is wiped away, the glass substrates are dried at 150° C. for 5 minutes and are baked at 450° C. for 1 hour to form the oxide film on the two opposing wiring surfaces and on the surface of the through-holes.

Table 8 illustrates the evaluation result of the samples so produced.

TABLE 8

| stirring time (min) | film thickness (µm) | strength (MPa) | remarks |
| --- | --- | --- | --- |
| 0 | 0.1 | 36 | uniform film |
| 20 | 0.2 | 102 | uniform film |
| 40 | 0.3 | 110 | crack occurred in film |
| 60 | 0.5 | 115 | crack occurred in film |
| 120 | 1.0 | 112 | crack occurred in film |
| 140 | 1.2 | 76 | film peeled |

It has been found out from the result tabulated in Table 8 that the strength can be improved within the range of 0.2 to 1.0 µm. When the thickness exceeds 1.0 µm, the number of portions at which the film peels becomes great and the effect cannot be obtained. When the thickness is greater than 0.3 µm, the crack occurs but because no problem of bondability occurs at 1.0 µm or below, a sufficient effect can be obtained.

Next, an embodiment 15 of the invention will be explained.

Impregnation solutions of oxides of Co, Ni, Ba, Sr, Zr, Sb and In having different reactivity with $SiO_2$ are prepared as the coating solutions. The production condition is as follows.

[Co] The impregnation solution is prepared by dissolving 10 g of cobalt nitrate, a product of Wako Pure Chemical Industries, Ltd., in 50 g of water and adding it to 30 g of ethylene glycol to give an impregnation solution.

[Ni] The impregnation solution is prepared in the same way as Co by using nickel nitrate, a product of Wako Pure Chemical Industries, Ltd.

[Ba] The impregnation solution is prepared in the same way as Co by using barium nitrate, a product of Wako Pure Chemical Industries, Ltd.

[Sr] The impregnation solution is prepared in the same way as Co by using strontium nitrate, a product of Wako Pure Chemical Industries, Ltd.

[Zr] The impregnation solution is prepared in the same way as Co by using zirconium nitrate, a product of Wako Pure Chemical Industries, Ltd.

[Sb] The impregnation solution is prepared by adding 90 g of isopropanol to 10 g of isopropoxyanthimony and stirring the mixture.

[In] The impregnation solution is prepared in the same way as Sb by using isopropoxyindium.

The surface treatment of the glass substrates is as follows. Each of the bored substrates formed in the embodiment 13 is dipped into each coating solution and is placed into a desiccator connected to a vacuum pump. After impregnated with the solution at a reduced pressure for 10 minutes, the substrate is taken out. The excessive solution is wiped away and the substrate is dried at 150° C. for 5 minutes and is then baked at 450° C. for 1 hour to form the oxide film on the two opposing wiring surfaces and on the surface of the through-holes.

Table 9 illustrates the evaluation result of the samples so produced.

TABLE 9

| sample | 3-point bending strength (MPa) | $SiO_2$ compound |
| --- | --- | --- |
| before boring | 210 | — |
| after boring | 36 | — |
| Co oxide impregnation | 106 | $CoSiO_4$ |
| Ni oxide impregnation | 115 | $NiSiO_4$ |
| Ba oxide impregnation | 102 | $BaSi_2O_5$ |
| Sr oxide impregnation | 101 | $SrSiO_3$ |
| Sb oxide impregnation | 37 | nil |
| In oxide impregnation | 36 | nil |

It has been found out from the result tabulated in Table 9 that the strength of the substrate can be improved when reactivity with $SiO_2$ is high.

Next, an embodiment 16 of the invention will be explained.

Coating solutions are prepared by adding Na to the Fe, Zr coating solutions prepared in the embodiments 13 and 15. The preparation condition is as follows.

[Fe—Na] A coating solution is prepared by adding 70 g of water to 20 g of sodium nitrate, heating the mixture at 85° C. for dissolution and then adding 10 g of ethylene glycol to give an Na coating solution.

Next, 50 g of the Na coating solution is added to 50 g of the Fe coating solution prepared in the embodiment 13 to give a coating solution.

[Zr—Na] A coating solution is prepared by adding 70 g of water to 20 g of sodium nitrate, heating the mixture to 85° C. for dissolution and then adding 10 g of ethylene glycol to give an Na coating solution.

Next, 50 g of the Na coating solution is added to 50 g of the Zr impregnation solution prepared in the embodiment 13 to give a coating solution. The surface treatment of the glass substrate is the same as that of the embodiment 13.

Table 10 illustrates the evaluation result of the samples so prepared.

TABLE 10

| sample | 3-point bending strength |
| --- | --- |
| Fe—Na coating | 165 |
| Zr—Na coating | 155 |

It has been found from the result shown in Table 10 that the Fe and Zr oxides become more reactive with $SiO_2$ and the strength of the substrate can be improved by adding $Na_2O$.

Next, an embodiment 17 of the invention will be explained.

Glass having a greater Na addition amount is produced by increasing the Na addition amount in the glass to improve bondability with the coating film. Various kinds of oxides and carbonates are used as the starting materials and $SiO_2$, $Al_2O_3$, $B_2O_3$, $Nd_2O_3$, $Sb_2O_3$, $Na_2CO_3$ and $Li_2CO_3$ are weighed so as to achieve the compositions shown in Table 11. Each mixture is dry mixed by using a chaser mill. The mixed starting materials are placed into a platinum crucible, molten at 95° C. for 2 hours, poured into a dedicated mold and pressed to give a glass substrate of 150 mm×150 mm×0.5 mm. Distortion removal of the resulting glass substrate is carried out at 550° C. for 1 hour and the substrate is cooled inside a furnace and taken out.

Bored substrates are produced in the same way as in the embodiment 13. The Fe, Zr coating solutions are prepared in the same way as in the embodiments 13 and 15. Incidentally, the surface treatment of the glass substrates is the same as that of the embodiment 13.

Table 12 illustrates the evaluation result of the samples so produced.

TABLE 11

| oxide | wt % |
| --- | --- |
| $SiO_2$ | 60 |
| $Al_2O_3$ | 15 |
| $B_2O_3$ | 10 |
| $Nd_2O_3$ | 3 |
| $Sb_2O_3$ | 0.5 |
| $Na_2O$ | 11 |
| $Li_2O$ | 0.5 |

TABLE 12

| sample | 3-point bending strength (MPa) |
| --- | --- |
| before boring | 220 |
| after boring | 42 |
| Fe oxide coating | 166 |
| Zr oxide coating | 162 |

It has been found from the result shown in Table 12 that the Fe and Zr oxides become more reactive with $SiO_2$ by increasing the $Na_2O$ addition amount of the glass substrate and the strength of the substrate can be improved in the same way as in the method that adds Na to the coating solution.

Next, an embodiment 18 of the invention will be explained.

The Fe—Na coating solution prepared in the embodiment 16 is used as a coating solution.

The bored substrate produced in the embodiment 13 is used as the substrate for etching treatment. The glass substrate after the formation of the through-holes is dipped into an aqueous hydrofluoric acid solution to chemically etch the inner wall of the through-holes. In this case, etching is carried out by applying the ultrasonic wave so that the inner walls of the through-holes can be uniformly etched. The inner walls of the through-holes after etching have a large number of substantially round or crater-like concavo-convexities as shown in FIG. 14.

Figure 19:
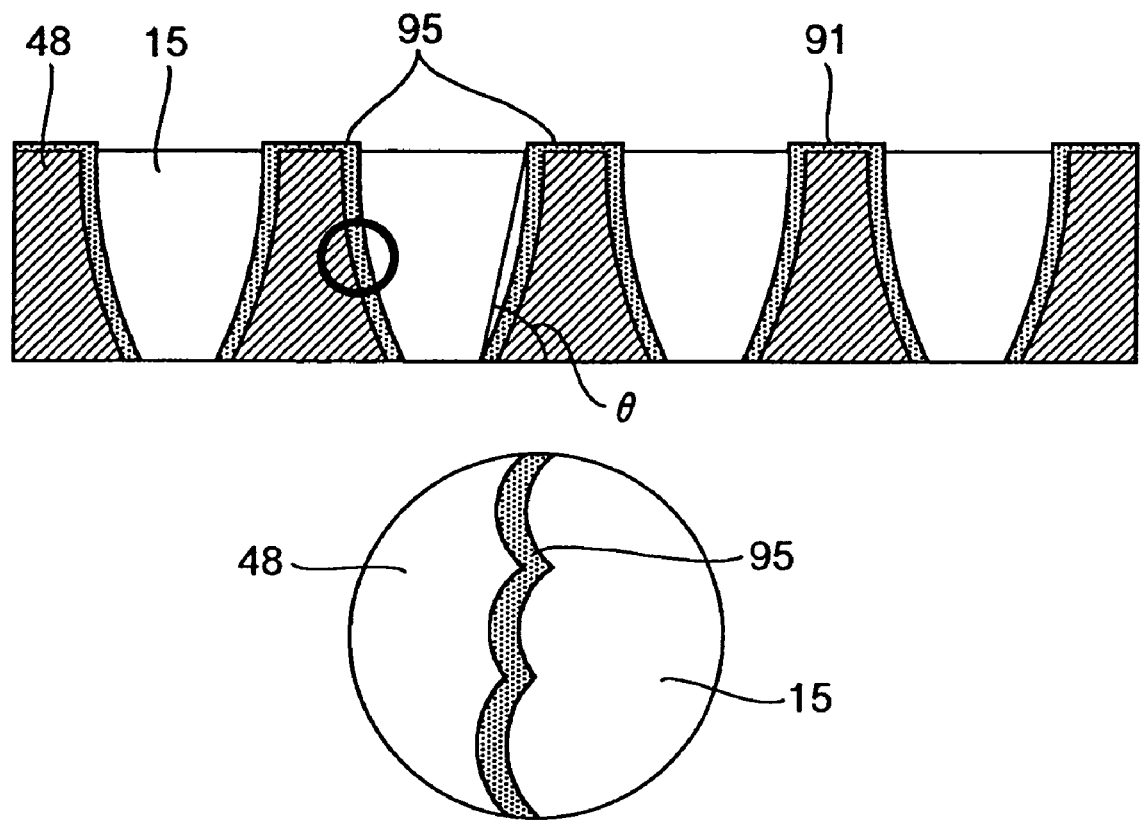
FIG. 19 is a schematic sectional view of a wiring connection glass substrate coated with an oxide after etching and its partial enlarged sectional view in an embodiment of the invention.

The surface treatment of the glass substrate is carried out in the same way as the embodiment 16 by coating the surface of the two opposing wiring surfaces 91 of the glass substrate and the surface of the through-holes with the oxide film 95 by using the Fe—Na and Zr—Na solutions prepared in the embodiment 16. The section of the oxide film 95 substantially keeps the substrate surface having a large number of substantially round or crater-like concavo-convexities formed by etching on the inner walls of the through-holes as shown in FIG. 19. A large number of crater-like concavo-convexities are observed after coating, too.

When the strength test of the samples so prepared is conducted, the samples have strength of 176 MP when Fe—Na is used and 181 MPa when Zr—Na is used. It has thus been found that the strength can be improved by applying coating to the glass substrates subjected to etching.

Next, an embodiment 19 of the invention will be explained.

Figure 20:
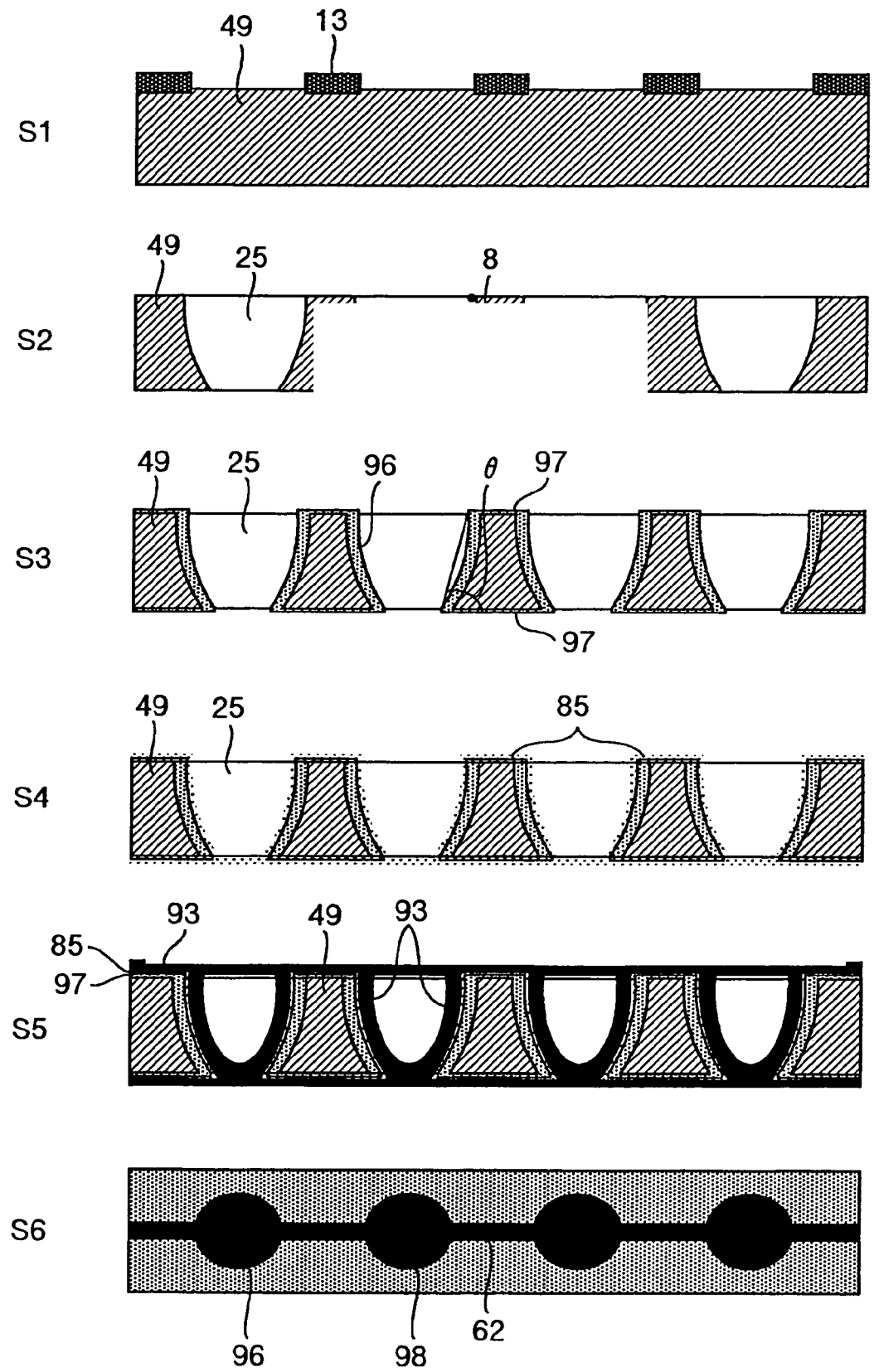
FIG. 20 is a production process flow diagram showing an example of a manufacturing method of a wiring connection glass substrate by plating in an embodiment of the invention.

An example of wirings for electrically connecting a plurality of high density terminals arranged on one of the surfaces of the glass substrate described above with predetermined intervals corresponding to a wiring density of a semiconductor chip to the inner wall of the through-holes, formed by a plating method, will be explained with reference to the process diagram of FIG. 20.

Step 1: Formation of Mask

A film resist, a product of Tokyo Oka Kogyo K. K., is laminated on the glass substrate 49 produced in the embodiment 17 at 80° C. and 3 kg/cm$^2$.

Next, a mask depicting predetermined holes is fitted, exposed at 30 mJ/cm$^2$ by use of a ultra-high pressure mercury lamp and is developed by spraying a 0.5% aqueous $Na_2CO_3$ solution to form a hole formation mask 13 on the glass substrate 49.

Step 2: Processing

Holes 25 are formed on the glass substrates 49 by sand blast. In the sectional structure of the holes 25 that are thus obtained, the sizes of upper and lower two open portions are different. A taper angle 8 between both openings is 74°.

Step 3: Surface Treatment

The surface treatment is carried out in the same way as in the embodiment 16 by using the Fe—Na coating solution prepared in the embodiment 16 to form the oxide film 96 on the surface of the holes 25. An oxide film 97 is formed at this time on the two opposing wiring surfaces as the surfaces of the glass but its thickness is as small as 50 nm unlike the oxide film 96 formed on the surface of the holes 25. Incidentally, those substrates the strength of which is improved to a certain extent by conducting chemical etching after processing can be used as the glass substrates to be surface treated. In this case, cracks, etc, of the substrates are removed and the substrates are not easily broken. Therefore, handling of the substrates becomes excellent.

Step 4: Formation of Power Feeding Layer 85

To form a power feeding layer 85, process steps of pre-dipping, treatment with a sensitizer, washing with water, treatment with an adhesion promoter and plating are carried out.

Pre-dipping:

The substrates after the surface treatment are dipped into "PD-301" (trade name, product of Hitachi Chemical Co., Ltd.) at room temperature for 3 minutes.

Sensitizer Treatment:

The substrates are dipped into "HS-202B" (trade name, product of Hitachi Chemical Co., Ltd.) at room temperature for 3 minutes.

Washing with Water:

The substrates are dipped into distilled water at room temperature for 3 minutes.

Treatment with Adhesion Promoter:

The substrates are dipped into "ADP-601" (trade name, product of Hitachi Chemical Co., Ltd.) at room temperature for 5 minutes.

Plating:

The substrates are dipped into "CUST201" (trade name, product of Hitachi Chemical Co., Ltd.) at room temperature for 30 minutes.

In this process, a 0.3 μm-thick power feeding layer 85 is formed on the oxide film 96 formed by the surface treatment. Incidentally, the power feeding layer 85 is formed in this stage not only on the surface of the holes 25 but also on the two opposing wiring surfaces as the glass surface.

Step 5: Formation of Conductor Film

A conductor film 93 is formed by dipping each substrate in an electrolytic plating solution, conducting feeding treatment for 2 hours and burying the holes with the conductor. The conductor film 93 is formed in this stage not only on the surface of the holes 25 but also on the two opposing wiring surfaces of the glass substrates and its thickness is 18 μm.

Step 6: Formation of Wiring

A film resist, a product of Tokyo Oka Kogyo K.K., is laminated at 80° C. and 3 kg/cm$^2$. Next, a predetermined mask is fitted, is exposed at 30 mJ/cm$^2$ by using a ultra-high pressure mercury lamp and developed by spraying a 0.5% aqueous $Na_2CO_3$ solution to form a wire 62 and pad-like electrodes 98. Incidentally, pad-like masks are arranged at the upper and lower portions of the holes 25 to protect the conductor film 93 inside the holes.

The surface treatment is applied to the through-holes processed as described above and there are obtained semiconductor connection glass substrates in which the wiring having high adhesion is formed inside the through-holes and on the surface of the substrate the strength of which is improved.

Next, an embodiment 20 of the invention will be explained.

Figure 21:
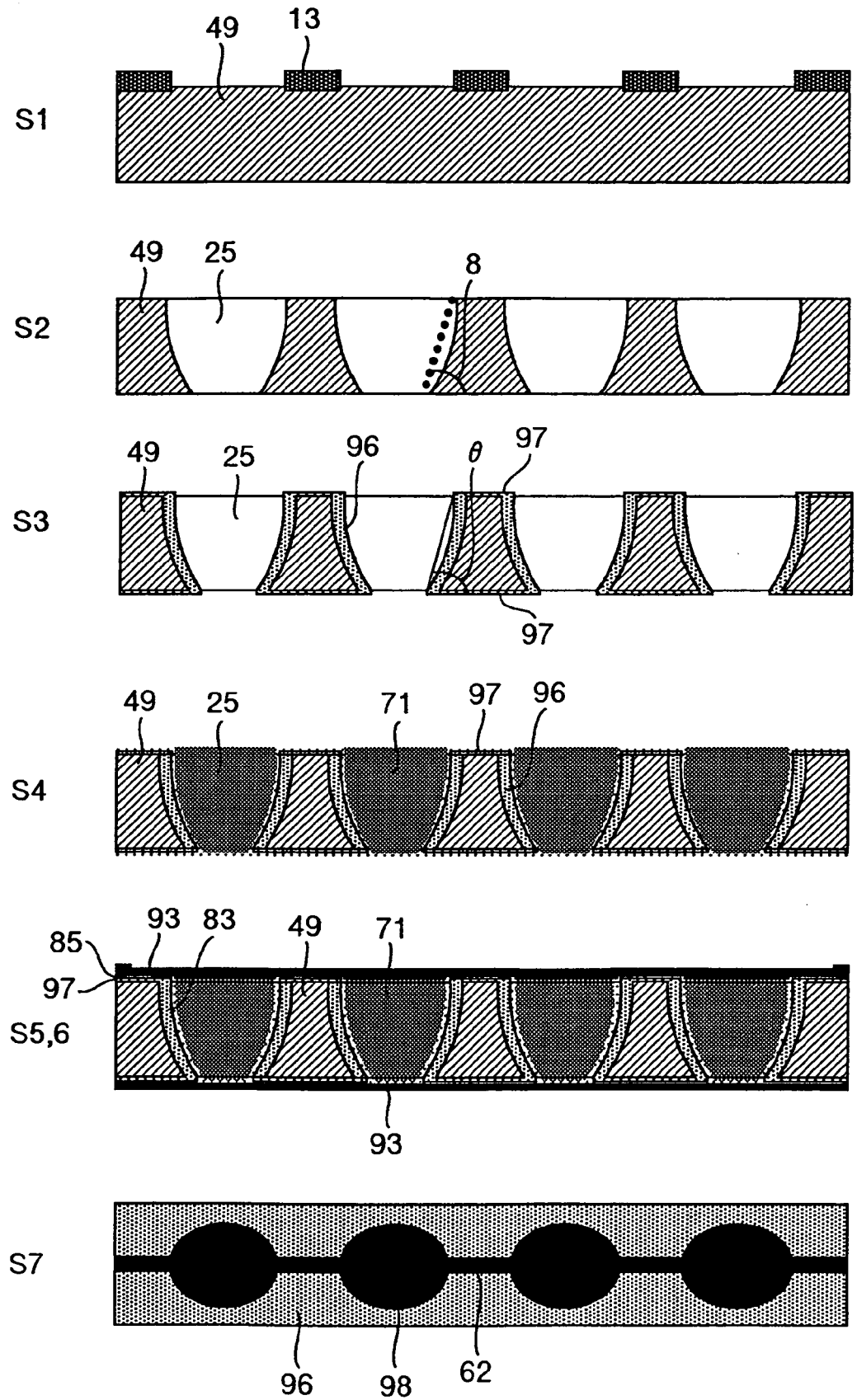
FIG. 21 is a production process flow diagram showing an example of a manufacturing method of a wiring connection glass substrate by a paste in an embodiment of the invention.

An example in which wirings for electrically connecting a plurality of high density terminals arranged on one of the surfaces of each of the glass substrates described above with intervals corresponding to the wiring density of the semiconductor chip and the inner walls of the through-holes is formed by use of a conductive paste will be explained with reference to a process diagram of FIG. 21.

Step 1: Formation of Mask

A film resist, a product of Tokyo Oka Kogyo K. K., is laminated on the glass substrate 49 produced in the embodiment 17 at 80° C. and 3 kg/cm$^2$. Next, a mask depicting predetermined holes is fitted, is exposed at 30 mJ/cm$^2$ by use of a ultra-high pressure mercury lamp and is developed by spraying a 0.5% aqueous $Na_2CO_3$ solution. Further, a hole formation mask 13 is formed on the glass substrate 49.

Step 2: Processing

Holes 25 are formed on the glass substrate 49 by sand blast. In the sectional structure of the holes 25 so formed, the sizes of upper and lower two openings are different. A taper angle 8 between both openings is 74°.

Step 3: Surface Treatment

The surface treatment is carried out in the same way as in the embodiment 16 by using the Fe—Na coating solution prepared in the embodiment 16 to form the oxide film 96 on the surface of the holes 25. An oxide film 97 is formed at this time on the two opposing wiring surfaces as the surface of the glass but its thickness is as small as 50 nm unlike the oxide film 96 formed on the surface of the holes 25. Incidentally, those substrates the strength of which is improved to a certain extent by conducting chemical etching after processing can be used as the glass substrates to be surface treated. In this case, cracks, etc, of the substrates are removed and the substrates are not easily broken. Therefore, handling of the substrates becomes excellent.

Step 4: Filling of Paste (Formation of Electrode)

The paste method is used to form a conductor into the through-holes. The conductive paste contains conductive fine particles of silver, low melting point glass powder and a solvent. Conductive fine particles of platinum, gold and copper can be used as the fine conductive particles besides silver. To fill the conductive paste into the through-holes, the conductive paste is applied from the large diameter side of the through-holes.

After filling, the conductor is baked at a temperature within the range of 500 to 600° C. less than the deformation temperature of the glass substrate to form a layer of the low melting point glass 83 and via-hole electrodes 71 inside the through-holes. Incidentally, only the conductive paste of the fine copper particles is preferably treated in a reducing atmosphere to prevent oxidation of copper. The conductive paste contains the conductive fine particles, the low melting point glass powder and the solvent, and a sol-mixed paste prepared by mixing this paste with a sol solution of the coating solution used for the surface treatment of the glass substrate can be used, too.

Step 5: Formation of Power Feeding Layer 85

To form a power feeding layer 85, process steps of pre-dipping, treatment with a sensitizer, washing with water, treatment with an adhesion promoter and plating are carried out.

Pre-Dipping:

The substrates after the surface treatment are dipped at room temperature for 3 minutes in "PD-301" (trade name, product of Hitachi Chemical Co., Ltd.).

Sensitizer Treatment:

The substrates are dipped into "HS-202B" (trade name, product of Hitachi Chemical Co., Ltd.) at room temperature for 3 minutes.

Washing with Water:

The substrates are dipped into distilled water at room temperature for 3 minutes.

Treatment with Adhesion Promoter:

The substrates are dipped into "ADP-601" (trade name, product of Hitachi Chemical Co., Ltd.) at room temperature for 5 minutes.

Plating:

The substrates are dipped into "CUST201" (trade name, product of Hitachi Chemical Co., Ltd.) at room temperature for 30 minutes.

In this process, a 0.3 μm-thick power feeding layer 85 is formed on the oxide film 96 formed by the surface treatment.

Step 6: Formation of Conductor Film 93

A conductor film 93 is formed by dipping each substrate into an electrolytic plating solution and conducting feeding treatment for 2 hours. The conductor film 93 is formed on the two opposing wiring surfaces, too, and its thickness is 18 μm.

Step 7: Formation of Wiring

A film resist, a product of Tokyo Oka Kogyo K.K., is laminated at 80° C. and 3 kg/cm². Next, a predetermined mask is fitted, is exposed at 30 mJ/cm² by using a ultra-high pressure mercury lamp and is developed by spraying a 0.5% aqueous $Na_2CO_3$ solution to form a wire 62 and pad-like electrodes 98. Incidentally, pad-like masks are arranged at the upper and lower portions of the holes 25 to protect the via-electrodes 71 inside the holes.

The surface treatment is applied to the through-holes processed as described above and there are obtained semiconductor connection glass substrates in which the wiring having high adhesion is formed inside the through-holes and on the surface of the substrates the strength of which is improved.

When the paste filling method is employed, glass in the paste and the oxide film react with each other and adhesion of the glass substrate can be improved. Since the through-holes are buried, the glass substrates having higher strength than those obtained by the plating method can be obtained.

Next, an embodiment 21 of the invention will be explained.

An example in which the substrates used are those which are obtained by etching the substrates subjected to the sand blast processing and electrode are formed inside the through-holes by using the conductive paste will be explained.

The through-holes are formed by sand blast in the same way as in the embodiment 20. Next, each substrate is etched in the following manner and surface treatment is carried out by coating an oxide. The etching treatment is carried out by dipping the glass substrate 49 having holes 25 formed therein into an aqueous hydrofluoric acid solution to chemically etch the inner walls of the through-holes. In this case, ultrasonic wave is applied so that the inner walls of the through-holes can be uniformly etched. The inner walls of the through-holes after etching have a large number of concavo-convexities having substantially a round or crater-like shape as shown in FIG. 22.

The surface treatment is carried out in the same way as in the embodiment 16 by using the Fe—Na coating solution prepared in the embodiment 16 to form the oxide film 96 on the surface of the holes 25. In this instance, the oxide film 96 reflects the shape of the concavo-convex surface formed by etching. An oxide film 97 is formed at this time on the two opposing wiring surfaces as the surfaces of the glass but its thickness is as small as 50 nm unlike the oxide film 96 formed on the surface of the holes 25.

The paste method is used to form a conductor into the through-holes. The conductive paste contains conductive fine particles of silver, low melting point glass powder and a solvent. To fill the conductive paste into the through-holes, the conductive paste is applied from the large diameter side of the through-holes.

Figure 22:
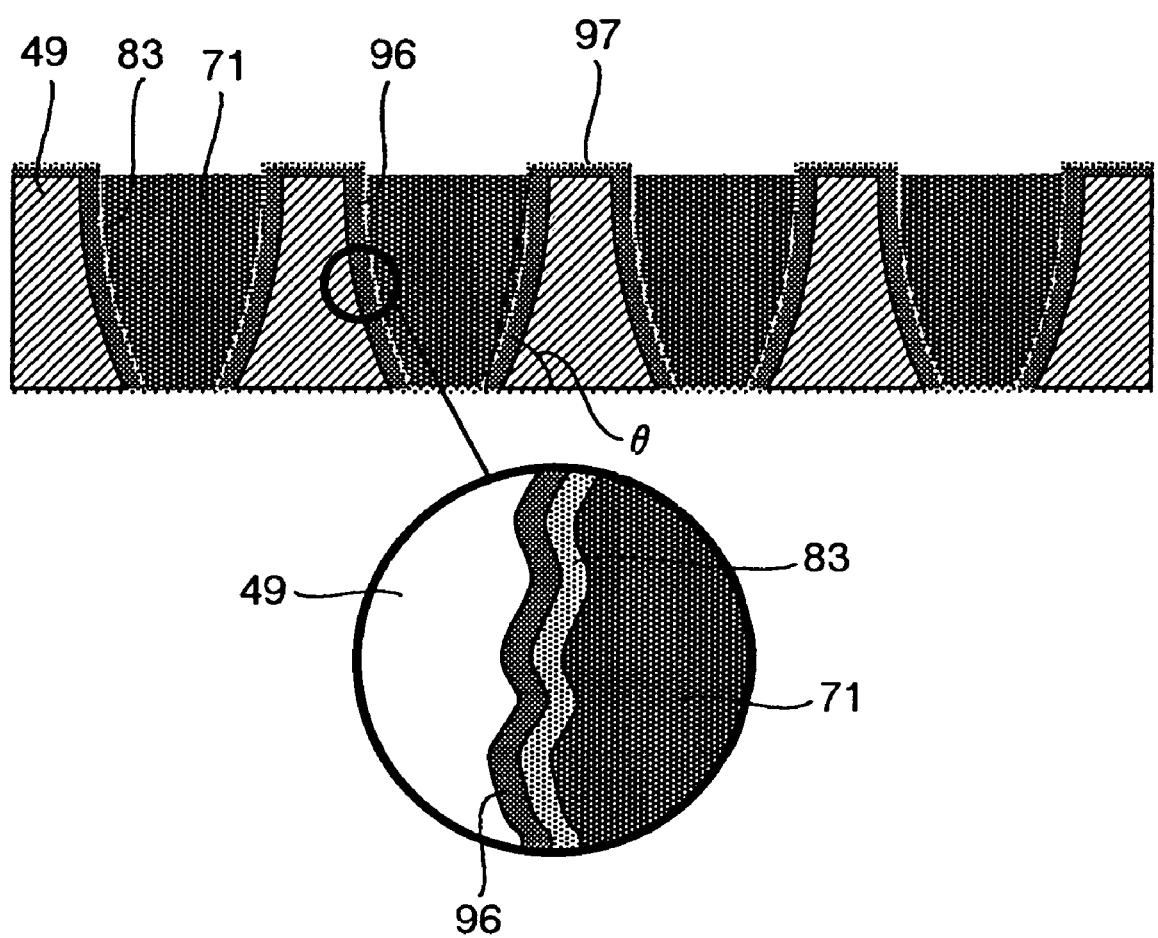
FIG. 22 is a schematic sectional view and a partial enlarged sectional view each showing an example of a structure of a substrate filled with paste after etching in an embodiment of the invention.

After filling, the conductor is baked at a temperature within the range of 500 to 600° C. less than the deformation temperature of the glass substrates to form a layer of the low melting point glass 83 and via-hole electrodes 71 on the concave-convex surface of the oxide film 96 as shown in FIG. 22. Incidentally, the conductive paste contains the conductive fine particles, low melting point glass powder and the solvent, but a sol-mixed paste prepared by mixing the paste with the sol solution of the coating solution used for the surface treatment of the glass substrate can be used, too.

The formation of the wirings can be carried out in the same way as in the foregoing embodiment.

The surface treatment is applied to the glass substrates subjected to the chemical etching and there are obtained semiconductor connection glass substrates the strength of which is further improved and in which the wirings having high adhesion are formed inside the through-holes and on the surface of the substrates.

Next, an embodiment 22 of the invention will be explained.

An example in which wirings for electrically connecting a plurality of high density terminals arranged on one of the surfaces of the glass substrates described above with intervals corresponding to the wiring density of the semiconductor chip and the inner walls of the through-holes is formed by use of a sol-mixed paste prepare by mixing the conductive paste with a sol as a coating solution will be explained.

The through-holes are formed by sand blast in the same way as in the embodiment 20. Next, after each of the substrates is etched in the following manner, the surface treatment is carried out by coating an oxide.

Figure 23:
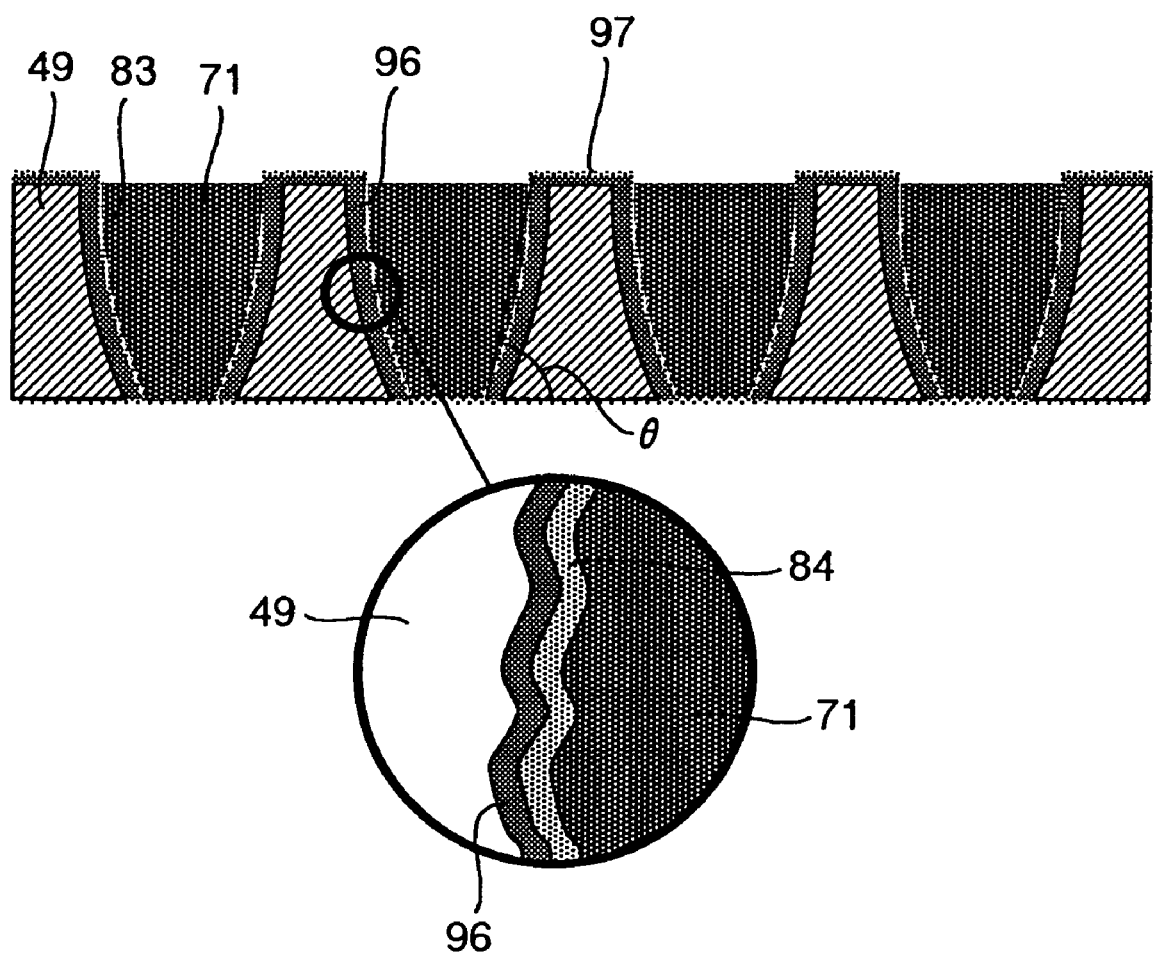
FIG. 23 is a schematic sectional view and a partial enlarged sectional view each showing an example of a structure of a substrate filled with sol-mixed paste in an embodiment of the invention.

To form the conductor inside the through-holes, a sol-mixed paste prepared by mixing the conductive paste with the Zr—Na coating solution prepared in the embodiment 16 is used. Filling of the conductive paste into the through-holes is made by applying the conductive paste from the large diameter side of the through-holes. After filling, the conductor is baked at a temperature within the range of 500 to 600° C. less than the deformation temperature of the glass substrates to form a sol-mixed glass layer 84 containing the sol and via-hole electrodes 71 on the concavo-convex surface of the oxide film 96 as shown in FIG. 23.

The wirings can be formed in the same way as in the foregoing embodiment.

The surface treatment is applied to the through-holes processed as described above and the wirings having high adhesion can be formed inside the through-holes and on the surface of the substrates the strength of which is improved. The sol-mixed glass layer 84 inside the holes that is formed between the glass substrate 49 and the via-hole electrode 71 is crystallized. As a result, the overall strength of the glass substrate is improved due to the occurrence of the compressive stress.

Next, an embodiment 23 of the invention will be explained.

Figure 24:
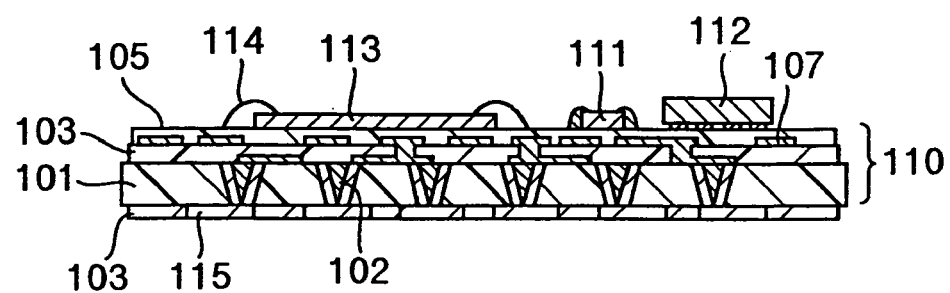
FIG. 24(a) shows a structure of an electronic circuit component (semiconductor module) as an example of the invention and is a sectional view taken along a line E-E in (b), (b) is a perspective view of the electronic circuit component and (c) is a sectional view of an integrated passive element.
Figure 24:
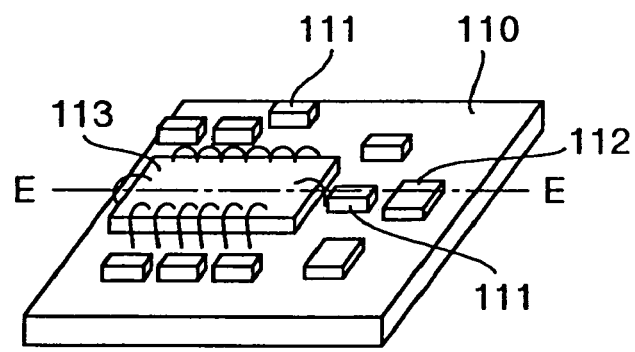
Figure 24:
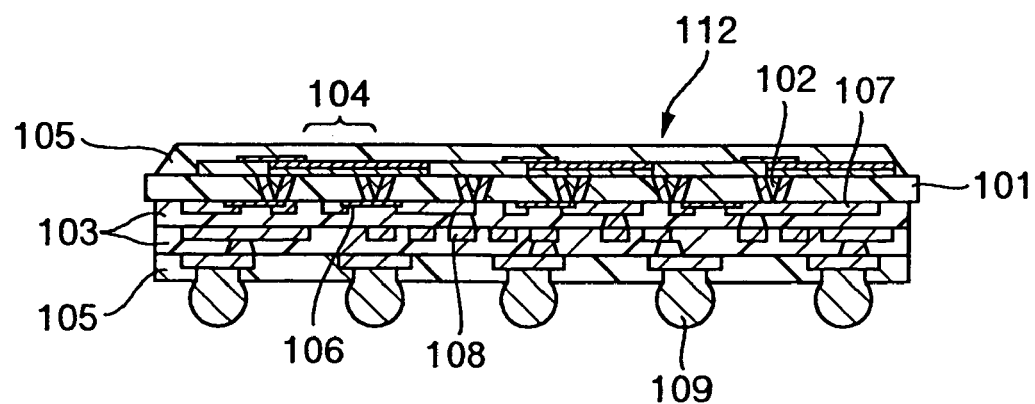

FIG. 24(a) shows a structure of an electronic circuit component (semiconductor module) as an example of the invention and is a sectional view taken along a line E-E of FIG. 24(b). FIG. 24(b) is a perspective view of the electronic circuit component. FIG. 24(c) is a sectional view of an integrated passive element. The electronic circuit component is fabricated by the following method.

First, an integrated passive element 112 that is to be mounted to a mounting substrate (wiring glass substrate) 110 shown in FIG. 24(a) and is shown in the sectional view of FIG. 24(c) is fabricated by the following method.

A sand blast film resist, "Ordyl" (product of Tokyo Oka K. K.) having a thickness of 100 μm is laminated on a 0.5 mm-thick alkali-free glass substrate "10A-10" (product of Nippon Electric Glass Co., Ltd.) and an etching resist is formed through exposure and development steps.

Next, through-holes are formed in the glass substrate 101 by a micro-sand blast method. After the resist film is peeled, seed films for electroplating of Cr: 50 nm and Cu: 500 nm are formed by puttering on the surface of the glass substrate 101 and on the inner wall of the via portions. After a plating resist film "HN920" (product of Hitachi Chemical Co., Ltd.) is laminated on this Cu film, exposure and development are carried out to form the plating resist mask and a conductor layer 102 is formed by Cu electroplating inside the via portions. Next, the resist is peeled and the electroplating seed film is peeled.

A plurality of capacitor elements 104 to be built in is formed by the following method on the glass substrate 101 (wiring glass substrates) on which the conductor layer 102 is formed.

A Cr film is formed to a thickness of 50 nm by sputtering on the glass substrate 101 and a Cu film is further formed to a thickness of 500 nm as a copper plating feed seed film. A negative type liquid resist "PMER-N-CA1000" (product of Tokyo Oka K. K.) is spin-coated onto this Cu film and is pre-baked on a hot plate to give a resist mask through exposure and development steps. Electroplating of copper is carried out to a thickness of 10 μm to the resist opening at a current density of 1 A/dm.

The resist mask is then peeled and the copper seed film is removed by use of a copper etching solution "Cobra Etch" (product of Ebara Densan K. K.). Furthermore, the Cr seed film is etched away by using a permanganate type Cr etching solution to form a lower electrode.

Next, a Cr film is formed as a barrier film by sputtering to a thickness of 50 nm.

A $Ta_2O_5$ film is formed by sputtering to a thickness of 500 nm on the lower electrode. A positive type liquid resist "OFPR 800,500 cp" (product of Tokyo Oka K.K.) is applied onto this $Ta_2O_5$ and a resist mask of a dielectric is formed through drying, exposure and development steps. Dry etching is then conducted with $CF_4$ to etch away unnecessary portions. The resist mask is removed and the barrier layer of the unnecessary portions is etched away with the permanganate type Cr etching solution to form a dielectric.

After a photosensitive polyimide, "HD6000", (product of Hitachi Chemical Co., Ltd.) is spin coated and is pre-baked on a hot plate, a dielectric layer on the lower electrode is exposed through exposure and development steps. In this case, polyimide is opened so that the open end portion is positioned by 20 μm inward from the end portion of the lower electrode.

The polyimide is not opened on a part of the lower electrode so as to use the polyimide as a dielectric. This polyimide is cured at 250° C. for 2 hours in a nitrogen atmosphere to form an organic insulating material 103 having a thickness of 10 μm.

Next, Cr is sputtered to a thickness of 50 nm on the organic insulating material 103 and on the dielectric layer exposed from the open portion and Cu is further formed to a film thickness of 500 nm. The resulting film is used as a seed film. A negative type liquid resist "PMER-N-CA1000" (product of Tokyo Oka K. K.) is spin-coated onto this Cu film and is pre-baked on a hot plate to give a resist mask through exposure and development steps. Electroplating of copper is carried out to a thickness of 10 μm to the resist opening at a current density of 1 A/dm.

The resist mask is then peeled and the copper seed film is removed by use of the copper etching solution "Cobra Etch" (product of Ebara Densan K. K.). Furthermore, the Cr seed film is etched away by using a permanganate type Cr etching solution to form an upper electrode and to fabricate a capacitor element 104.

Next, after a photosensitive polyimide, "HD6000", (product of Hitachi Kasei K. K.) is spin coated and is pre-baked, scribe lines, etc, are formed through exposure and development steps. Curing is then made at 250° C. for 1 hour to form a surface protective layer 105.

To form resistor elements 106 on the surface opposite to the surface on which the capacitors are formed, a TaN film is formed by sputtering to a thickness of 500 nm. A positive type liquid resist "OFPR 800,100 cp" (product of Tokyo Oka K.K.) is applied and a resist pattern mask is formed through exposure and development steps. The TaN film is dry etched by using this mask and $CF_4$. The resist is then peeled to provide a plurality of resistor elements 106.

An electroplating seed film of Cr: 50 nm and Cu: 500 nm is formed on the surface on which the resistor elements 106 are formed. The negative type liquid resist "PMER-N-CA1000" (product of Tokyo Oka K. K.) is spin coated onto this Cu film and is pre-baked on a hot plate to give a plating resist mask through exposure and development steps. Electroplating of copper is carried out to a thickness of 10 μm to give a plating film. Finally, the resist is peeled and the electroplating seed film is then peeled to form metal wirings 107 connected to the through-holes and to the resistor elements 106.

After the photosensitive polyimide, "HD6000", (product of Hitachi Chemical Co., Ltd.) is spin coated and is pre-baked on a hot plate, open portions for inter-layer connection are formed through exposure and development steps. Curing is then carried out at 250° C. for 1 hour to form an organic insulating material 103.

To form inductor elements and wirings on the surface of this organic insulating material 103, an electroplating seed film of Cr: 50 nm and Cu: 500 nm is formed. The negative type liquid resist "PMER-N-CA1000" (product of Tokyo Oka K. K.) is spin coated onto this Cu film and is pre-baked and a plating resist mask is formed through exposure and development steps. Electroplating of copper is carried out to a thickness of 10 μm to give a plating film. Finally, the resist is peeled and the electroplating seed film is then peeled to form a plurality of inductor elements 108 and wirings.

A photosensitive polyimide, "HD6000", (product of HDMS) is spin coated to the surface on which the inductor elements 108 are formed and is pre-baked. Open portions for inter-layer connection are formed through exposure and development steps and curing is then made at 250° C. for 1 hour to form an organic insulating material 103.

To form lands for metal terminals on the surface of this organic insulating material 103, an electroplating seed film of Cr: 50 nm and Cu: 500 nm is formed. The negative type liquid resist "PMER-N-CA1000" (product of Tokyo Oka K. K.) is spin coated onto this Cu film and is pre-baked and a plating resist mask is formed through exposure and development steps. After electroplating of copper is carried out to a form a plating film having a thickness of 10 μm, a 2 μm-thick electroplating nickel film is further formed as a barrier layer. Finally, the resist is peeled and the electroplating seed film is then peeled to form metal wirings 107 and metal terminal lands.

The photosensitive polyimide, "HD6000", (product of HDMS) is spin coated to the surface on which the metal terminal lands are formed, and is pre-baked. Open portions for forming external electrodes are formed through exposure and development steps and curing is then made at 250° C. for 1 hour to form a surface protective layer 105.

After electroless plating of gold is applied to the surface of the metal terminal lands, a solder flux is applied to predetermined portions through a metal mask. Lead-free solder balls having a diameter of 200 μm are arranged and are subjected to a re-flow process to form metal terminals 109.

Finally, dicing is made by use of a dicer to inside portions on both sides from 50 μm from scribe line portions to give discrete integrated passive elements 112.

Next, a glass mounting substrate (wiring glass substrate) 110 is produced by the following method.

A sand blast film resist, "Ordyl" (product of Tokyo Oka K. K.) having a thickness of 100 μm is laminated on a 0.5 mm-thick alkali-free glass substrate "10A-10" (product of Nippon Electric Glass Co., Ltd.) and an etching resist is formed through exposure and development steps. Next, through-holes are formed in the glass substrate 1 by a micro-sand blast method.

After the resist film is peeled, an electroplating seed film of Cr: 50 nm and Cu: 500 nm is formed by puttering on the surface of the glass substrate 101 and on the inner walls of via-portions. After a plating resist film "HN920" (product of Hitachi Chemical Co., Ltd.) is laminated on this Cu film, exposure and development are carried out to form the plating resist mask and a conductor layer 102 and a wiring pattern are formed by Cu electroplating inside the via-portions. The resist is then peeled and the electroplating seed film is peeled.

Next, benzocyclobutene varnish, "Cyclotene 4026" (product of Dow Co.) is spin coated as an organic insulating material on this wiring pattern and open portions for inter-layer connection are formed through a photolithographic step. Heat curing is carried out at 250° C. for 60 minutes in nitrogen to form the organic insulating material 103.

A Cr film is formed by sputtering to a thickness of 50 nm and then a Cu film, to a thickness of 500 nm on the organic insulating material to give a seed film. A negative type liquid resist "PMER-N-CA1000" (product of Tokyo Oka K. K.) is spin coated onto this Cu film and is pre-baked on a hot plate to give a plating resist mask through exposure and development steps. Electroplating of copper is carried out to a thickness of 10 μm at a current density of 1 A/dm.

The resist mask is then peeled and the copper seed film is removed by use of a copper etching solution "Cobra Etch" (product of Ebara Densan K. K.). Furthermore, the Cr seed film is etched away by using a permanganate type Cr etching solution to form wires and electrodes 115.

Benzocyclobutene varnish is formed on the wirings and the electrodes 115 by the same method as that of the organic insulating material 103 to form a surface protective layer 105 from which the electrodes 115 are exposed.

A Cr film is formed by sputtering to a thickness of 50 nm and then a Cu film, to a thickness of 500 nm on the back of this substrate to give a seed film. A negative type liquid resist "PMER-N-CA1000" (product of Tokyo Oka K. K.) is spin coated onto this Cu film and is pre-baked on a hot plate to give a resist mask through exposure and development steps. Electroplating of copper is applied to a thickness of 10 μm to the resist open portions at a current density of 1 A/dm.

The resist mask is then peeled and the copper seed film is removed by use of the copper etching solution "Cobra Etch" (product of Ebara Densan K. K.). Furthermore, the Cr seed film is etched away by using the permanganate type Cr etching solution to form wirings and electrodes 115.

Benzocyclobutene varnish is formed on the wirings and the electrodes 115 by the same method as that of the organic insulating material 103 to form a surface protective layer 105 from which the electrodes 115 are exposed. There is obtained a mounting substrate 110 in which the wirings and the electrodes 115 are formed on both surfaces of the glass substrate 101.

To mount passive elements of chip components 111 and integrated passive elements 112 onto this mounting substrate 110, a solder paste is applied to the wiring portions to be mounted through a metal mask. After the chip components 111 and the integrated passive elements 112 are mounted, $N_2$ reflow processing is conducted to mount these components onto the glass mounting substrate 110.

Next, after the active component 113 is bonded to predetermined portion of the mounting substrate 110 by use of a bonding material, wire bonding is conducted by using a gold wire 114 to establish electric connection with the mounting substrate 110.

The electronic circuit component of the invention is produced by the method described above. The invention can reduce the mounting area of the electronic circuit component by about 40% in comparison with the case where the integrated passive elements are not used.

Next, an embodiment 24 of the invention will be explained.

Figure 25:
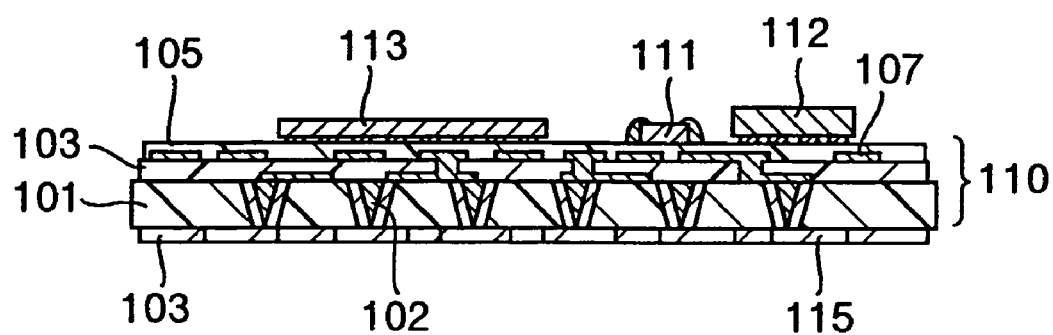
FIG. 25(a) shows a structure of an electronic circuit component (semiconductor module) as an example of the invention and is a sectional view taken along a line F-F in (b), (b) is a perspective view of the electronic circuit component.
Figure 25:
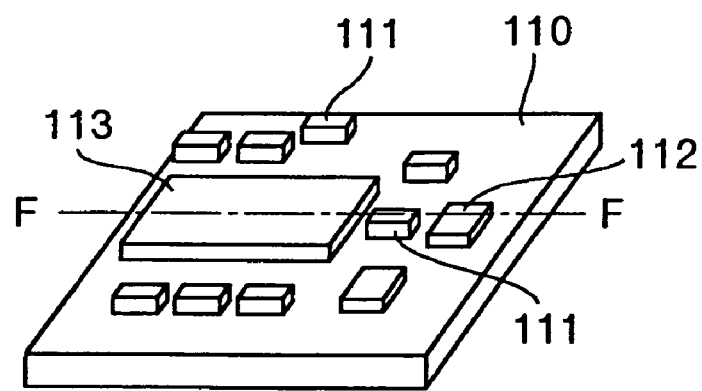

FIG. 25(*a*) shows a structure of an electronic circuit component (semiconductor module) as an example of the invention and is a sectional view taken along a line F-F of FIG. 25(*b*). FIG. 25(*b*) is a perspective view of the electronic circuit component. The electronic circuit component (semiconductor module) is fabricated by the following method.

First, an integrated passive device 112 that is to be mounted to a mounting substrate (wiring glass substrate) 110 is fabricated by the following method. Next, the glass mounting substrate 110 is fabricated in the same way as in the embodiment 19.

To mount the passive elements of the chip component 111 and the integrated passive element 112 on this glass mounting substrate 110, a solder paste is applied to wiring portions for mounting by use of a metal mask. After the chip component 111 and the integrated passive element 112 are mounted, the $N_2$ reflow processing is conducted to mount these components onto the glass mounting substrate 110.

Gold bumps are then formed at the electrode portions of the active component 113 and are electrically connected to predetermined portions of the mounting substrate 110 through gold/gold bonding.

The electronic circuit component of the invention is produced by the method described above. The invention can reduce the mounting area of the electronic circuit component by about 50% in comparison with the case where the integrated passive elements are not used.

Next, an embodiment 25 of the invention will be explained.

Figure 26:
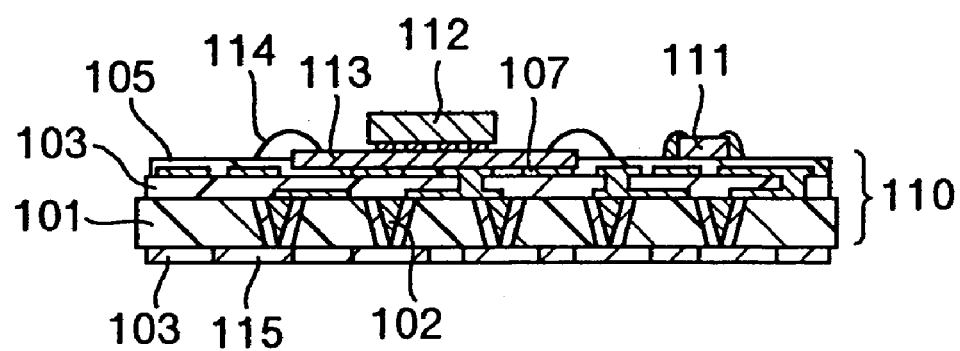
FIG. 26(a) shows a structure of an electronic circuit component (semiconductor module) as an example of the invention and is a sectional view taken along a line G-G in (b), and (b) is a perspective view of the electronic circuit component.
Figure 26:
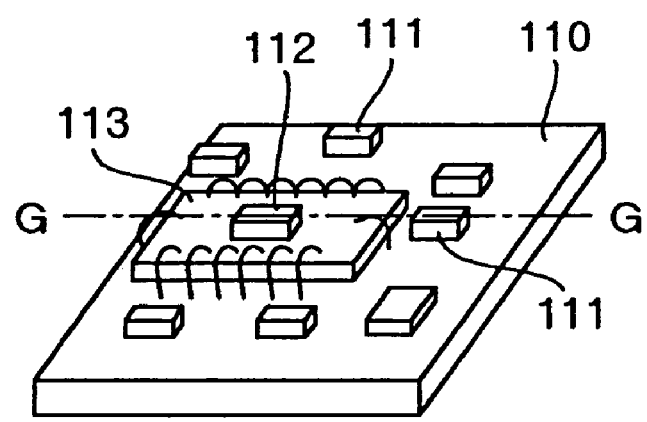

FIG. 26(*a*) shows a structure of an electronic circuit component (semiconductor module) as an example of the invention and is a sectional view taken along a line G-G of FIG. 26(*b*). FIG. 26(*b*) is a perspective view of the electronic circuit component. The electronic circuit component (semiconductor module) is fabricated by the following method.

First, an integrated passive elements 112 that are to be mounted to a mounting substrate 110 is fabricated in the same way as in the embodiment 23.

The glass mounting substrate 110 is fabricated in the same way as in the embodiment 19. To mount the passive elements of the chip component 111 onto this glass mounting substrate 110, a paste is applied to wiring portions for mounting by use of a metal mask. After the chip component 11 is mounted, the $N_2$ reflow processing is conducted to mount these components onto the glass mounting substrate 110.

The active component 113 is bonded to a predetermined portion of the mounting substrate 110 with a die bonding material and wire bonding is conducted by use of a gold wire 114 to establish electric connection with the mounting substrate 110.

After a flux is applied to the metal terminal portions of the integrated passive element 112, the integrated passive element 112 is mounted to a predetermined portion of the active component 113. The $N_2$ reflow processing is conducted and the active component 113 and the integrated passive element 112 are electrically connected.

The electronic circuit component of the invention is produced by the method described above. The invention can reduce the mounting area of the electronic circuit component by about 70% in comparison with the case where the integrated passive elements 112 are not used.

Next, an embodiment 26 of the invention will be explained.

Figure 27:
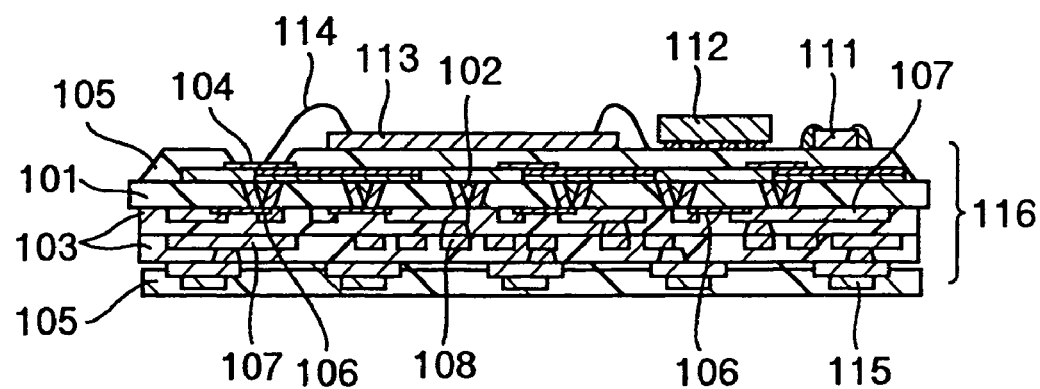
FIG. 27(a) shows a structure of an electronic circuit component (semiconductor module) as an example of the invention and is a sectional view taken along a line H-H in (b), (b) is a perspective view of the electronic circuit component and (c) is a sectional view of an integrated passive element.
Figure 27:
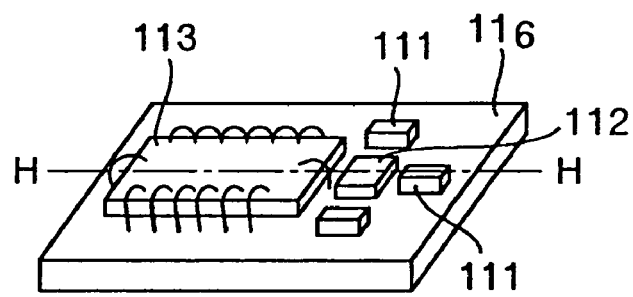
Figure 27:
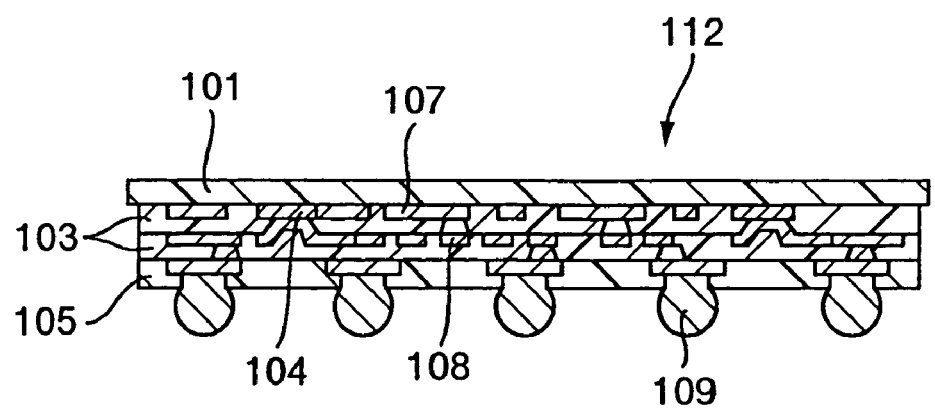

FIG. 27(*a*) shows a structure of an electronic circuit component (semiconductor module) as an example of the invention and is a sectional view taken along a line H-H of FIG. 27(*b*). FIG. 27(*b*) is a perspective view of the electronic circuit component. FIG. 27(*c*) is a sectional view of an integrated passive element. The electronic circuit component (semiconductor module) is fabricated by the following method.

First, an integrated passive element 112 that is shown in the sectional view of FIG. 27(*c*) and is to be mounted to the mounting substrate 110 shown in FIG. 27(*a*) is fabricated by the following method.

An electroplating seed film of Cr: 50 nm and Cu: 500 nm is formed by sputtering on the surface of a 0.5 mm-thick alkali-free glass substrate "10A-10" (product of Nippon Electric Glass Co., Ltd.) and on the via inner wall. After a resist film for plating, "HN920" (product of Hitachi Chemical Co., Ltd.), is laminated on this Cu film, exposure and development are carried out to form a plating resist mask and a conductor layer 102 is formed by Cu electroplating inside the via-portions. Next, the resist is peeled and the electroplating seed film is peeled.

A plurality of capacitor elements 104 to be built in is formed by the following method on the glass substrate 101 (wiring glass substrate) on which the conductor layer 102 is formed.

A Cr film is formed to a thickness of 50 nm by sputtering on the glass substrate 101 and a Cu film is further formed to a thickness of 500 nm as a copper plating feed seed film. A negative type liquid resist "PMER-N-CA1000" (product of Tokyo Oka K. K.) is spin coated onto this Cu film and is pre-baked on a hot plate to give a resist mask through exposure and development steps. Electroplating of copper is carried out to a thickness of 10 μm to the resist opening at a current density of 1 A/dm.

The resist mask is then peeled and the copper seed film is removed by use of a copper etching solution "Cobra Etch" (product of Ebara Densan K. K.). Furthermore, the Cr seed film is etched away by using a permanganate type Cr etching solution to form a lower electrode 115.

Next, a Cr film is formed as a barrier film by sputtering to a thickness of 50 nm.

A $Ta_2O_5$ film is formed by sputtering to a thickness of 500 nm on the lower electrodes. A positive type liquid resist "OFPR 800,500 cp" (product of Tokyo Oka K.K.) is applied onto this $Ta_2O_5$ and a resist mask of a dielectric is formed through drying, exposure and development steps. Dry etching is then conducted with $CF_4$ to etch away unnecessary portions. The resist mask is removed and the barrier layer of the unnecessary portions is etched away with the permanganate type Cr etching solution to form a dielectric.

Next, a benzocyclobutene resin, "Cyclotene 4026" (product of Dow Chemical Co.), is spin coated and pre-baked, and open portions for inter-layer connection are formed through exposure and development step. In this case, the open portions are formed in such a manner that the open end portion is positioned more inward by 20 μm than the end portion of each of the lower electrodes. The open portions are not formed on a part of the lower electrodes so as to use benzocyclobutene as a dielectric. Next, curing is conducted at 250° C. for 1 hour in a nitrogen atmosphere to form a 10 µm-thick organic insulating material 103.

Next, Cr is sputtered to a thickness of 50 nm on the organic insulating material 103 and on the dielectric layer exposed from the open portions and Cu is further formed to a film thickness of 500 nm. The resulting film is used as a seed film. A negative type liquid resist "PMER-N-CA1000" (product of Tokyo Oka K. K.) is spin coated onto this Cu film and is pre-baked on a hot plate to give a resist mask through exposure and development steps. Electroplating of copper is carried out to a thickness of 10 µm to the resist opening at a current density of 1 A/dm.

The resist mask is then peeled and the copper seed film is removed by use of a copper etching solution "Cobra Etch" (product of Ebara Densan K. K.). Furthermore, the Cr seed film is etched away by using a permanganate type Cr etching solution to form upper electrodes and to fabricate a plurality of capacitor elements 104. In this case, when the lower electrodes are formed, wires for wiring are formed and when the organic insulating material 103 is formed, open portions for inter-layer connection are formed. Furthermore, when the upper electrodes are formed, wires for wiring and a plurality of spiral inductors are formed simultaneously.

A benzocyclobutene resin, "Cyclotene 4026" (product of Dow Chemical Co.), is spin coated on the surface on which the upper electrodes and the spiral inductors are formed, and is pre-baked, and open portions for inter-layer connection are formed through exposure and development step. Curing is then conducted at 250° C. for 1 hour in a nitrogen atmosphere to form a 10 µm-thick organic insulating material 103.

To form lands for metal terminals on this organic insulating material 103, an electroplating seed film of Cr: 50 nm and Cu: 500 nm is formed. A negative type liquid resist "PMER-N-CA1000" (product of Tokyo Oka K. K.) is spin coated onto this Cu film and is pre-baked and a plating resist mask is formed through exposure and development steps. Electroplating of copper is carried out to a thickness of 10 µm to give a plating film, and a 2 µm-thick electroplating film of nickel is further formed as a barrier layer. Finally, the resist is peeled and the electroplating seed film is then peeled to form wirings and metal terminal lands.

A benzocyclobutene resin, "Cyclotene 4026" (product of Dow Chemical Co.), is spin coated as a surface protective layer 105 on the surface on which the wirings and the metal terminal lands are formed, and is pre-baked, and open portions for inter-layer connection are formed through exposure and development steps. Curing is then conducted at 250° C. for 1 hour in a nitrogen atmosphere to form the 10 µm-thick surface protective layer 105.

After electroless plating of gold is applied to the surface of the metal terminal lands, a solder flux is applied to predetermined portions through a metal mask. Lead-free solder balls having a diameter of 200 µm are arranged and reflow treatment is carried out to form metal terminals 109.

Finally, portions at 50 µm inward from both sides of scribe lines are diced with a dicer to give discrete integrated passive elements 112.

A substrate 116 with built-in integrated passive elements that includes capacitor elements 104, inductor elements 108, resistor elements 106, and so forth, and is used as a mounting substrate 110 is fabricated by the following method.

A 100 µm-thick sand blast film resist material, "Ordyl" (product of Tokyo Oka K. K.), is laminated on the surface of a 0.5 mm-thick alkali-free glass substrate "10A-10" (product of Nippon Electric Glass Co., Ltd.) to form an etching resist through exposure and development steps.

Through-holes are formed in the glass substrate 101 by the micro-sand blast method. After the resist film is peeled, an electroplating seed film of Cr: 50 nm and Cu: 500 nm is formed by sputtering on the surface of the glass substrate and the via-inner walls. After a resist film for plating "HN920" (product of Hitachi Chemical Co., Ltd.) is laminated on this Cu film, exposure and development are carried out to form a plating resist mask and a conductor layer 102 is formed by Cu electroplating inside the via-portions. Next, the resist is peeled and the electroplating seed film is peeled.

A plurality of capacitor elements 104 to be built in is formed by the following method on the glass substrate 101 on which the conductor layer 102 is formed.

A Cr film is formed to a thickness of 50 nm by sputtering on the glass substrate 101 and a Cu film is further formed to a thickness of 500 nm as a copper plating feed seed film. A negative type liquid resist "PMER-N-CA1000" (product of Tokyo Oka K. K.) is spin coated onto this Cu film and is pre-baked on a hot plate to give a resist mask through exposure and development steps. Electroplating of copper is carried out to a thickness of 10 µm to the resist opening at a current density of 1 A/dm.

The resist mask is then peeled and the copper seed film is removed by use of a copper etching solution "Cobra Etch" (product of Ebara Densan K. K.). Furthermore, the Cr seed film is etched away by using a permanganate type Cr etching solution to form lower electrodes 115.

Next, a Cr film is formed as a barrier film by sputtering to a thickness of 50 nm.

A $Ta_2O_5$ film is formed by sputtering to a thickness of 500 nm on the lower electrodes. A positive type liquid resist "OFPR 800,500 cp" (product of Tokyo Oka K.K.) is applied onto this $Ta_2O_5$ and a resist mask of a dielectric is formed through drying, exposure and development steps. Dry etching is then conducted with $CF_4$ to etch away unnecessary portions. The resist mask is removed and the barrier layer of the unnecessary portions is etched away with the permanganate type Cr etching solution to form a dielectric.

Next, a photosensitive polyimide, "HD6000 (product of Hitachi Chemical Co., Ltd.), is spin coated and is pre-baked to expose the dielectric layer on the lower electrodes through exposure and development steps. In this case, the open portions are formed in such a manner that the open end portion of polyimide is positioned more inward by 20 µm than the end portions of the lower electrodes. The open portions are not formed on a part of the lower electrodes so as to use polyimide as the dielectric. Next, this polyimide is cured at 250° C. for 2 hours in a nitrogen atmosphere to form a 10 µm-thick organic insulating material 103.

Next, Cr is sputtered to a thickness of 50 nm on the organic insulating material 103 and on the dielectric layer exposed from the open portions and Cu is further formed to a film thickness of 500 nm. The resulting film is used as a seed film. A negative type liquid resist "PMER-N-CA1000" (product of Tokyo Ouka K. K.) is spin coated onto this Cu film and is pre-baked on a hot plate to give a resist mask through exposure and development steps.

Electroplating of copper is carried out to a thickness of 10 µm to the resist openings at a current density of 1 A/dm. The resist mask is then peeled and the copper seed film is removed by use of a copper etching solution "Cobra Etch" (product of Ebara Densan K. K.). Furthermore, the Cr seed film is etched away by using a permanganate type Cr etching solution to form upper electrodes and to fabricate capacitor elements 104. In this case, when the upper electrodes are formed, wirings and electrodes for external connection are formed simultaneously.

Next, a photosensitive polyimide, "HD6000 (product of Hitachi Chemical Co., Ltd.), is spin coated and is pre-baked to form scribe lines and electrode openings through exposure and development steps. This polyimide is then cured at 250° C. for 1 hour to form a surface protective layer 105.

To form resistor elements 106 on the surface opposite to the surface on which the capacitors and the external terminals are formed, a TaN film is formed to a thickness of 500 nm by sputtering. A positive type liquid resist, "OFPR 800,100 cp", is spin coated to this TaN film and is pre-baked to form a resist pattern mask through exposure and development steps. The TaN film is dry etched with $CF_4$ by using this mask. Next, the resist is peeled and a plurality of resistor elements 106 is formed.

A seed film for electroplating of Cr: 50 nm and Cu: 500 nm is formed on the surface on which the resistance elements 106 are formed. A negative type liquid resist "PMER-N-CA1000" (product of Tokyo Oka K. K.) is spin coated onto this Cu film and is pre-baked on a hot plate to give a resist mask through exposure and development steps A plating film of 10 μm is then formed by electroplating of copper. Finally, the resist is peeled and the electroplating seed film is then peeled to form metal wirings 107 connected to the through-holes and to the resistor elements 106.

A photosensitive polyimide, "HD6000 (product of HDS Co.) is spin coated and is pre-baked to form openings for inter-layer connection through exposure and development steps. Next, this polyimide is cured at 250° C. for 1 hours to form an organic insulating material 103.

To form inductor elements 108 and wirings on this organic insulating material 103, an electroplating seed film of Cr: 50 nm and Cu: 500 nm is formed. A negative type liquid resist "PMER-N-CA1000" (product of Tokyo Oka K. K.) is spin coated onto this Cu film and is pre-baked and a plating resist mask is formed through exposure and development steps. Electroplating of copper is carried out to a thickness of 10 μm to give a plating film. Finally, the resist film is peeled and the electroplating seed film is then peeled to form a plurality of inductance elements 108 and wires.

A photosensitive polyimide, "HD6000 (product of HDMS), is spin coated to the surface on which the inductance elements 108 are formed, and is pre-baked to form open portions for inter-layer connection through exposure and development steps. The polyimide is cured at 250° C. for 1 hour to give an organic insulating material 103.

To form lands for metal terminals on this organic insulating material 103, an electroplating seed film of Cr: 50 nm and Cu: 500 nm is formed. A negative type liquid resist "PMER-N-CA1000" (product of Tokyo Oka K. K.) is spin coated onto this Cu film and is pre-baked and a plating resist mask is formed through exposure and development steps. Electroplating of copper is carried out to a thickness of 10 μm to give a plating film, and a 2 μm-thick electroplating film of nickel is further formed as a barrier layer. Finally, the resist is peeled and the electroplating seed film is then peeled to form metal wirings 107 and metal terminal lands.

Next, a photosensitive polyimide, "HD6000 (product of HDMS), is spin coated and is pre-baked to form open portions for forming external electrodes through exposure and development steps. Next, this polyimide is cured at 250° C. for 1 hours to form a surface protective layer 105.

Electroless plating of gold is then applied to the external electrodes formed on both sides.

Finally, portions at 50 μm inward from both sides of scribe lines are diced with a dicer to give discrete substrates 116 with built-in integrated passive elements.

To mount the integrated passive elements 112 of the chip component 111 fabricated by the method described above onto the substrate 116 with built-in integrated passive elements, a solder paste is applied to wiring portions for mounting by using a metal mask. After the chip component 111 and the integrated passive elements 112 are mounted, $N_2$ reflow processing is carried out to mount these components onto the substrate 116 with built-in integrated passive elements.

Next, after the active component 113 is bonded to a predetermined portion of the mounting substrate 110 with a die bonding material, wire bonding is carried out by using a gold wire 114 to establish electric connection with the mounting substrate 110.

The electronic circuit component of the invention is produced by the method described above. According to the invention, the mounting area of the electronic circuit components can be reduced by 60% in comparison with the case where the integrated passive elements 112 and the substrate 116 with built-in integrated passive elements are not used.

Next, an embodiment 27 of the invention will be explained.

Figure 28:
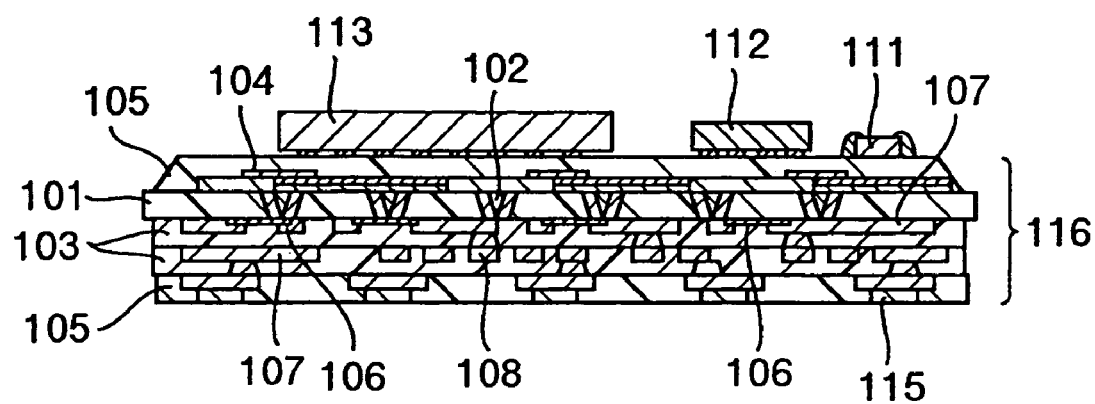
FIG. 28(a) shows a structure of an electronic circuit component (semiconductor module) as an example of the invention and is a sectional view taken along a line I-I in (b), and (b) is a perspective view of the electronic circuit component.
Figure 28:
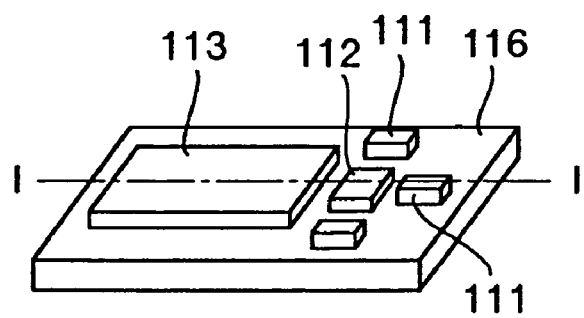

FIG. 28(*a*) shows a structure of an electronic circuit component (semiconductor module) as an example of the invention and is a sectional view taken along a line I-I of FIG. 28(*b*). FIG. 28(*b*) is a perspective view of the electronic circuit component. The electronic circuit component (semiconductor module) is fabricated by the following method.

First, integrated passive elements 112 to be mounted to a mounting substrate and a substrate 116 with built-in passive elements are formed in the same way as in the embodiment 26.

To mount passive elements of the chip component 111 and the integrated passive element 112 fabricated by the method described above to the substrate 116 with built-in integrated passive elements, a solder paste is applied to wiring portions for mounting. After the chip component 111 and the integrated passive elements 112 are mounted, $N_2$ reflow processing is carried out to mount these components onto the substrate 116 with built-in passive elements.

Next, Au bumps are formed to the electrode portions of an active component 113 and are electrically connected to predetermined portions of the mounting substrate 110 through gold/gold bonding.

The electronic circuit component of the invention is fabricated by the method described above. According to the invention, the mounting area of the electronic circuit components can be reduced by 70% in comparison with the case where the integrated passive elements 112 and the substrate 116 with built-in integrated passive elements are not used.

Next, an embodiment 28 of the invention will be explained.

Figure 29:
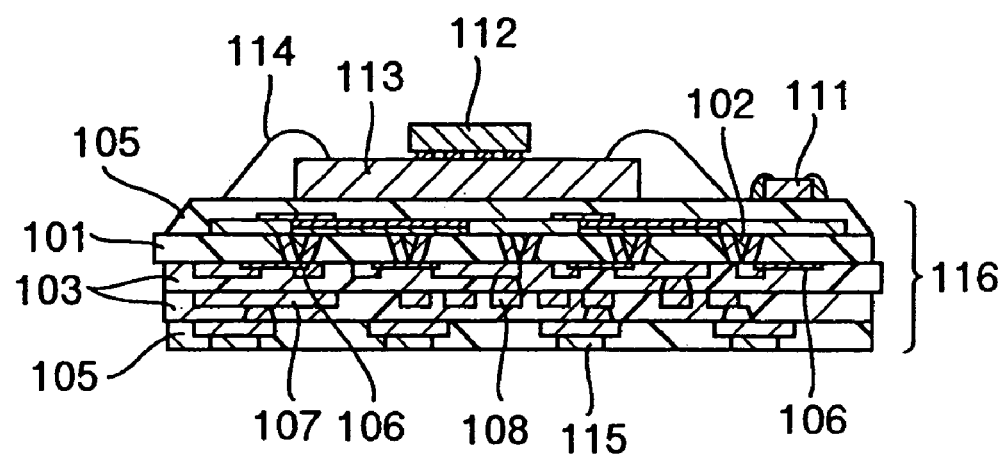
FIG. 29(a) shows a structure of an electronic circuit component (semiconductor module) as an example of the invention and is a sectional view taken along a line J-J in (b), and (b) is a perspective view of the electronic circuit component.
Figure 29:
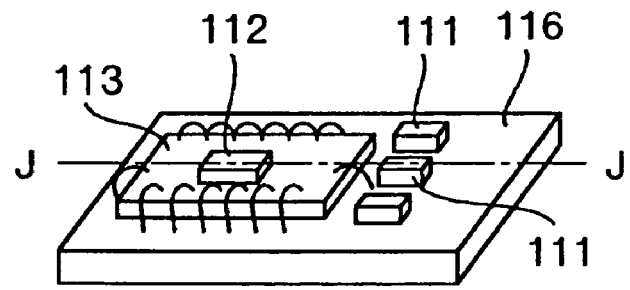

FIG. 29(*a*) shows a structure of an electronic circuit component (semiconductor module) as an example of the invention and is a sectional view taken along a line J-J of FIG. 29(*b*). FIG. 29(*b*) is a perspective view of the electronic circuit component. The electronic circuit component (semiconductor module) is fabricated by the following method.

First, integrated passive elements 112 and a substrate 116 with built-in passive elements are formed in the same way as in the embodiment 26.

To mount passive elements of a chip component 111 to the substrate 116 with built-in integrated passive elements, a solder paste is applied to wiring portions for mounting. After the chip component 111 is mounted, $N_2$ reflow processing is carried out to mount these components onto the substrate 116 with built-in passive elements.

After an active component 113 is bonded to a predetermined portion of the mounting substrate 110 with a die bonding material, wire bonding is carried out through gold wires 114 for electric connection with the mounting substrate 110.

A flux is applied to metal terminal portions of the integrated passive element 112, the element 112 is mounted to a predetermined portion of the active component 113. $N_2$ reflow processing is carried out to electrically connect the active component 113 to the integrated passive element 112.

The electronic circuit component of the invention is fabricated by the method described above. According to the invention, the mounting area of the electronic circuit components can be reduced by 85% in comparison with the case where the integrated passive element 112 and the substrate 116 with built-in integrated passive elements are not used.

Next, an embodiment 29 of the invention will be explained.

Figure 31:
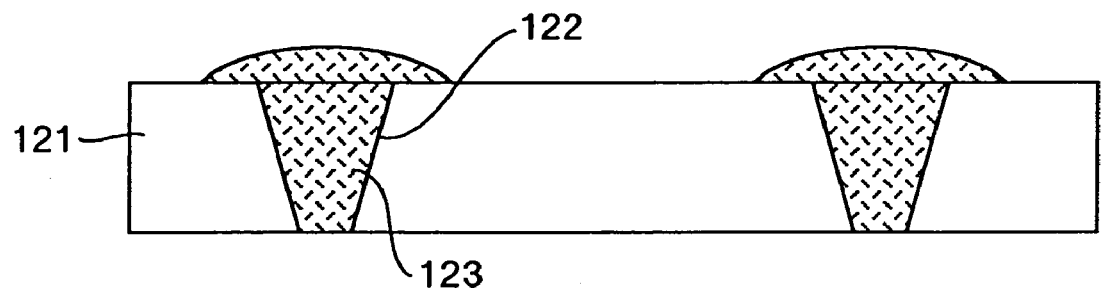
Figure 32:
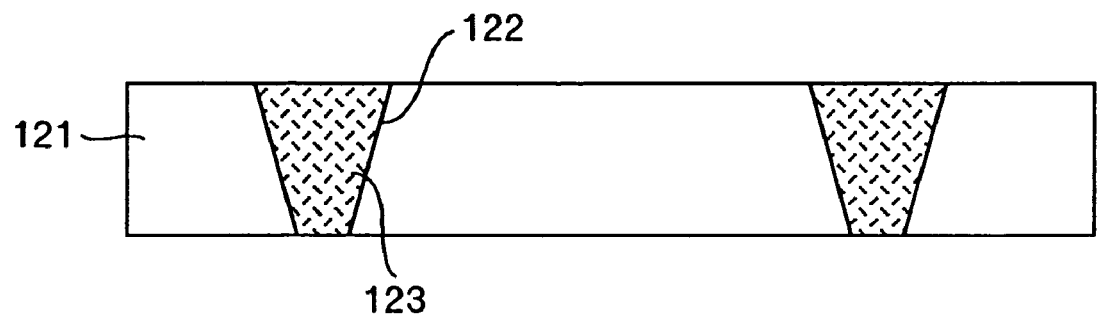
FIG. 32 is a sectional view showing a structure of a wiring substrate of a comparative example.

FIG. 31 shows a wiring substrate according to the embodiment 29. FIG. 32 shows a wiring substrate of a comparative example. Both wiring substrates 121 have a plurality of through-holes 122 and the through-holes 122 are filed with a conductor 123 to give via-electrodes. The wiring substrate 121 uses alkali-free glass. The through-holes 122 are formed by a sand blast process that blasts alumina powder at a high pressure and have a circular truncated cone shape. The diameter of the holes is 0.3 mm, the pitch is 0.5 mm and 2,500 holes are formed in the substrate having a size of 50×50×0.5 mm.

Figure 33:
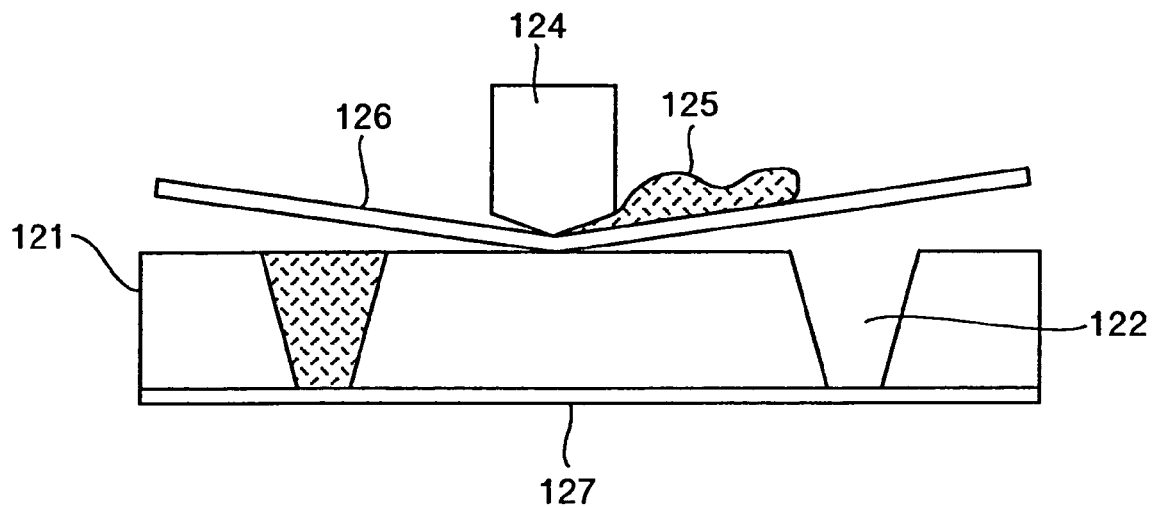
FIGS. 33 and 34 are sectional views each showing a method of filling a conductive paste according to the prior art.

Next, a method of filling the conductor will be explained. As to the comparative example shown in FIG. 32, filling is made by the steps of arranging a conductor paste 125 on a printing mask 126, moving the conductive paste 125 with a squeezer 124 and filling it into the through-holes 122, as shown in FIG. 33. Absorbing paper 127 is put on the back so as to absorb the excessive paste. Ag pastes containing Ag, $PbTiO_3$ crystal, $PbO$—$B_2O_3$ low melting type glass and a solvent and having mixing ratios shown in Table 13 are used for the conductive pastes.

Figure 34:
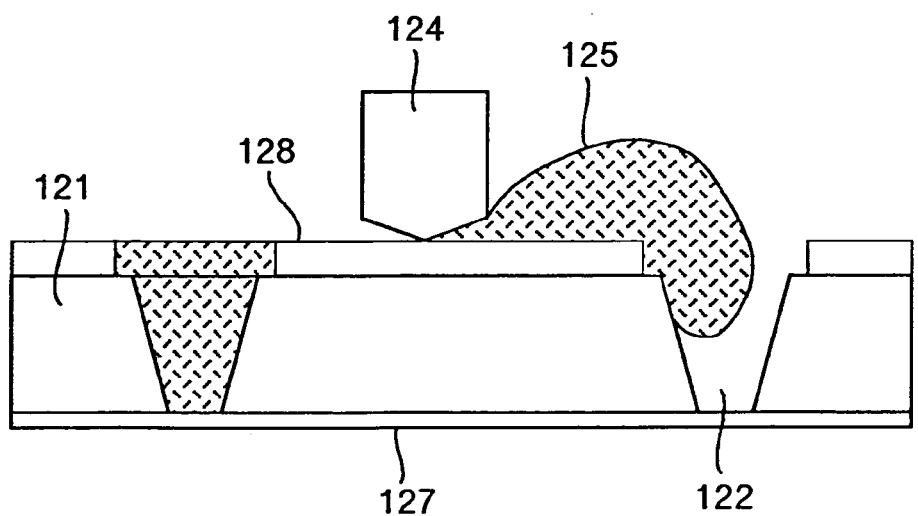

As to the embodiment 29 of the invention shown in FIG. 31, the paste similarly shown in Table 13 is used and the paste is filled by a coating method shown in FIG. 34. In other words, a coating mask 128 is formed on a wiring substrate 121 by using a resist film and the paste is filled in such a fashion as to swell out from the through-holes to such an extent as to correspond to the mask. After the film is peeled, the paste so filled is baked and held at 500° C. for 30 minutes to obtain via-electrodes having shapes shown in FIGS. 31 and 32.

TABLE 13

| No. | mixing ratio (weight ratio) | | | | viscosity |
| --- | --- | --- | --- | --- | --- |
| | Ag | crystal | glass | solvent | Pa · s |
| Ag1 | 1 | 0.8 | 0.2 | 0.1 | 470 |
| Ag2 | 1 | 1.0 | 0.2 | 0.1 | 500 |
| Ag3 | 1 | 1.2 | 0.2 | 0.1 | 530 |
| Ag4 | 1 | 1.4 | 0.2 | 0.1 | 600 |
| Ag5 | 1 | 1.6 | 0.2 | 0.1 | 710 |
| Ag6 | 1 | 1.8 | 0.2 | 0.1 | 820 |

The substrates filled with the conductor are subjected to a temperature cycle test of from −65° C. to 145° C. in 1,000 cycles and reliability is evaluated by counting the number of conductors that undergo peel of the conductor from the holes. Table 14 shows the evaluation result. In comparison with the shape of the comparative example shown in FIG. 32, the number of the occurrence of peel is not greater than 50% in the shape of the invention shown in FIG. 2 when any of the pastes of Ag1 to Ag3 is used. This fact represents that mutual connection reliability of the substrate conductors is improved by the increase of the contact area between the substrate and the conductor.

TABLE 14

| | filling method of prior art | | |
| --- | --- | --- | --- |
| No. | filling | shape of comparative example | shape 1 of invention |
| Ag1 | ○ | 14% | 5% |
| Ag2 | ○ | 10% | 3% |
| Ag3 | ○ | 8% | 2% |
| Ag4 | X | — | — |
| Ag5 | X | — | — |
| Ag6 | X | — | — |

The reason why the number of peel does not reach 0% is because thermal shrinkage of the Ag conductor is great. Even when an attempt is made to form a conductor by using the pastes Ag4 to Ag6 having greater crystal amounts and lower thermal shrinkage, the conductor cannot be filled because the viscosity becomes high. In other words, it has been found that only those pastes that have low viscosities can be filled by use of the printing method that has ordinarily been used in the past as represented in this embodiment.

In the embodiment 29 described above, the wiring substrate 121 may use a different kind of a ceramic substrate. The shape of the holes may be of a straight type or a tapered type and the effect of the invention remains unchanged.

Metals and alloys such as Pt, Au, Cu, Al, Cr and a solder material may be used for the conductor. A different kind of crystals such as $SiO_2$ crystals may be used for the crystal added to the conductive paste. Alternatively, the crystal may not be added. The composition of the low melting point glass is not particularly limited so long as the glass has a softening point below the baking temperature.

Next, an embodiment 30 of the invention will be explained.

In the embodiment 30, the filling method of the conductive paste is improved, the conductor is filled into the through-holes by a vacuum filling method and the result is evaluated.

Figure 35:
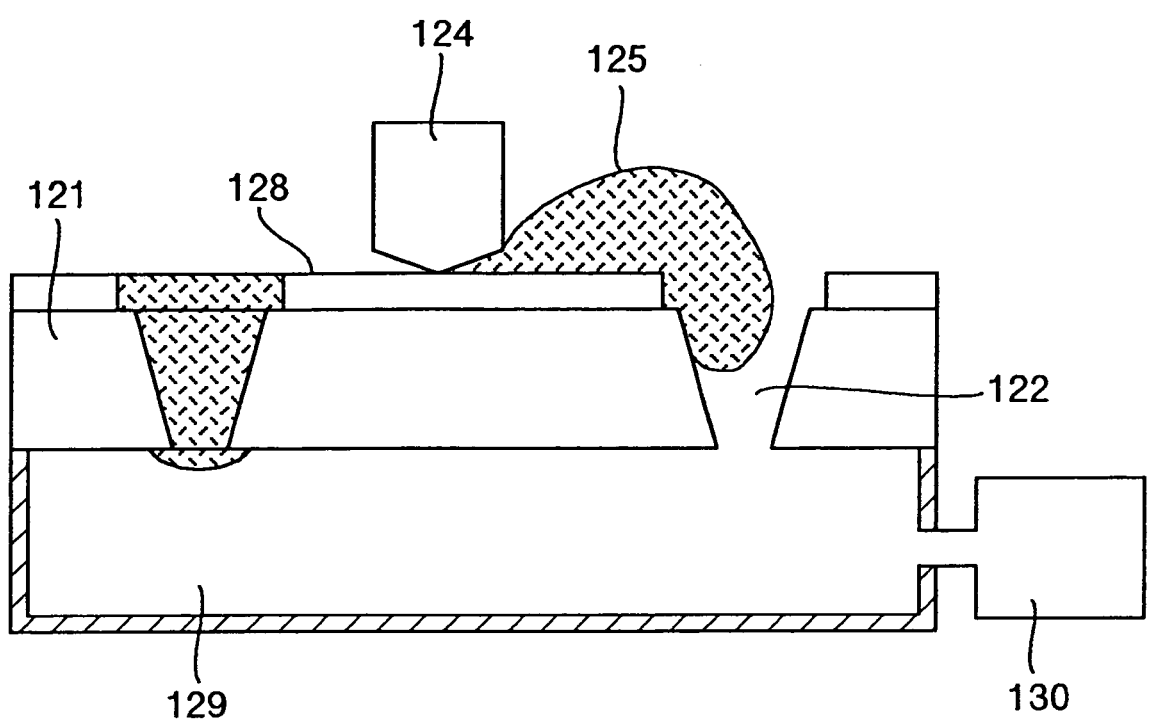
FIGS. 35 and 36 are sectional views each showing an example of a method of filling a conductive paste in an embodiment of the invention.

The wiring substrate 121 and the through-holes 122 having the same size and the same shape as those of the embodiment 29 are used. The conductive paste 125 has the same mixing ratio as that of the embodiment 29 shown in Table 13. FIG. 35 shows the filling method of the invention. The conductive paste 125 is pushed into the through-holes by use of a squeezer 124. A vacuum tank 129 is arranged on the back and is kept under a reduced pressure state by a vacuum pump 130.

Figure 30:
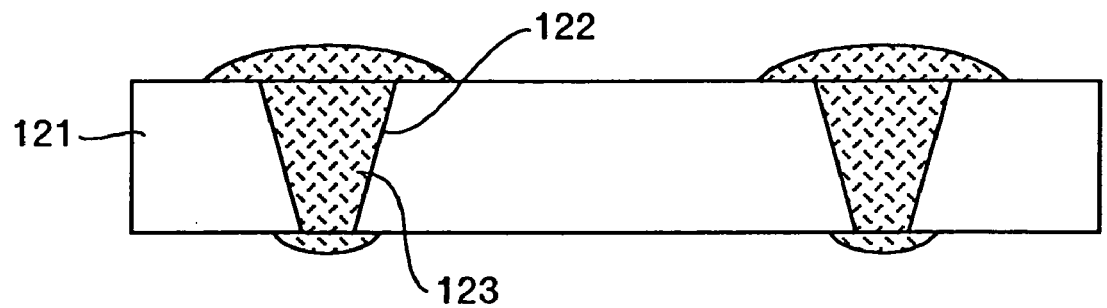
FIGS. 30 and 31 are sectional views each showing an example of a structure of a wiring substrate in an embodiment of the invention.

Consequently, the conductive paste 125 is sucked into the vacuum tank, protrudes from the substrate surface and expands from the open diameter of the through-holes. After the coating mask 128 using the resist film is peeled, the conductive paste is baked and provides via-electrodes having two projection portions shown in FIG. 30.

After the conductor is filled and baked similarly by the vacuum filling method of the invention, the projection portions are polished to give via-electrodes that have only one projection portion shown in FIG. 31 or via-electrodes that do not have the projection portion shown in FIG. 32.

The substrates filled with the conductor are subjected 1,000 cycles to the temperature cycle test of −65° C. to 145° C. in the same way as in the embodiment 29. Reliability is evaluated by the number of the occurrence of peel of the conductor from the holes. Table 15 shows the evaluation result.

TABLE 15

| | | vacuum filling method (the present invention) | | |
|---|---|---|---|---|
| No. | filling | shape of comparative example (not having projection) | shape 1 of the present invention (projection on one surface) | shape 2 of the present invention (projection on both surfaces) |
| Ag1 | ○ | 14% | 5% | 3% |
| Ag2 | ○ | 10% | 3% | 1% |
| Ag3 | ○ | 8% | 2% | <0.1% |
| Ag4 | ○ | 5% | 1% | <0.1% |
| Ag5 | ○ | 3% | <0.1% | <0.1% |
| Ag6 | X | — | — | — |

According to the filling method of the invention, it becomes possible to fill the paste Ag4 and Ag5 each having a viscosity of 600 Pa·s or more filling of which has been impossible by the method of the prior art. It is obvious from Table 15 that when compared in terms of the shape, the number of occurrence of peel is smaller in the via-electrodes having the projection on one of the surfaces than those not having the projection and is further smaller in the via-electrodes having the projections on both surfaces. This result also represents that connection reliability between the substrate and the conductor can be improved when the contact area between them is greater. The Ag6 paste cannot be filled even by using the vacuum filling method.

Next, an embodiment 31 of the invention will be explained.

In this embodiment 31, the filling method of the conductive paste is further improved. The conductor is filled into the through-hole by use of the vacuum filling method in combination with pressurization and the result is evaluated. The feature of this method will be explained.

Figure 36:
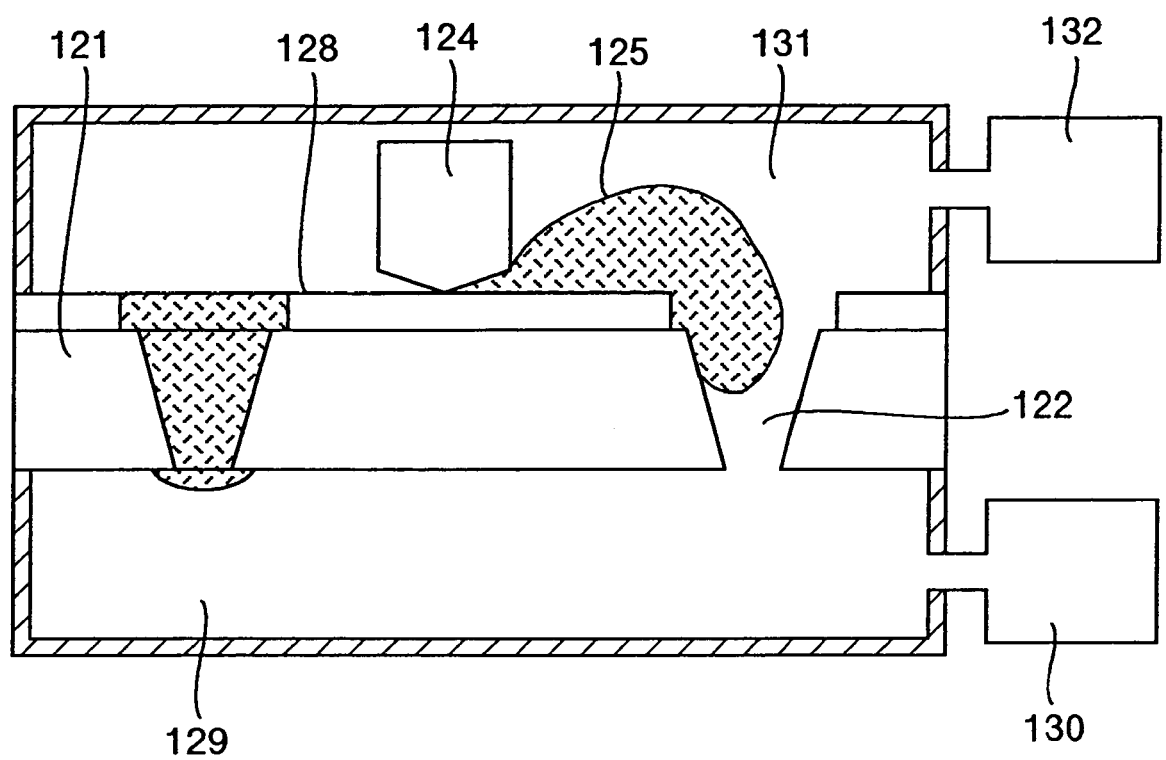

The wiring substrate 121 and the through-holes 122 having the same size and the same shape as those of the embodiment 29 are used. The conductive paste 125 has the same mixing ratio as that of the embodiment 29 shown in Table 13. FIG. 36 shows the filling method of the invention. A pressurization tank 131 is arranged and a compressor 132 pressurizes the paste coating surface to a pressure higher than the atmospheric pressure. On the other hand, a vacuum tank 129 is disposed on the back and is kept under a reduced pressure state by a vacuum pump 130.

Therefore, when the conductive paste 125 is pushed into the through-holes 122 by use of a squeezer 124, it is strongly sucked into the vacuum tank due to the pressure difference, protrudes from the substrate surface and expands from the diameter of the open portions of the through-holes. After the coating mask 128 using the resist film is peeled, the conductor is baked to provide via-electrodes having two projection portions shown in FIG. 30 in the same way as in the embodiment 30.

After the conductor is filled and baked similarly by the vacuum filling method of the invention, the projection portions are polished to give via-electrodes having one projection portion shown in FIG. 31 or via-electrodes not having the projection portion shown in FIG. 32.

The substrate filled with the conductor is subjected 1,000 cycles to the temperature cycle test of −65° C. to 145° C. in the same way as in the embodiment 29, and reliability is evaluated by the number of the occurrence of peel of the conductor from the holes. Table 16 shows the evaluation result.

TABLE 16

| | | pressurization + vacuum filling method (the present invention) | | |
|---|---|---|---|---|
| No. | filling | shape of comparative example (not having projection) | shape 1 of the present invention (projection on one surface) | shape 2 of the present invention (projection on both surfaces) |
| Ag1 | X | — | — | — |
| Ag2 | ○ | 10% | 3% | 1% |
| Ag3 | ○ | 8% | 2% | <0.1% |
| Ag4 | ○ | 5% | 1% | <0.1% |
| Ag5 | ○ | 3% | <0.1% | <0.1% |
| Ag6 | ○ | 2% | <0.1% | <0.1% |

According to the filling method of the invention, it becomes possible to fill the paste Ag6 having a viscosity of 800 Pa·s or more filling of which has not been possible by the method of the prior art and by the vacuum filling method alone. However, the Ag1 paste is sucked into the vacuum tank and cannot satisfactorily keep the filling state. The method comprising the combination of pressurization with vacuum filling is a suitable method for filling a high viscosity paste.

When compared in terms of the shape, the number of the occurrence of peel is smaller in the via-electrodes having the projection on one of the surfaces than those not having the projection and is further smaller in the via-electrodes having the projections on both surfaces, similarly to the embodiment 30. This result also represents that connection reliability between the substrate and the conductor can be improved when the contact area between them is greater.

Next, an embodiment 32 of the invention will be explained.

In this embodiment 32, pad electrodes and bumps according to the invention will be explained.

Figure 37:
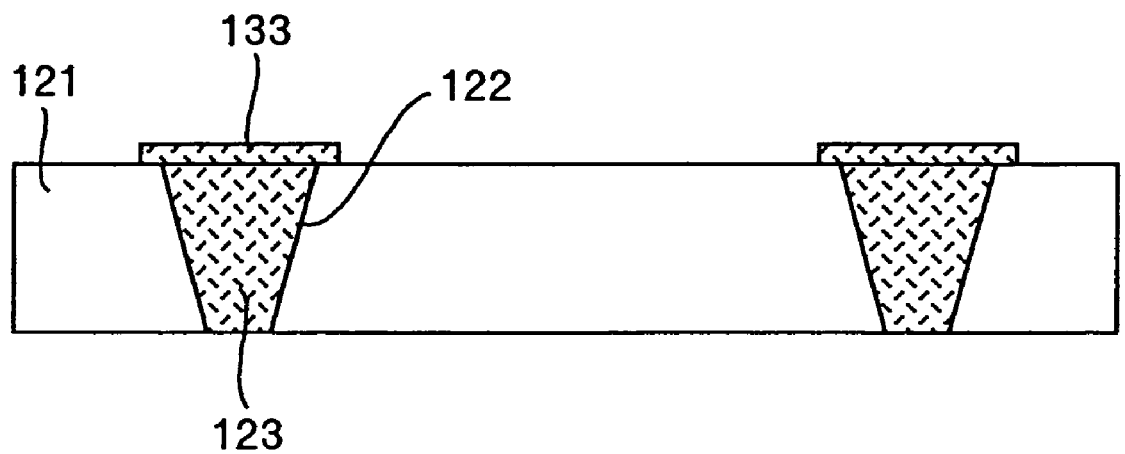
FIG. 37 is a sectional view showing an example of a via-integration type pad electrode in an embodiment of the invention.
Figure 38:
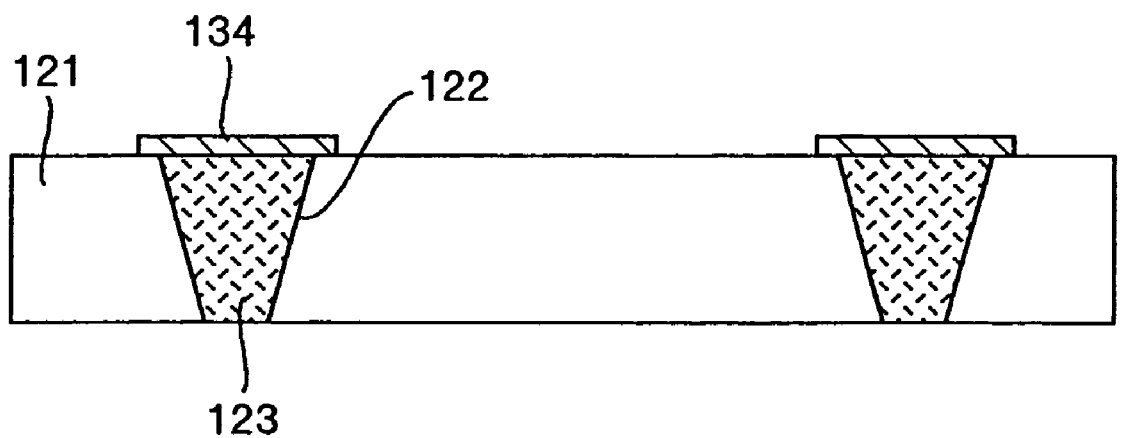
FIG. 38 is a sectional view showing a pad electrode of a prior art example.

FIG. 37 shows the pad electrodes according to the invention. Each via-integration type pad electrode 133 is obtained by forming the electrode having the shape shown in FIG. 31 by use of the same material and the same method as those of the embodiment 29 and by planarizing the surface for surface polishing. In contrast, the pad 134 separately formed from the via-portion shown in FIG. 38 is formed by use of the method shown in FIG. 39.

First, a sputter film 135 as a seed film of a metal conductor is formed by sputtering in FIG. 39(a). Because a sufficient thickness for the electrode cannot be obtained by sputtering alone, a seed film having a thickness of about 500 nm is first formed.

Next, a resist 136 is applied in FIG. 39(b) and exposure and development are then carried out. Portions other than pad electrodes are masked. In FIG. 39(c), the plated film 39 is attached thickly. Here, the plated film can be formed to a thickness of several microns (μm) to dozens of microns (μm). In FIG. 39(d), the resist 136 is removed and the seed film is etched, providing the pad electrodes having a desired shape.

Figure 39:
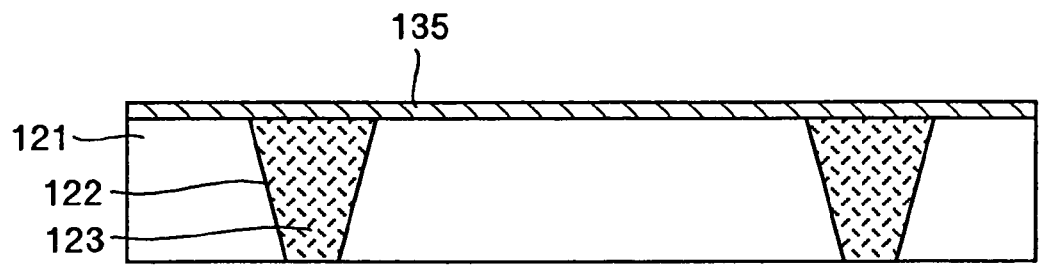
FIGS. 39(a), (b), (c) and (d) are sectional views each showing a method of forming a pad electrode of a prior art example.
Figure 39:
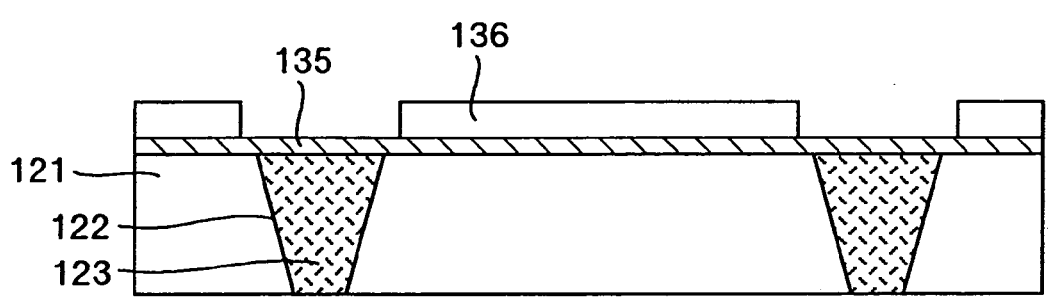
Figure 39:
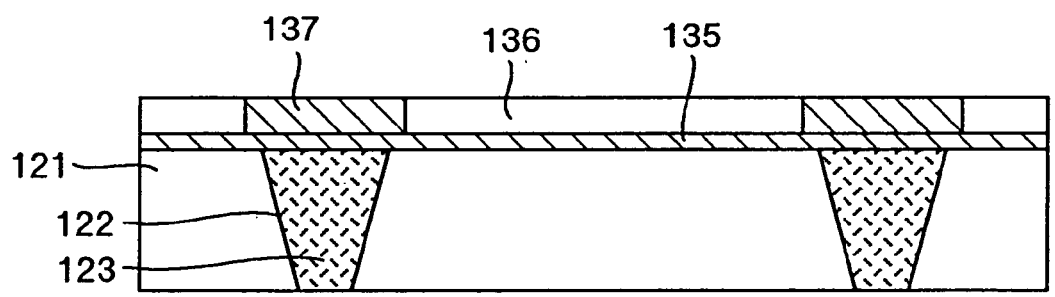
Figure 39:
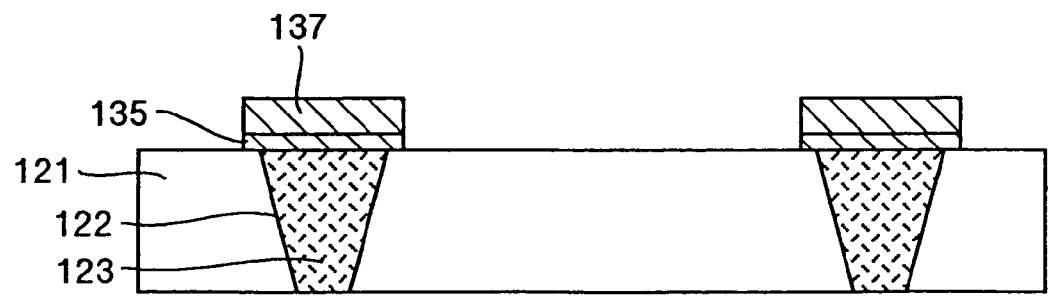

The method shown in FIG. 39 is just exemplary and a method that again conducts printing may be possible. In any case, the production steps get elongated when the pad electrodes are formed separately from the via-portions, and it is obvious that the pad electrodes of the invention are advantageous from the aspect of the cost. The pad electrodes formed through the sputtering and plating steps are compact and peel resulting from the difference of thermal expansion coefficients from the wiring substrate 121 does not easily occur. Therefore, the pad electrodes of the invention are superior also from the aspect of reliability.

Figure 40:
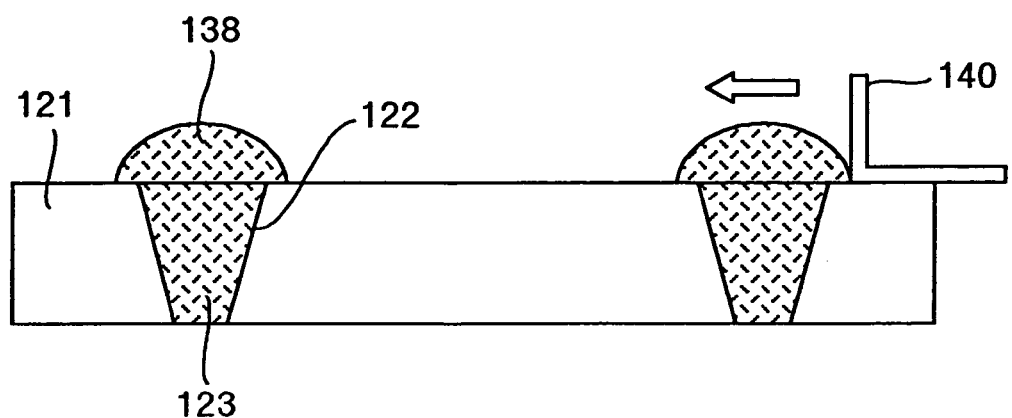
FIG. 40 is a sectional view showing an example of a via-integration type bump in an embodiment of the invention.

FIG. 40 shows electrodes formed by allowing a conductor to greatly protrude from one of the surfaces according to the vacuum filling method of the invention. The electrodes can be used as the via-integration type bumps 138 for the connection with other printed wiring substrates.

Figure 41:
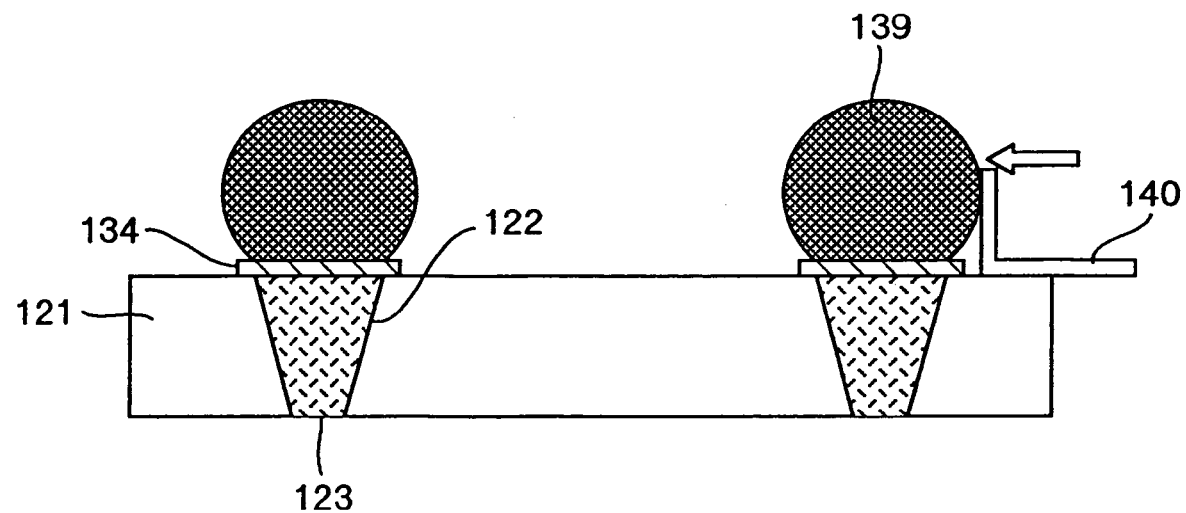
FIG. 41 is a sectional view showing a structure of a bump of a prior art example.

In contrast, FIG. 41 shows bumps 139 of the method of the prior art. The bumps 139 are formed by fusing a ball to the pad electrode shown in FIG. 38. In both FIGS. 40 and 41, the connection portion of each of the bumps is formed to a diameter of 0.5 mm and shearing force is applied by using a strength evaluation jig 140 to evaluate the strength at which the bumps peel. As a result, it has been found that whereas the example of the invention has strength of 110 MPa, the comparative example of FIG. 41 has strength of only 80 MPa. This represents that the unitary body of the via-portion and the bump is stronger and that greater moment acts due to the connection portion at the same force when the bump height is greater.

As is obvious from above, the bump shape of the invention has high strength reliability. When the filling method of the invention is used, it becomes possible to collectively form the via-conductors and the via-electrodes or the bumps and to reduce the production time and the production cost. Moreover, because the via-conductors and the via-electrodes or the bumps are integrated with one another, peel of the via-electrodes and the bumps can be eliminated.

Next, an embodiment 33 of the invention will be explained.

In the embodiment 33, a semiconductor module connected through a wiring substrate using via-electrodes having the via-shape of the invention will be explained.

Figure 42:
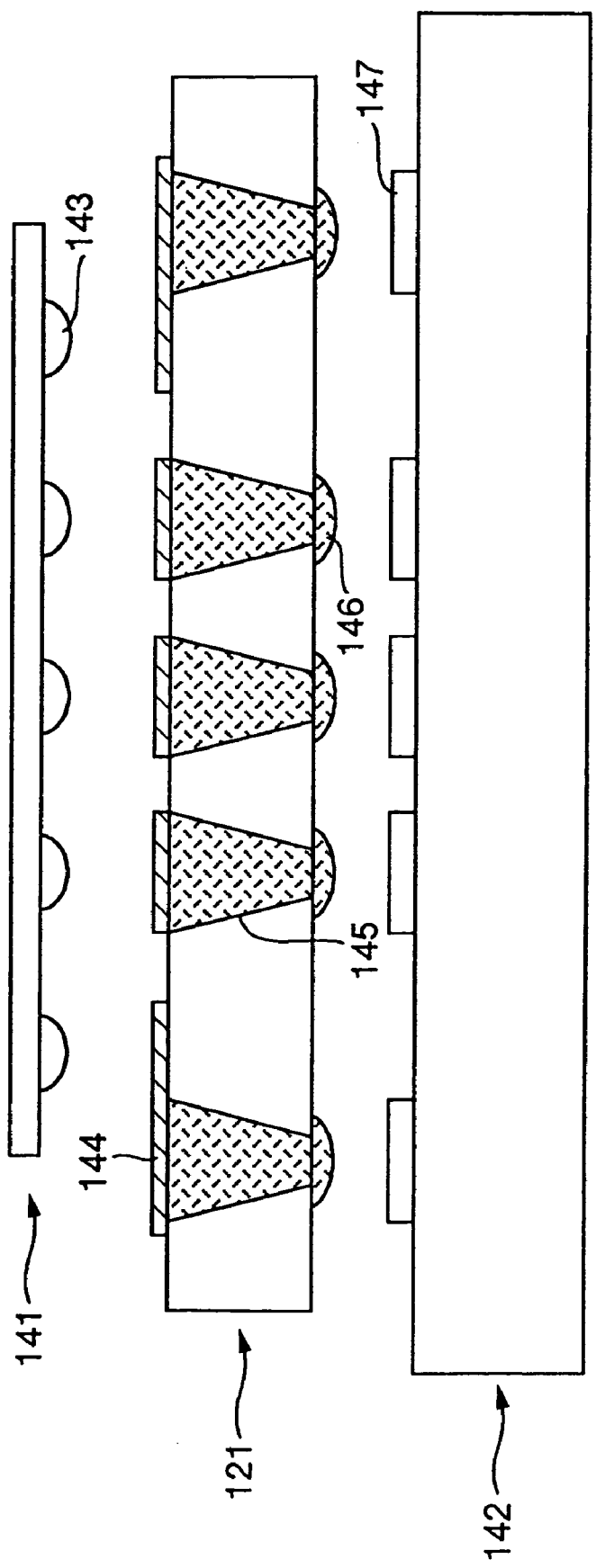
FIG. 42 is a structural view showing an example of a structure of a semiconductor module in an embodiment of the invention.

FIG. 42 shows the semiconductor module of the invention. Alkali-free glass having a plurality of through-holes formed therein is used as the wiring substrate 121. The Ag2 paste shown in Table 13 is filled and is allowed to protrude from one of the surfaces of the substrate by the vacuum filling method described in the embodiment 30. The conductive paste arranged inside the through-holes is baked at 500° C. to form the via-integration type bumps 146 while the projection portion keeps as such its shape.

A Cu wiring is formed on the other surface of the via-portions by the patterning method of the conductor explained in the embodiment 32 with reference to FIG. 39. A bare chip 141 and the wiring substrate 121 are connected by connecting the bumps 143 through the wirings 144 and the wiring substrate 121 and the printed wiring substrate 142 are connected by connecting the electrodes 147 and the via-integration type bumps 146.

Because the semiconductor module of the invention uses the via-integration type bumps, peel of the bumps does not occur at the time of connection of the wiring substrate 121 and the printed wiring substrate 142 and a semiconductor module having extremely high connection reliability can be achieved. Because the bump formation step can be simplified, the production time can be shortened and the wiring substrate 121 and the semiconductor module can be formed at a lower cost.

The invention completed by the present inventor has been explained concretely with reference to the embodiments thereof. Needless to say, however, the invention is in no way limited to these embodiments but can be changed or modified in various ways without departing from the scope thereof.

For example, in the electronic circuit component as the semiconductor module explained in the embodiments 26 to 28, the integrated passive elements are mounted to the substrate with built-in integrated passive elements either directly or through the active component. However, when the substrate with built-in integrated passive elements is used, the electronic circuit component may be of the type in which the integrated passive elements are not mounted to this substrate.

INDUSTRIAL APPLICABILITY

As described above, the wiring glass substrate, its production method, the conductive paste and the semiconductor module used for the wiring glass substrate according to the invention are suitable for a technology for mounting a plurality of bare chips in a high density.

The invention claimed is:

1. A wiring glass substrate for connecting a semiconductor chip to a printed wiring substrate, comprising:
   a substrate formed of first glass and having a plurality of holes formed at predetermined positions;
   an electrically conductive material embedded in said holes;
   bumps so formed as to be connected to the electrically conductive material filling each of said holes; and
   wirings formed on a surface opposite to a surface on which said bumps are formed, for electrically connecting a plurality of connection terminals arranged with intervals different from intervals of said holes to said electrically conductive material;
   wherein a shape of said electrically conductive martial is porous; and
   wherein second glass is provided in a pore of said electrically conductive material or on a surface of said electrically conductive material, the second glass has a lower softening point than that of the substrate formed of the first glass, and the second glass is crystallized glass.

2. A semiconductor module comprising the wiring glass substrate according to claim 1, wherein the wiring glass substrate on which the semiconductor chip is mounted is connected to the printed wiring board.

* * * * *